US006760339B1

(12) United States Patent
Noel et al.

(10) Patent No.: US 6,760,339 B1
(45) Date of Patent: Jul. 6, 2004

(54) MULTI-LAYER NETWORK DEVICE IN ONE TELECOMMUNICATIONS RACK

(75) Inventors: Chris R. Noel, Acton, MA (US);
Terrence S. Pearson, Hollis, NH (US);
Joe Whitehouse, Charlestown, MA (US); Corey Simons, Waltham, MA (US); Brian Branscomb, Hopkinton, MA (US)

(73) Assignee: Equipe Communications Corporation, Acton, MA (US)

( * ) Notice: Subject to any disclaimer, the term of this patent is extended or adjusted under 35 U.S.C. 154(b) by 850 days.

(21) Appl. No.: 09/596,055

(22) Filed: Jun. 16, 2000

Related U.S. Application Data

(63) Continuation-in-part of application No. 09/593,034, filed on Jun. 13, 2000, which is a continuation-in-part of application No. 09/591,193, filed on Jun. 9, 2000, which is a continuation-in-part of application No. 09/588,398, filed on Jun. 6, 2000, which is a continuation-in-part of application No. 09/574,440, filed on May 20, 2000, which is a continuation-in-part of application No. 09/574,343, filed on May 20, 2000, and a continuation-in-part of application No. 09/574,341, filed on May 20, 2000.

(51) Int. Cl.⁷ .............................. H04L 12/28; H04J 3/16
(52) U.S. Cl. ........................ 370/401; 370/469; 361/788; 709/249; 710/132
(58) Field of Search ................................. 370/230, 401, 370/469, 428, 352, 389, 466; 361/788, 796; 710/132, 100, 8, 317; 340/2–28; 709/249, 250, 230

(56) References Cited

U.S. PATENT DOCUMENTS

| 4,750,136 A | 6/1988 | Arpin et al. ................. 364/514 |
| 4,942,540 A | 7/1990 | Black et al. ................. 364/514 |
| 5,515,403 A | 5/1996 | Sloan et al. ................. 375/371 |

(List continued on next page.)

FOREIGN PATENT DOCUMENTS

| WO | 9826611 | 6/1998 |
| WO | 9905826 | 2/1999 |
| WO | 9911095 | 3/1999 |

(List continued on next page.)

OTHER PUBLICATIONS

"The Abatis Network Services Contractor," Abatis Systems Corporation product literature, 1999.
AtiMe–3E Data Sheet, 1–17 (Mar. 8, 2000).
Black, D., "Building Switched Networks," pp. 85–267.
Black, D., "Managing Switched Local Area Networks A Practical Guide" pp. 324–329.

(List continued on next page.)

*Primary Examiner*—Duc Ho
(74) *Attorney, Agent, or Firm*—Thomas J. Engellenner; Reza Mollaaghababa; Nutter McClennen & Fish, LLP

(57) ABSTRACT

The present invention provides a high switching capacity network device in one telco rack including both physical layer switch/router subsystems and an upper layer switch/router subsystem. Instead of providing a single physical layer switch/router subsystem, multiple physical layer switch/router subsystems are provided. Segmenting the physical layer switch/router into multiple, for example, four, subsystems better utilizes routing resources by allowing etches for the physical layer subsystems to be moved away from the center of the mid-plane/back-plane of the network device. Moving the physical layer subsystem etches away from the center of the mid-plane enables the network device to include an upper layer/switch router subsystem with etches toward the center of the mid-plane. Providing a multi-layer network device in one telco rack allows for intelligent layer 1 switching (for example, dynamic network connection set up), allows for one network management system to run both layer 1 and upper layer networks and eliminates grooming fees. Compared with separate layer 1 and upper layer network devices or a multi-layer network device occupying multiple telco racks, a single network device saves valuable telco site space and reduces expenses by sharing overhead such as the chassis, power and cooling.

19 Claims, 51 Drawing Sheets

U.S. PATENT DOCUMENTS

| | | | | |
|---|---|---|---|---|
| 5,638,410 | A | | 6/1997 | Kuddes ...................... 375/357 |
| 5,726,607 | A | | 3/1998 | Brede et al. .................... 331/2 |
| 5,850,399 | A | | 12/1998 | Ganmukhi et al. ......... 370/412 |
| 5,901,136 | A | * | 5/1999 | Lovelace et al. ........... 370/217 |
| 5,903,564 | A | | 5/1999 | Ganmukhi et al. ......... 370/399 |
| 5,905,730 | A | | 5/1999 | Yang et al. .................. 370/429 |
| 5,926,463 | A | | 7/1999 | Ahearn et al. ............... 370/254 |
| 5,953,314 | A | | 9/1999 | Ganmukhi et al. ......... 370/220 |
| 5,991,163 | A | | 11/1999 | Marconi et al. ............. 361/788 |
| 5,991,297 | A | | 11/1999 | Palnati et al. ................ 370/389 |
| 5,995,511 | A | | 11/1999 | Zhou et al. .................. 370/412 |
| 6,008,805 | A | | 12/1999 | Land et al. .................. 345/335 |
| 6,008,995 | A | | 12/1999 | Pusateri et al. ............. 361/796 |
| 6,014,715 | A | | 1/2000 | Stoevhase |
| 6,015,300 | A | | 1/2000 | Schmidt, Jr. et al. ......... 439/61 |
| 6,021,116 | A | | 2/2000 | Chiussi et al. ............... 370/236 |
| 6,021,263 | A | | 2/2000 | Kujoory et al. ........ 395/200.62 |
| 6,033,259 | A | | 3/2000 | Daoud ......................... 439/573 |
| 6,041,307 | A | | 3/2000 | Ahuja et al. .................... 705/8 |
| 6,044,540 | A | | 4/2000 | Fontana ........................ 29/505 |
| 6,078,595 | A | | 6/2000 | Jones et al. .................. 370/503 |
| 6,587,470 | B1 | * | 7/2003 | Elliot et al. .................. 370/404 |

FOREIGN PATENT DOCUMENTS

| | | |
|---|---|---|
| WO | 9914876 | 3/1999 |
| WO | 9927688 | 6/1999 |
| WO | 9930530 | 6/1999 |
| WO | 9935577 | 7/1999 |

OTHER PUBLICATIONS

"Configuration," Cisco Systems Inc. webpage, pp. 1–32 (Sep. 20, 1999).

Leroux, P., "The New Business Imperative: Achieving Shorter Development Cycles while Improving Product Quality," QNX Software Systems Ltd. webpage, (1999).

NavisXtend Accounting Server, Ascend Communications, Inc. product information (1997).

NavisXtend Fault Server, Ascend Communications, Inc. product information (1997).

NavisXtend Provisioning Server, Ascend Communications, Inc. product information (1997).

Network Health LAN/WAN Report Guide, pp. 1–23.

"Optimizing Routing Software for Reliable Internet Growth," JUNOS product literature (1998).

PMC–Sierra, Inc. website (Mar. 24, 2000).

Raddalgoda, M., "Failure–proof Telecommunications Products: Changing Expectations About Networking Reliability with Microkernel RTOS Technology," QNX Software Systems Ltd. webpage, (1999).

"Real–time Embedded Database Fault Tolerance on Two Single–board Computers," Polyhedra, Inc. product literature.

"Start Here: Basics and Installation of Microsoft Windows NT Workstation," product literature (1998).

Syndesis Limited product literature, 1999.

"Using Polyhedra for a Wireless Roaming Call Management System," Polyhedra, Inc., (prior to May 20, 2000).

Veritas Software Corporation webpage, 2000.

* cited by examiner

CARD TABLE 47

| | PID | CWD TYPE | VERSION NO. | SLOT NO. | ... |
|---|---|---|---|---|---|
| 16a | 500 | 0XF002 | 3 | 1 | |
| 16b | 501 | 0XF002 | 4 | 2 | |
| | ⋮ | ⋮ | ⋮ | ⋮ | ⋮ |
| 16e | 505 | 0X6002 | 1 | 5 | |
| | ⋮ | ⋮ | ⋮ | ⋮ | ⋮ |
| 16n | 513 | 0XF002 | 1 | 12 | |
| | ⋮ | ⋮ | ⋮ | ⋮ | ⋮ |

FIG. 6

PORT TABLE 49

| PID | PORT TYPE | VERSION NO. | SLOT NO. | ... |
|---|---|---|---|---|
| 1500 | 00620 | 1 | 1 | |
| 1501 | 00620 | 1 | 1 | |
| 1502 | 00620 | 1 | 1 | |
| 1503 | 00620 | 1 | 1 | |
| 1504 | 00820 | | | |
| ⋮ | ⋮ | ⋮ | ⋮ | ⋮ |
| 1600 | OO620 | 1 | 8 | |
| ⋮ | ⋮ | ⋮ | ⋮ | ⋮ |

FIG. 7

SERVICE ENDPOINT TABLE 76

| | SERVICE ENDPOINT # | PORT PID |
|---|---|---|
| 78 | 1 | 1500 |
| 80 | 2 | 1501 |
| 82 | 3 | 1501 |
| 84 | 4 | 1501 |
| 86 | 5 | 1502 |
| 88 | 6 | 1502 |
| 90 | 7 | 1503 |
| 92 | 8 | 1503 |
| 94 | 9 | 1503 |
| 168 | 10 | 1502 |
| | ⋮ | ⋮ |

FIG. 10

LOGICAL TO PHYSICAL CARD TABLE 100

| | LID (98) | PRIMARY PID (102) | BACK-UP PID (104) |
|---|---|---|---|
| 106 | 30 | 500 | 513 |
| 109 | 31 | 501 | 513 |
| | ⋮ | ⋮ | ⋮ |

FIG. 11A

LOGICAL TO PHYSICAL PORT TABLE 101

| | LID (98) | PRIMARY PID (102) | BACK-UP PID (104) |
|---|---|---|---|
| 107 | 40 | 1500 | 1600 |
| | ⋮ | ⋮ | ⋮ |

FIG. 11B

ATM GROUP TABLE 108

| GROUP # | CARD LID | ... |
|---|---|---|
| 1 | 30 | |
| 2 | 30 | |
| 3 | 30 | |
| 4 | 30 | |

FIG. 12

ATM INTERFACE TABLE 114

| ATM IF | ATM GROUP | SE | ... |
|---|---|---|---|
| 1 | 1 | 1 | |
| 2 | 1 | 1 | |
| 3 | 1 | 1 | |
| 4 | 2 | 2 | |
| 5 | 2 | 3 | |
| 6 | 2 | 4 | |
| ⋮ | ⋮ | ⋮ | ⋮ |
| 12 | 3 | 10 | |
| ⋮ | ⋮ | ⋮ | ⋮ |

SOFTWARE LOAD RECORD 128a

| CONTROL SHIM | LID |
|---|---|
| atm-cntl.exe | 30 |

GROUP TABLE 108'

| GROUP # | PRIMARY CARD LID (447) | BACKUP CARD LID (449) | ... |
|---|---|---|---|
| 1 | 30 | 31 | |
| 2 | 30 | 31 | |
| 3 | 30 | 31 | |
| 4 | 30 | 31 | |
| 5 | 31 | 32 | |
| 6 | 31 | 32 | |
| 7 | 31 | 32 | |
| 8 | 31 | 32 | |
| 9 | 32 | 30 | |
| 10 | 32 | 30 | |
| 11 | 32 | 30 | |
| 12 | 32 | 30 | |
| ⋮ | ⋮ | ⋮ | ⋮ |

FIG. 30

PATH TABLE 600

| | PATH LID | UP PORT LID | TIME SLOT | # OF TIME SLOTS | ... |
|---|---|---|---|---|---|
| 602 | 1666 | 1231 | 4 | 3 | |
| | ⋮ | ⋮ | ⋮ | ⋮ | ⋮ |

FIG. 38

SERVICE END POINT TABLE 76'

| SE # | Q # | FC LID (606) | FC SLICE (608) | FC TIME SLOT (610) | PATH PID | ... |
|---|---|---|---|---|---|---|
| 878 | 1 | | | | 1666 | |
| ⋮ | ⋮ | ⋮ | ⋮ | ⋮ | ⋮ | ⋮ |

FIG. 39

MULTI-LAYER NETWORK DEVICE IN ONE TELECOMMUNICATIONS RACK

This application is a continuation-in-part of application Ser. No. 09/593,034 filed Jun. 13, 2000 which is a C-I-P of Ser. No. 09/574,440 filed May 20, 2000 and Ser. No. 09/591,193 filed Jun. 9, 2000 which is a C-I-P of Ser. No. 09/588,398 filed Jun. 6, 2000 which is a C-I-P of Ser. No. 09/574,341 filed May 20, 2000; and Ser. No. 09/574,343 filed May 20, 2000.

BACKGROUND

Within typical telecommunications ("telco") networks, network packets are transferred between network devices over a physical attachment or connection in accordance with a particular physical layer (i.e., layer 1) protocol, for example, Ethernet or Synchronous Optical NETwork (SONET). The physical layer may include optical fibers, coaxial cable and twisted wire. The physical layer is expensive because of the installation and material costs required to span the long distances that must be covered as well as the costs associated with the physical/port interfaces required to connect to the cable, wire or fiber.

The network packets transferred across the physical layer include both data and control information, and the data within each network packet may be further organized in accordance with an upper layer network protocol including, for example, Asynchronous Transfer Mode (ATM), Internet Protocol (IP), Multi-Protocol Label Switching (MPLS), Frame Relay, Voice, Circuit Emulation or Optical User Network Interfaces (UNI), including Optical Internetworking Forum (OIF) and Optical Domain Service Interconnect (ODSI). Although each physical attachment may be used to transfer network packets having data organized in accordance with multiple upper layer protocols, layer 1 network devices are typically not aware of which upper layer protocols are being carried. Instead, connections are set up manually through layer 1 network devices, such as electronic Digital Access and Cross-connect Systems (DACS) or optical cross-connect systems, and the connections cause the cross-connect systems to separate the network packets in accordance with each upper layer protocol—often referred to as "grooming"—and send them to appropriate upper layer network devices over external network attachments.

Once separated, the network packets (or just the data from within the network packets) are transferred to separate physical interfaces—corresponding to the different upper layer protocols—on one or more separate upper layer network devices. For example, network packets may be sent in accordance with the SONET protocol but include data organized in accordance with ATM (i.e., ATM over SONET) and MPLS (i.e., MPLS over SONET). Through established connections the cross-connect system transfers network packets including data organized in accordance with ATM to one or more physical interfaces supporting ATM and network packets including data organized in accordance with MPLS to one or more other physical interfaces supporting MPLS. The physical interfaces may be on one or more network devices, such as switches, routers and hybrid switch-routers, where hardware subsystems within the network device(s) and connected to each physical interface are capable of operating on network packet data in accordance with a particular upper layer protocol. The transport or layer 1 connections between the cross-connect system and the upper layer devices generally take considerable time to set up and are not easily or dynamically changed.

The cross-connect system and the upper layer devices are often owned by different parties, in which case, the owner of the cross-connect system generally charges a "grooming" fee to the owner(s) of the upper layer devices to which it is connected. In addition, due to the different functionality of a physical layer network device, such as a cross-connect system, and an upper layer network device, such as an ATM switch, and the complexity of each different device, different engineering skill sets are required to develop each type of device and generally different vendors develop the different network devices.

Within a typical telecommunications network, network devices for connecting different portions of the network are located at various telecommunications sites—often referred to as central offices. There may be hundreds of devices per site and, thus, space is a valuable resource. Consequently, network devices must conform to the size of a standard telecommunications rack ("telco rack")—that is, the device must fit within a rack no taller than seven feet, no wider than nineteen inches and no deeper (often referred to as the "line up") than twenty-four inches. These dimensions may vary slightly.

Under deregulation, telco site owners must lease space to certain other carriers. These leases are expensive and increase with the amount of space leased. In addition, there are limits to the amount of space that must be leased to each carrier.

In general, the components of the network device are located on multiple functional printed circuit boards, which must be coupled together in order for them to communicate and pass network packets. A back-plane or mid-plane provides such a coupling and is basically a printed circuit board having connectors into which each of the functional printed circuit boards may be plugged and electrical connections or etches between the different connectors through which the functional printed circuit boards may communicate and pass network packets. A back-plane is located toward the back of a network device or other computer and includes connectors for connecting to functional printed circuit boards on only one side—generally, the side facing the front of the device. A mid-plane is located toward the middle of a network device or other computer and includes connectors for connecting to functional printed circuit boards on both sides. Hereinafter, back-plane and mid-plane will be referred to as mid-plane for convenience.

The size of and number of routing layers within the printed circuit board of the mid-plane also sets limitations on network devices. The size of the back-plane or mid-plane determines the maximum number of connectors that may be located on the printed circuit board and the number of routing layers determines the maximum number of signals that may be routed between the connectors. Currently, the largest common size that a raw printed circuit board or panel comes in is three feet in length and, typically, only about thirty-four inches is usable. Larger sizes may be obtained but are exorbitantly expensive. Hence, the largest mid-plane that is likely to be used within a network device is about thirty-four by twenty-four inches. In addition, forty-eight routing layers is considered a very large number of routing layers and is likely to be the largest used within a network device. More routing layers, such as 52, are available but again, the price becomes exorbitant.

The thirty-four inch length of the mid-plane printed circuit board prevents a single network device from fully utilizing the entire seven feet available in a telco rack. In addition, the size and number of routing layers of the mid-plane printed circuit board also limits the number of ports that may be serviced by a single network device. As a result, typically two or more network devices are stacked within a teleco rack.

The need for network bandwidth has risen exponentially in recent years, and many new network devices have been developed in response to this need. Decreasing component sizes have allowed for increased port density (i.e., more ports per network device), and faster processors and other components have allowed for increased switching capacity (i.e., number of bits transferred per second). In 1995, the maximum switching capacity available in a single network device was five gigabits per second (Gbps). Switching capacity has doubled approximately every two years such that currently, the maximum switching capacity available in a single network device is 80 Gbps with 160 Gbps expected later this year and 320 Gbps expected by 2001. Despite decreasing component sizes, the physical constraints of both the telco rack and printed circuit boards limit the port density and switching capacity that may be provided by a single network device.

In an effort to provide network devices supporting increased bandwidth, several network device developers have developed network devices having portions or sub-sections located in two or more telco racks. These portions or sub-sections are interconnected through typical network attachments. The additional cabling adds to the overall cost of the network device, takes up additional telco site space and may provide a bottleneck for increasing switching capacity.

SUMMARY

The present invention provides a high switching capacity network device in one telco rack including both physical layer switch/router subsystems and an upper layer switch/router subsystem. Instead of providing a single physical layer switch/router subsystem, multiple physical layer switch/router subsystems are provided. Segmenting the physical layer switch/router into multiple, for example, four, subsystems better utilizes routing resources by allowing etches for the physical layer subsystems to be moved away from the center of the mid-plane/back-plane of the network device. Moving the physical layer subsystem etches away from the center of the mid-plane enables the network device to include an upper layer/switch router subsystem with etches toward the center of the mid-plane. Providing a multi-layer network device in one telco rack allows for intelligent layer 1 switching (for example, dynamic network connection set up), allows for one network management system to run both layer 1 and upper layer networks and eliminates grooming fees. Compared with separate layer 1 and upper layer network devices or a multi-layer network device occupying multiple telco racks, a single network device saves valuable telco site space and reduces expenses by sharing overhead such as the chassis, power and cooling.

The present invention provides a network device including a physical layer cross-connection subsystem and an upper layer switch fabric subsystem coupled with the cross-connection subsystem, where the network device is capable of fitting within one telecommunication rack. The network device may further include a port subsystem connected to the physical layer cross-connection subsystem and capable of being connected to an external network attachment and capable of transferring network packets, including data and control information, with other network devices over the external network attachment in accordance with a physical layer network protocol, and where data in the network packets is organized in accordance with one or more upper level network protocols. The network device may also include a forwarding subsystem connected to the physical layer cross-connection subsystem and the upper layer switch fabric subsystem and capable of operating on network packet data in accordance with one of the upper level network protocols, where the physical layer cross-connection subsystem is capable of transferring network packets between the port subsystem and the forwarding subsystem. In addition, the forwarding subsystem may be a first forwarding subsystem and the network device may further include a second forwarding subsystem connected to the physical layer cross-connection subsystem and the upper layer switch fabric subsystem and capable of operating on network packet data in accordance with the one of the upper level network protocols, where the upper layer switch fabric subsystem is capable of transferring network packet data between the first and second forwarding subsystems. The physical layer cross-connection subsystem may be a first physical layer cross-connection subsystem and the network device may further include a second, third and/or fourth physical layer cross-connection subsystem coupled with the upper layer switch fabric subsystem. The first and second physical layer cross-connection subsystems may be connected together and capable of transferring data, the third and fourth physical layer cross-connection subsystems may also be connected together and capable of transferring data, and the first, second, third and fourth physical layer cross-connection subsystems may be connected together and capable of transferring data. The plurality of mid-planes may be back-planes.

In another aspect, the present invention includes a network device including multiple port subsystems, where each port subsystem is capable of being connected to an external network attachment and capable of transferring network packets, including data and control information, with other network devices over the external network attachment in accordance with a physical layer network protocol, and where data in the network packets is organized in accordance with one or more upper level network protocols, multiple forwarding subsystems, where each forwarding subsystem is capable of operating on network packet data in accordance with one of the upper level network protocols, a cross-connection subsystem coupled with the port subsystems and the forwarding subsystems and capable of transferring network packets between the port subsystems and the forwarding subsystems, and a switch fabric subsystem coupled to the forwarding subsystems and capable of transferring network packet data between the forwarding subsystems, where the network device is capable of fitting within one telecommunications rack. The port subsystems may be a first set of port subsystems, the physical layer network protocol may be a first physical layer network protocol, the forwarding subsystem may be a first set of forwarding subsystems and the physical layer cross-connection subsystem may be a first physical layer cross-connection subsystem and the network device may further include a second set of port subsystems, a second set of forwarding subsystems, and a second cross-connection subsystem coupled with the second set of port subsystems and the second set of forwarding subsystems and capable of transferring network packets between the second set of port subsystems and the second set of forwarding subsystems, where the switch fabric subsystem is also coupled to the second set of forwarding subsystems and capable of transferring network packet data between the first and second sets of forwarding subsystems. The network device may also include a third set of port subsystems, a third set of forwarding subsystems, and a third cross-connection subsystem coupled with the third set of port subsystems and the third set of forwarding subsystems and capable of transferring network packets between the third set of port subsystems and the third set of forwarding subsystems, where the switch fabric subsystem is also coupled to the third set of forwarding subsystems and capable of transferring network packet data between the first, second and third set of forwarding subsystems. In addition, the network device may further include a fourth set of port subsystems, a fourth set of forwarding subsystems, and a fourth cross-connection subsystem coupled with the fourth set of port subsystems and the fourth set of forwarding subsystems and capable of transferring network packets between the fourth set of port subsystems and the fourth set of forwarding subsystems, where the switch fabric subsystem is coupled to the fourth set of forwarding subsystems and capable of transferring network packet data between the first, second, third and fourth sets of forwarding subsystems.

The first and second cross-connection subsystems may be connected together and capable of transferring data, the third and fourth cross-connection subsystems may be connected together and capable of transferring data, and the first, second, third and fourth cross-connection subsystems may be connected together and capable of transferring data. The first, second, third and fourth physical layer network protocols may be the same protocol or different protocols. Each of the sets of port subsystems may transfer network packets in accordance with the same or different physical layer network protocols.

In yet another aspect, the network device includes multiple physical layer cross-connection subsystems and an upper layer switch fabric subsystem coupled with the cross-connection subsystems, where the network device is capable of fitting within one telecommunication rack. The cross-connection subsystems may include two, three, four or more cross-connection subsystems.

BRIEF DESCRIPTION OF THE DRAWINGS

FIGS. 6, 7, 10, 11a, 11b, 12, 13 and 14 are tables representing data in a configuration database;

FIG. 30 is a table representing data in a configuration database;

FIGS. 38 and 39 are tables representing data in a configuration database;

Detailed Description

Figure 1:
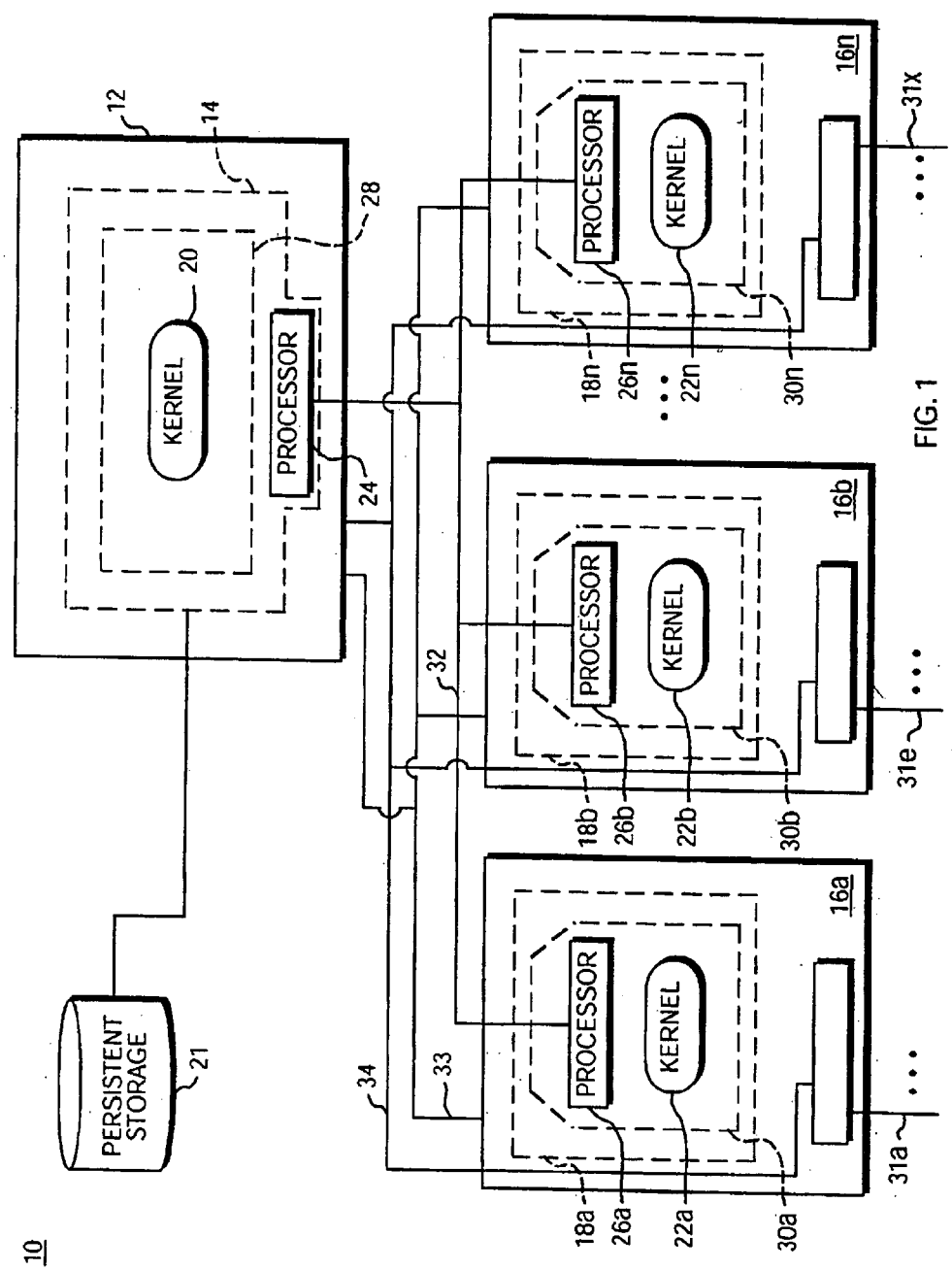
FIG. 1 is a block diagram of a computer system with a distributed processing system.

A modular software architecture solves some of the more common scenarios seen in existing architectures when software is upgraded or new features are deployed. Software modularity involves functionally dividing a software system into individual modules or processes, which are then designed and implemented independently. Inter-process communication (IPC) between the modules is carried out through message passing in accordance with well-defined application programming interfaces (APIs). A protected memory feature also helps enforce the separation of modules. Modules are compiled and linked as separate programs, and each program runs in its own protected memory space. In addition, each program is addressed with an abstract communication handle, or logical name. The logical name is a location-independent; it can live on any card in the system. The logical name is resolved to a physical card/process during communication. If, for example, a backup process takes over for a failed primary process, it assumes ownership of the logical name and registers its name to allow other processes to re-resolve the logical name to the new physical card/process. Once complete, the processes continue to communicate with the same logical name, unaware of the fact that a switchover just occurred.

Like certain existing architectures, the modular software architecture dynamically loads applications as needed. Beyond prior architectures, however, the modular software architecture removes significant application dependent data from the kernel and minimizes the link between software and hardware. Instead, under the modular software architecture, the applications themselves gather necessary information (i.e., metadata) from a variety of sources, for example, text files, JAVA class files and database views. Metadata facilitates customization of the execution behavior of software processes without modifying the operating system software image. A modular software architecture makes writing applications—especially distributed applications—more difficult, but metadata provides seamless extensibility allowing new software processes to be added and existing software processes to be upgraded or downgraded while the operating system is running. In one embodiment, the kernel includes operating system software, standard system services software and modular system services software. Even portions of the kernel may be hot upgraded under certain circumstances. Examples of metadata include, customization text files used by software device drivers; JAVA class files that are dynamically instantiated using reflection; registration and deregistration protocols that enable the addition and deletion of software services without system disruption; and database view definitions that provide many varied views of the logical system model. Each of these and other examples are described below.

The embodiment described below includes a network computer system with a loosely coupled distributed processing system. It should be understood, however, that the computer system could also be a central processing system or a combination of distributed and central processing and either loosely or tightly coupled. In addition, the computer system described below is a network switch for use in, for example, the Internet, wide area networks (WAN) or local area networks (LAN). It should be understood, however, that the modular software architecture can be implemented on any network device (including routers) or other types of computer systems and is not restricted to a network device.

A distributed processing system is a collection of independent computers that appear to the user of the system as a single computer. Referring to FIG. 1, computer system 10 includes a centralized processor 12 with a control processor subsystem 14 that executes an instance of the kernel 20 including master control programs and server programs to actively control system operation by performing a major portion of the control functions (e.g., booting and system management) for the system. In addition, computer system 10 includes multiple line cards 16a–16n. Each line card includes a control processor subsystem 18a–18n, which runs an instance of the kernel 22a–22n including slave and client programs as well as line card specific software applications.

Each control processor subsystem 14, 18a–18n operates in an autonomous fashion but the software presents computer system 10 to the user as a single computer.

Each control processor subsystem includes a processor integrated circuit (chip) 24, 26a–26n, for example, a Motorola 8260 or an Intel Pentium processor. The control processor subsystem also includes a memory subsystem 28, 30a–30n including a combination of non-volatile or persistent (e.g., PROM and flash memory) and volatile (e.g., SRAM and DRAM) memory components. Computer system 10 also includes an internal communication bus 32 connected to each processor 24, 26a–26n. In one embodiment, the communication bus is a switched Fast Ethernet providing 100 Mb of dedicated bandwidth to each processor allowing the distributed processors to exchange control information at high frequencies. A backup or redundant Ethernet switch may also be connected to each board such that if the primary Ethernet switch fails, the boards can fail-over to the backup Ethernet switch.

In this example, Ethernet 32 provides an out-of-band control path, meaning that control information passes over Ethernet 32 but the network data being switched by computer system 10 passes to and from external network connections 31a–31xx over a separate data path 34. External network control data is passed from the line cards to the central processor over Ethernet 32. This external network control data is also assigned the highest priority when passed over the Ethernet to ensure that it is not dropped during periods of heavy traffic on the Ethernet.

In addition, another bus 33 is provided for low level system service operations, including, for example, the detection of newly installed (or removed) hardware, reset and interrupt control and real time clock (RTC) synchronization across the system, In one embodiment, this is an Inter-IC communications ($I^2C$) bus.

Alternatively, the control and data may be passed over one common path (in-band).

Figure 2:
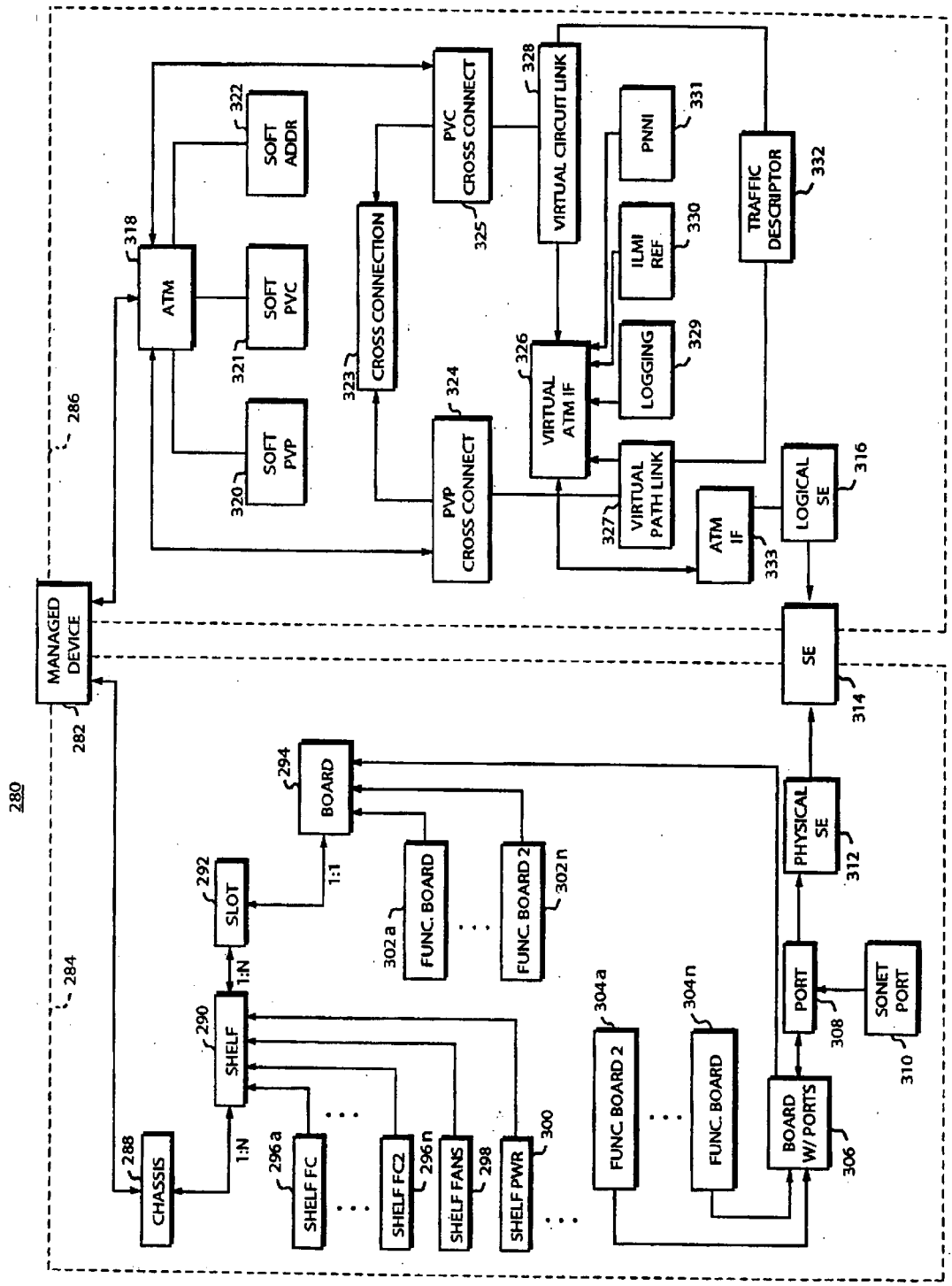
FIG. 2 is a block diagram of a logical system model.

Logical System Model:

Referring to FIG. 2, a logical system model 280 is created using the Unified Modeling Language (UML). A managed device 282 represents the top level system connected to models representing both hardware 284 and software applications 286. Hardware model 284 includes models representing specific pieces of hardware, for example, chassis 288, shelf 290, slot 292 and printed circuit board 294. The logical model is capable of showing containment, that is, typically, there are many shelves per chassis (1:N), many slots per shelf (1:N) and one board per slot (1:1). Shelf 290 is a parent class having multiple shelf models, including various functional shelves 296a–296n as well as one or more system shelves, for example, for fans 298 and power 300. Board 294 is also a parent class having multiple board models, including various functional boards without ports 302a–302n (e.g., central processor 12, FIG. 1) and various functional boards with ports 304a–304n (e.g., line cards 16a–16n, FIG. 1). Hardware model 284 also includes a model for boards with ports 306 coupled to the models for functional boards with ports and a port model 308. Port model 308 is coupled to one or more specific port models, for example, synchronous optical network (SONET) protocol port 310, and a physical service endpoint model 312.

Hardware model 284 includes models for all hardware that may be available on computer system 10 (FIG. 1). All shelves and slots may not be populated. In addition, there may be multiple chasses. It should be understood that SONET port 310 is an example of one type of port that may be supported by computer system 10. A model is created for each type of port available on computer system 10, including, for example, Ethernet, Dense Wavelength Division Multiplexing (DWDM) or Digital Signal, Level 3 (DS3). The Network Management Software (NMS, described below) uses the hardware model to display a graphical picture of computer system 10 to a user.

Service endpoint model 314 spans the software and hardware models within logical model 280. It is a parent class including a physical service endpoint model 312 and a logical service endpoint model 316.

Software model 286 includes models for each of the software processes (e.g., applications, device drivers, system services) available on computer system 10. All applications and device drivers may not be used on computer system 10. As one example, ATM model 318 is shown. It should be understood that software model 286 may also include models for other applications, for example, Internet Protocol (IP) applications and Multi-Protocol Label Switching (MPLS) applications. Models of other processes (e.g., device drivers and system services) are not shown for convenience. For each process, models of configurable objects managed by those processes are also created. For example, models of ATM configurable objects are coupled to ATM model 318, including models for a soft permanent virtual path 320, a soft permanent virtual circuit 321, a switch address 322, a cross-connection 323, a permanent virtual path cross-connection 324, a permanent virtual circuit cross-connection 325, a virtual ATM interface 326, a virtual path link 327, a virtual circuit link 328, logging 329, an ILMI reference 330, PNNI 331, a traffic descriptor 332, an ATM interface 333 and logical service endpoint 316. As described above, logical service endpoint model 316 is coupled to service endpoint model 314. It is also coupled to ATM interface model 333.

The UML logical model is layered on the physical computer system to add a layer of abstraction between the physical system and the software applications. Adding or removing known (i.e., not new) hardware from computer system 10 will not require changes to the logical model or the software applications. However, changes to the physical system, for example, adding a new type of board, will require changes to the logical model. In addition, the logical model is modified when new or upgraded processes are created. Changes to the logical model will likely require changes to most, if not all, existing software applications, and multiple versions of the same software processes (e.g., upgraded and older) are not supported by the same logical model.

To decouple software processes from the logical model—as well as the physical system—another layer of abstraction is added in the form of views. A view is a logical slice of the logical model and defines a particular set of data within the logical model to which an associated process has access. Views allow multiple versions of the same process to be supported by the same logical model since each view limits the data that a corresponding process "views" or has access to, to the data relevant to the version of that process. Similarly, views allow multiple different processes to use the same logical model.

Figure 3:
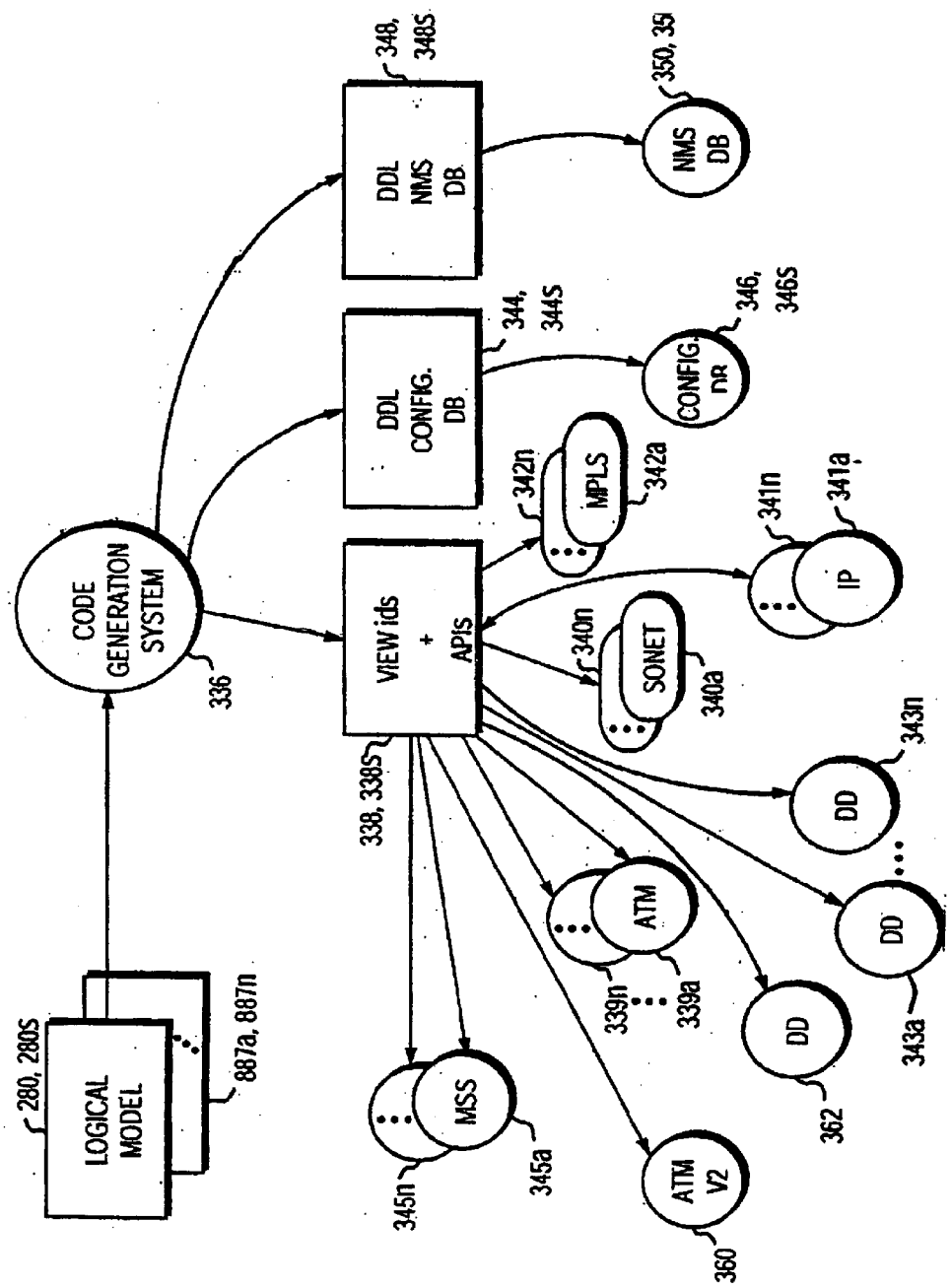
FIG. 3 is a flow diagram illustrating a method for generating views and database data definition language files from a logical system model.

Referring to FIG. 3, UML logical model 280 is used as input to a code generator 336. The code generator creates a view identification (id) and an application programming interface (API) 338 for each process that will require configuration data. For example, a view id and an API may be created for each ATM application 339*a*–339*n*, each SONET application 340*a*–340*n*, each MPLS application 341*a*–341*n* and each IP application 342*a*–342*n*. In addition, a view id and API will also be created for each device driver process, for example, device drivers 343*a*–343*n*, and for modular system services (MSS) 345*a*–345*n* (described below), for example, a Master Control Driver (MCD), a System Resiliency Manager (SRM), and a Software Management System (SMS). The code generator provides data consistency across processes, centralized tuning and an abstraction of embedded configuration and NMS databases (described below) ensuring that changes to their database schema do not affect existing processes.

The code generator also creates a data definition language (DDL) file 344 including structured query language (SQL) commands used to construct various tables and views within a configuration database 346 (described below) and a DDL file 348 including SQL commands used to construct various tables and views within a network management (NMS) database 350 (described below). This is also referred to as converting the UML logical model into a database schema and various views look at particular portions of that schema within the database. If the same database software is used for both the configuration and NMS databases, then one DDL file may be used for both. The databases do not have to be generated from a UML model for views to work. Instead, database files can be supplied directly without having to generate them using the code generator.

Prior to shipping computer system 10 to customers, a software build process is initiated to establish the software architecture and processes. The code generator is part of this process. Each process when pulled into the build process links the associated view id and API into its image. When the computer system is powered-up, as described below, configuration database software will use DDL file 344 to populate a configuration database 346. The computer system will send DDL file 348 to the NMS such that NMS database software can use it to populate an NMS database 350. Memory and storage space within network devices is typically very limited. The configuration database software is robust and takes a considerable amount of these limited resources but provides many advantages as described below.

Figure 4:
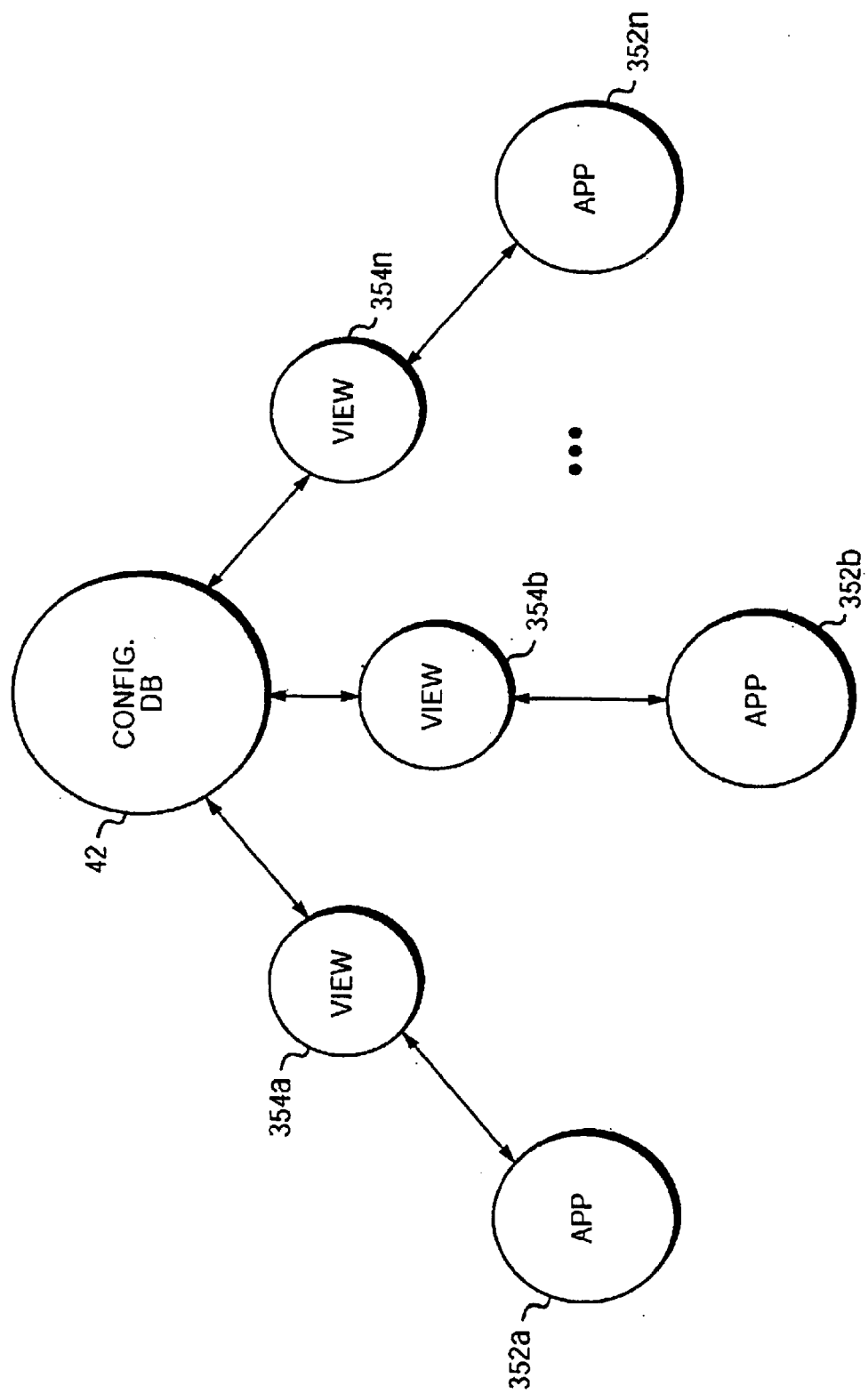
FIG. 4 is a flow diagram illustrating a method for allowing applications to view data within a database.

Referring to FIG. 4, applications 352*a*–352*n* each have an associated view 354*a*–354*n* of configuration database 42. The views may be similar allowing each application to view similar data within configuration database 42. For example, each application may be ATM version 1.0 and each view may be ATM view version 1.3. Instead, the applications and views may be different versions. For example, application 352*a* may be ATM version 1.0 and view 354*a* may be ATM view version 1.3 while application 352*b* is ATM version 1.7 and view 354*b* is ATM view version 1.5. A later version, for example, ATM version 1.7, of the same application may represent an upgrade of that application and its corresponding view allows the upgraded application access only to data relevant to the upgraded version and not data relevant to the older version. If the upgraded version of the application uses the same configuration data as an older version, then the view version may be the same for both applications. In addition, application 352*n* may represent a completely different type of application, for example, MPLS, and view 354*n* allows it to have access to data relevant to MPLS and not ATM or any other application. Consequently, through the use of database views, different versions of the same software applications and different types of software applications may be executed on computer system 10 simultaneously.

Views also allow the logical model and physical system to be changed, evolved and grown to support new applications and hardware without having to change existing applications. In addition, software applications may be upgraded and downgraded independent of each other and without having to re-boot computer system 10. For example, after computer system 10 is shipped to a customer, changes may be made to hardware or software. For instance, a new version of an application, for example, ATM version 2.0, may be created or new hardware may be released requiring a new or upgraded device driver process. To make this a new process and/or hardware available to the user of computer system 10, first the software image including the new process must be re-built.

Referring again to FIG. 3, logical model 280 is changed (280') to include models representing the new software and/or hardware. Code generator 336 then uses new logical model 280' to re-generate view ids and APIs 338' for each application, including, for example, ATM version two 360 and device driver 362, and DDL files 344' and 348'. The new application(s) and/or device driver(s) processes then bind to the new view ids and APIs. A copy of the new application(s) and/or device driver process as well as the new DDL files and any new hardware are sent to the user of computer system 10. The user can then download the new software and plug the new hardware into computer system 10. The upgrade process is described in more detail below.

Power-Up:

Referring again to FIG. 1, on power-up, reset or reboot, the processor on each board (central processor and each line card) downloads and executes boot-strap code (i.e., minimal instances of the kernel software) and power-up diagnostic test code from its local memory subsystem. After passing the power-up tests, processor 24 on central processor 12 then downloads kernel software 20 from persistent storage 21 into non-persistent memory in memory subsystem 28. Kernel software 20 includes operating system (OS), system services (SS) and modular system services (MSS).

In one embodiment, the operating system software and system services software are the OSE operating system and system services from Enea OSE Systems, Inc. in Dallas, Tex. The OSE operating system is a pre-emptive multi-tasking operating system that provides a set of services that together support the development of distributed applications (i.e., dynamic loading). The OSE approach uses a layered architecture that builds a high level set of services around kernel primitives. The operating system, system services, and modular system services provide support for the creation and management of processes; inter-process communication (IPC) through a process-to-process messaging model; standard semaphore creation and manipulation services; the ability to locate and communicate with a process regardless of its location in the system; the ability to determine when another process has terminated; and the ability to locate the provider of a service by name.

These services support the construction of a distributed system wherein applications can be located by name and processes can use a single form of communication regardless of their location. By using these services, distributed applications may be designed to allow services to transparently move from one location to another such as during a fail over.

The OSE operating system and system services provide a single inter-process communications mechanism that allows processes to communicate regardless of their location in the system. OSE IPC differs from the traditional IPC model in that there are no explicit IPC queues to be managed by the application. Instead each process is assigned a unique process identification that all IPC messages use. Because OSE IPC supports inter-board communication the process identification includes a path component. Processes locate each other by performing an OSE Hunt call on the process identification. The Hunt call will return the Process ID of the process that maps to the specified path/name. Inter-board communication is carried over some number of communication links. Each link interface is assigned to an OSE Link Handler. The path component of a process path/name is the concatenation of the Link Handler names that one must transverse in order to reach the process.

In addition, the OSE operating system includes memory management that supports a "protected memory model". The protected memory model dedicates a memory block (i.e., defined memory space) to each process and erects "walls" around each memory block to prevent access by processes outside the "wall". This prevents one process from corrupting the memory space used by another process. For example, a corrupt software memory pointer in a first process may incorrectly point to the memory space of a second processor and cause the first process to corrupt the second processor's memory space. The protected memory model prevents the first process with the corrupted memory pointer from corrupting the memory space or block assigned to the second process. As a result, if a process fails, only the memory block assigned to that process is assumed corrupted while the remaining memory space is considered uncorrupted.

The modular software architecture takes advantage of the isolation provided to each process (e.g., device driver or application) by the protected memory model. Because each process is assigned a unique or separate protected memory block, processes may be started, upgraded or restarted independently of other processes.

Figure 5:
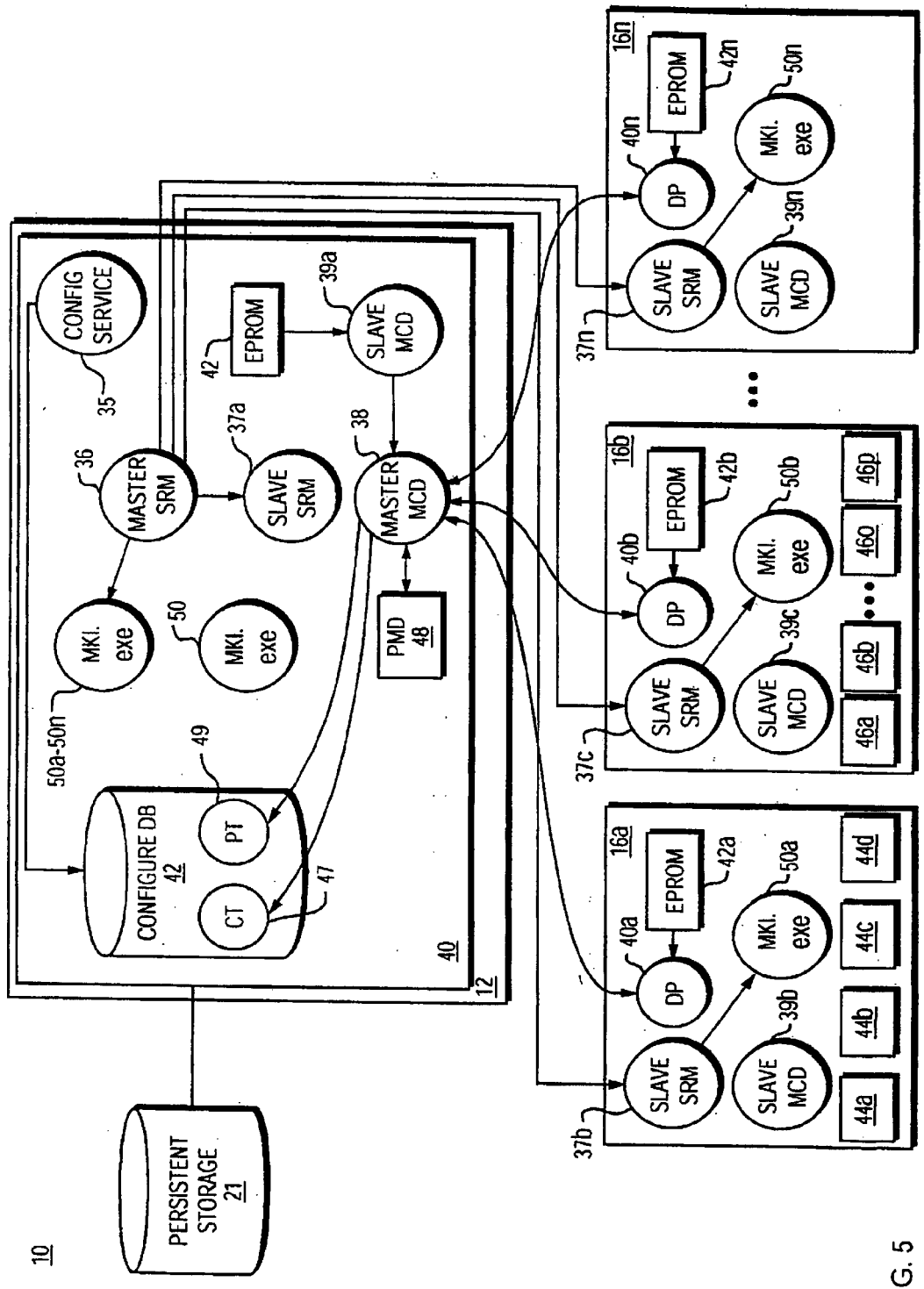
FIGS. 5 and 8 are block and flow diagrams of a computer system incorporating a modular system architecture and illustrating a method for accomplishing hardware inventory and setup.

Referring to FIG. 5, the main modular system service that controls the operation of computer system 10 is a System Resiliency Manager (SRM). Also within modular system services is a Master Control Driver (MCD) that learns the physical characteristics of the particular computer system on which it is running, in this instance, computer system 10. The MCD and the SRM are distributed applications. A master SRM 36 and a master MCD 38 are executed by central processor 12 while slave SRMs 37a–37n and slave MCDs 39a–39n are executed on each board (central processor 12 and each line card 16a–16n). The SRM and MCD work together and use their assigned view ids and APIs to load the appropriate software drivers on each board and to configure computer system 10.

Also within the modular system services is a configuration service program 35 that downloads a configuration database program 42 and its corresponding DDL file from persistent storage into non-persistent memory 40 on central processor 12. In one embodiment, configuration database 42 is a Polyhedra database from Polyhedra, Inc. in the United Kingdom.

Hardware Inventory and Set-Up:

Master MCD 38 begins by taking a physical inventory of computer system 10 (over the $I^2C$ bus) and assigning a unique physical identification number (PID) to each item.

Despite the name, the PID is a logical number unrelated to any physical aspect of the component being numbered. In one embodiment, pull-down/pull-up resistors on the chassis mid-plane provide the number space of Slot Identifiers. The master MCD may read a register for each slot that allows it to get the bit pattern produced by these resistors. MCD 38 assigns a unique PID to the chassis, each shelf in the chassis, each slot in each shelf, each line card 16a–16n inserted in each slot, and each port on each line card. (Other items or components may also be inventoried.)

Typically, the number of line cards and ports on each line card in a computer system is variable but the number of chasses, shelves and slots is fixed. Consequently, a PID could be permanently assigned to the chassis, shelves and slots and stored in a file. To add flexibility, however, MCD 38 assigns a PID even to the chassis, shelves and slots to allow the modular software architecture to be ported to another computer system with a different physical construction (i.e., multiple chasses and or a different number of shelves and slots) without having to change the PID numbering scheme.

Referring to FIGS. 5–7, for each line card 16a–16n in computer system 10, MCD 38 communicates with a diagnostic program (DP) 40a–40n being executed by the line card's processor to learn each card's type and version. The diagnostic program reads a line card type and version number out of persistent storage, for example, EPROM 42a–42n, and passes this information to the MCD. For example, line cards 16a and 16b could be cards that implement Asynchronous Transfer Mode (ATM) protocol over Synchronous Optical Network (SONET) protocol as indicated by a particular card type, e.g., 0XF002, and line card 16e could be a card that implements Internet Protocol (IP) over SONET as indicated by a different card type, e.g., 0XE002. In addition, line card 16a could be a version three ATM over SONET card meaning that it includes four SONET ports 44a–44d each of which may be connected to an external SONET optical fiber that carries an OC-48 stream, as indicated by a particular port type 00620, while line card 16b may be a version four ATM over SONET card meaning that it includes sixteen SONET ports 46a–46f each of which carries an OC-3 stream as indicated by a particular port type, e.g., 00820. Other information is also passed to the MCD by the DP, for example, diagnostic test pass/fail status. With this information, MCD 38 creates card table (CT) 47 and port table (PT) 49 in configuration database 42. As described below, the configuration database copies all changes to an NMS database. If the MCD cannot communicate with the diagnostic program to learn the card type and version number, then the MCD assumes the slot is empty.

Even after initial power-up, master MCD 38 will continue to take physical inventories to determine if hardware has been added or removed from computer system 10. For example, line cards may be added to empty slots or removed from slots. When changes are detected, master MCD 38 will update CT 47 and PT 49 accordingly.

For each line card 16a–16n, master MCD 38 searches a physical module description (PMD) file 48 in memory 40 for a record that matches the card type and version number retrieved from that line card. The PMD file may include multiple files. The PMD file includes a table that corresponds card type and version number with name of the mission kernel image executable file (MKI.exe) that needs to be loaded on that line card. Once determined, master MCD 38 passes the name of each MKI executable file to master SRM 36. Master SRM 36 requests a bootserver (not shown) to download the MKI executable files 50a–50n from persistent storage 21 into memory 40 (i.e., dynamic loading) and passes each MKI executable file 50a–50n to a bootloader (not shown) running on each board (central processor and each line card). The bootloaders execute the received MKI executable file.

Figure 8:
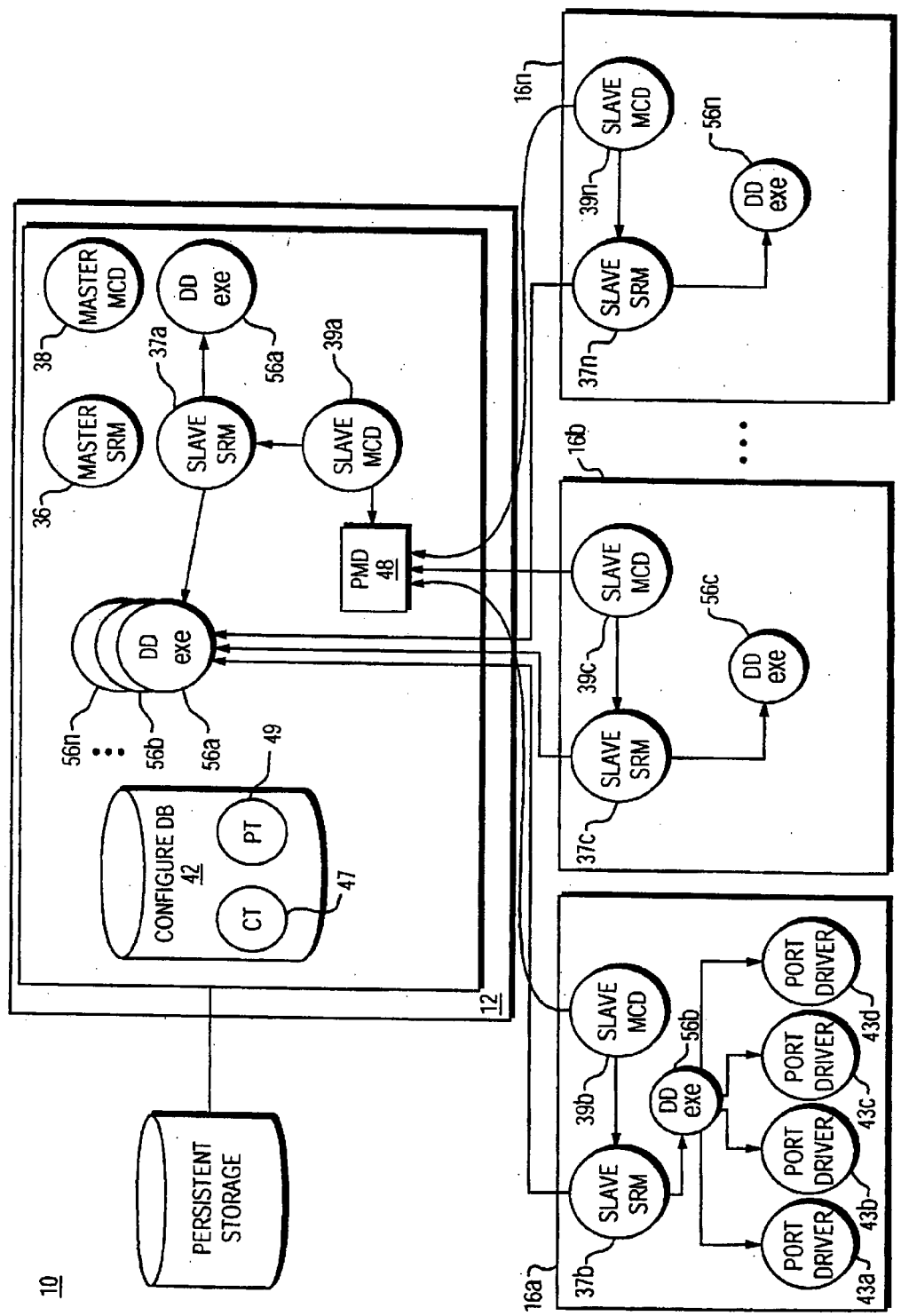

Once all the line cards are executing the appropriate MKI, slave MCDs 39a–39n and slave SRMs 37a–37n on each line card need to download device driver software corresponding to the particular devices on each card. Referring to FIG. 8, slave MCDs 39a–39n search PMD file 48 in memory 40 on central processor 12 for a match with their line card type and version number. Just as the master MCD 36 found the name of the MKI executable file for each line card in the PMD file, each slave MCD 39a–39n reads the PMD file to learn the names of all the device driver executable files associated with each line card type and version. The slave MCDs provide these names to the slave SRMs on their boards. Slave SRMs 37a–37n then download and execute the device driver executable files (DD.exe) 56a–56n from memory 40. As one example, one port device driver 43a–43d may be started for each port 44a–44d on line card 16a. The port driver and port are linked together through the assigned port PID number.

Figure 9:
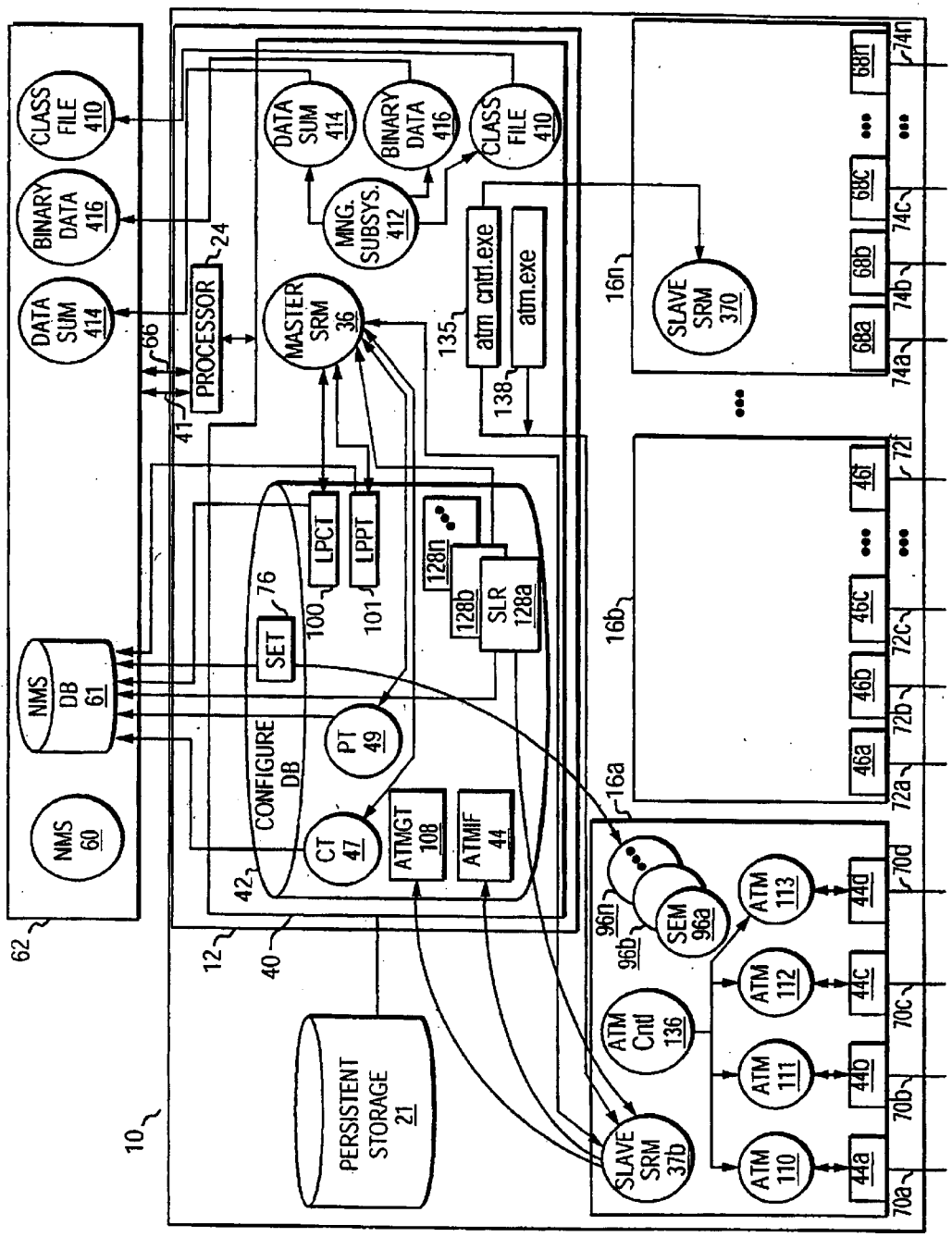
FIG. 9 is a block and flow diagram of a computer system incorporating a modular system architecture and illustrating a method for configuring the computer system using a network management system.

In order to understand the significance of the PMD file (i.e., metadata), note that the MCD software does not have knowledge of board types built into it. Instead, the MCD parameterizes its operations on a particular board by looking up the card type and version number in the PMD file and acting accordingly. Consequently, the MCD software does not need to be modified, rebuilt, tested and distributed with new hardware. The changes required in the software system infrastructure to support new hardware are simpler modify logical model 280 (FIG. 3) to include: a new entry in the PMD file (or a new PMD file) and, where necessary, new device drivers and applications. Because the MCD software, which resides in the kernel, will not need to be modified, the new applications and device drivers and the new DDL files (reflecting the new PMD file) for the configuration database and NMS database are downloaded and upgraded (as described below) without re-booting the computer system. Network Management System (NMS):

Referring to FIG. 9, a user of computer system 10 works with network management system (NMS) software 60 to configure computer system 10. In the embodiment described below, NMS 60 runs on a personal computer or workstation 62 and communicates with central processor 12 over Ethernet network 41 (out-of-band). Instead, the NMS may communicate with central processor 12 over data path 34 (FIG. 1, in-band). Alternatively (or in addition as a back-up communication port), a user may communicate with computer system 10 through a terminal connected to a serial line 66 connecting to the data or control path using a command line interface (CLI) protocol. Instead, NMS 60 could run directly on computer system 10 provided computer system 10 has an input mechanism for the user.

NMS 60 establishes an NMS database 61 on work station 62 using a DDL file corresponding to the NMS database and downloaded from persistent storage 21 in computer system 10. The NMS database mirrors the configuration database through an active query feature (described below). In one embodiment, the NMS database is an Oracle database from Oracle Corporation in Boston, Mass. The NMS and central processor 12 pass control and data over Ethernet 41 using, for example, the Java Database Connectivity (JDBC) protocol. Use of the JDBC protocol allows the NMS to communicate with the configuration database in the same manner that it communicates with its own internal storage mechanisms, including the NMS database. Changes made to the configuration database are passed to the NMS database to insure that both databases store the same data. This synchronization process is much more efficient and timely than older methods that require the NMS to periodically poll the network device to determine whether configuration changes have been made. In these systems, NMS polling is unnecessary and wasteful if the configuration has not been changed. Additionally, if a configuration change is made through some other means, for example, a command line interface, and not through the NMS, the NMS will not be updated until the next poll, and if the network device crashes prior to the NMS poll, then the configuration change will be lost. In computer system 10, however, command line interface changes made to configuration database 42 are passed immediately to the NMS database through the active query feature ensuring that the NMS is immediately aware of any configuration changes.

Typically, work station 62 is coupled to many network computer systems, and NMS 60 is used to configure and manage each of these systems. In addition to configuring each system, the NMS also interprets data gathered by each system relevant to each system's network accounting data, statistics, and fault logging and presents this to the user. Instead of having the NMS interpret each system's data in the same fashion, flexibility is added by having each system send the NMS a JAVA class file 410 indicating how its network data should be interpreted. Through the File Transfer Protocol (ftp), an accounting subsystem process 412 running on central processor 12 pushes a data summary file 414 and a binary data file 416 to the NMS. The data summary file indicates the name of the JAVA Class file the NMS should use to interpret the binary data file. If the computer system has not already done so, it pushes the class file to the NMS. JAVA Reflection is used to load the application class file and process the data in the binary data file. As a result, a new class file can be added or updated on a computer system without having to reboot the computer system or update the NMS. The computer system simply pushes the new class file to the NMS. In addition, the NMS can use different class files for each computer system such that the data gathered on each system can be particularized to each system.

Configuration:

As described above, unlike a monolithic software architecture which is directly linked to the hardware of the computer system on which it runs, a modular software architecture includes independent applications that are significantly decoupled from the hardware through the use of a logical model of the computer system. Using the logical model, a view id and API are generated for each application to define each application's access to particular data in a configuration database. The configuration database is established using a data definition language (DDL) file also generated from the logical model. As a result, there is only a limited connection between the computer system's software and hardware, which allows for multiple versions of the same application to run on the computer system simultaneously and different types of applications to run simultaneously on the computer system. In addition, while the computer system is running, application upgrades and downgrades may be executed without affecting other applications and new hardware and software may be added to the system also without affecting other applications.

Referring again to FIG. 9, initially, NMS 60 reads card table 47 and port table 49 to determine what hardware is available in computer system 10. The NMS assigns a logical identification number (LID) 98 (FIGS. 11a and 11b) to each card and port and inserts these numbers in an LID to PID Card table (LPCT) 100 and an LID to PID Port table (LPPT) 101 in configuration database 42. Alternatively, the NMS could use the PID previously assigned to each board by the MCD. However, to allow for hardware redundancy, the NMS assigns an LID and may associate the LID with at least two PIDs, a primary PID 102 and a backup PID 104. (LPCT 100 may include multiple backup PID fields to allow more than one backup PID to be assigned to each primary PID.)

The user chooses the desired redundancy structure and instructs the NMS as to which boards are primary boards and which boards are backup boards. For example, the NMS may assign LID 30 to line card 16a—previously assigned PID 500 by the MCD—as a user defined primary card, and the NMS may assign LID 30 to line card 16n—previously assigned PID 513 by the MCD—as a user defined back-up card (see row 106, FIG. 11a). The NMS may also assign LID 40 to port 44a—previously assigned PID 1500 by the MCD—as a primary port, and the NMS may assign LID 40 to port 68a—previously assigned PID 1600 by the MCD—as a back-up port (see row 107, FIG. 11b).

In a 1:1 redundant system, each backup line card backs-up only one other line card and the NMS assigns a unique primary PID and a unique backup PID to each LID (no LIDs share the same PIDs). In a 1:N redundant system, each backup line card backs-up at least two other line cards and the NMS assigns a different primary PID to each LID and the same backup PID to at least two LIDs. For example, if computer system 10 is a 1:N redundant system, then one line card, for example, line card 16n, serves as the hardware backup card for at least two other line cards, for example, line cards 16a and 16b. If the NMS assigns an LID of 31 to line card 16b, then in logical to physical card table 100 (see row 109, FIG. 11a), the NMS associates LID 31 with primary PID 501 (line card 16b) and backup PID 513 (line card 16n). As a result, backup PID 513 (line card 16n) is associated with both LID 30 and 31.

The logical to physical card table provides the user with maximum flexibility in choosing a redundancy structure. In the same computer system, the user may provide full redundancy (1:1), partial redundancy (1:N), no redundancy or a combination of these redundancy structures. For example, a network manager (user) may have certain customers that are willing to pay more to ensure their network availability, and the user may provide a backup line card for each of that customer's primary line cards (1:1).

Other customers may be willing to pay for some redundancy but not full redundancy, and the user may provide one backup line card for all of that customer's primary line cards (1:N). Still other customers may not need any redundancy, and the user will not provide any backup line cards for that customer's primary line cards. For no redundancy, the NMS would leave the backup PID field in the logical to physical table blank. Each of these customers may be serviced by separate computer systems or the same computer system. Redundancy is discussed in more detail below.

The NMS and MCD use the same numbering space for LIDs, PIDs and other assigned numbers to ensure that the numbers are different (no collisions).

The configuration database, for example, a Polyhedra database, supports an "active query" feature. Through the active query feature, other software applications can be notified of changes to configuration database records in which they are interested. The NMS database establishes an active query for all configuration database records to insure it is updated with all changes. The master SRM establishes an active query with configuration database 42 for LPCT 100 and LPPT 101. Consequently, when the NMS adds to or changes these tables, configuration database 42 sends a notification to the master SRM and includes the change. In this example, configuration database 42 notifies master SRM 36 that LID 30 has been assigned to PID 500 and 513 and LID 31 has been assigned to PID 501 and 513. The master SRM then uses card table 47 to determine the physical location of boards associated with new or changed LIDs and then tells the corresponding slave SRM of its assigned LID(s). In the continuing example, master SRM reads CT 47 to learn that PID 500 is line card 16a, PID 501 is line card 16b and PID 513 is line card 16n. The master SRM then notifies slave SRM 37b on line card 16a that it has been assigned LID 30 and is a primary line card, SRM 37c on line card 16b that it has been assigned LID 31 and is a primary line card and SRM 37o on line card 16n that it has been assigned LIDs 30 and 31 and is a backup line card. All three slave SRMs 37b, 37c and 37o then set up active queries with configuration database 42 to insure that they are notified of any software load records (SLRs) created for their LIDs. A similar process is followed for the LIDs assigned to each port.

The NMS informs the user of the hardware available in computer system 10. This information may be provided as a text list, as a logical picture in a graphical user interface (GUI), or in a variety of other formats. The user then tells the NMS how they want the system configured.

The user will select which ports (e.g., 44a–44d, 46a–46f, 68a–68n) the NMS should enable. There may be instances where some ports are not currently needed and, therefore, not enabled. The user also needs to provide the NMS with information about the type of network connection (e.g., connection 70a–70d, 72a–72f, 74a–74n). For example, the user may want all ports 44a–44d on line card 16a enabled to run ATM over SONET. The NMS may start one ATM application to control all four ports, or, for resiliency, the NMS may start one ATM application for each port. Alternatively, each port may be enabled to run a different protocol (e.g., MPLS, IP, Frame Relay).

In the example given above, the user must also indicate the type of SONET fiber they have connected to each port and what paths to expect. For example, the user may indicate that each port 44a–44d is connected to a SONET optical fiber carrying an OC-48 stream. A channelized OC-48 stream is capable of carrying forty-eight STS-1 paths, sixteen STS-3c paths, four STS-12c paths or a combination of STS-1, STS-3c and STS-12c paths. A clear channel OC-48c stream carries one concatenated STS-48 path. In the example, the user may indicate that the network connection to port 44a is a clear channel OC-48 SONET stream having one STS-48 path, the network connection to port 44b is a channelized OC-48 SONET stream having three STS-12c paths (i.e., the SONET fiber is not at full capacity—more paths may be added later), the network connection to port 44c is a channelized OC-48 SONET stream having two STS-3c paths (not at full capacity) and the network connection to port 44d is a channelized OC-48 SONET stream having three STS-12c paths (not at full capacity). In the current example, all paths within each stream carry data transmitted according to the ATM protocol. Alternatively, each path within a stream may carry data transmitted according to a different protocol.

The NMS uses the information received from the user to create records in several tables in the configuration database, which are then copied to the NMS database. These tables are accessed by other applications to configure computer system 10. One table, the service endpoint table (SET) 76 (see also FIG. 10), is created when the NMS assigns a unique service endpoint number (SE) to each path on each enabled port and corresponds each service endpoint number with the physical identification number (PID) previously assigned to each port by the MCD. Through the use of the logical to physical port table (LPPT), the service endpoint number also corresponds to the logical identification number (LID) of the port. For example, since the user indicated that port 44a (PID 1500) has a single STS-48 path, the NMS assigns one service endpoint number (e.g. SE 1, see row 78, FIG. 10). Similarly, the NMS assigns three service endpoint numbers (e.g., SE 2, 3, 4, see rows 80–84) to port 44b (PID 1501), two service endpoint numbers (e.g., SE 5, 6, see rows 86, 88) to port 44c (PID 1502) and three service endpoint numbers (e.g., SE 7, 8, 9, see rows 90, 92, 94) to port 44d.

Service endpoint managers (SEMs) within the modular system services of the kernel software running on each line card use the service endpoint numbers assigned by the NMS to enable ports and to link instances of applications, for example, ATM, running on the line cards with the correct port. The kernel may start one SEM to handle all ports on one line card, or, for resiliency, the kernel may start one SEM for each particular port. For example, SEMs 96a–96d are spawned to independently control ports 44a–44d.

The service endpoint managers (SEMs) running on each board establish active queries with the configuration database for SET 76. Thus, when the NMS changes or adds to the service endpoint table (SET), the configuration database sends the service endpoint manager associated with the port PID in the SET a change notification including information on the change that was made. In the continuing example, configuration database 42 notifies SEM 96a that SET 76 has been changed and that SE 1 was assigned to port 44a (PID 1500). Configuration database 42 notifies SEM 96b that SE 2, 3, and 4 were assigned to port 44b (PID 1501), SEM 96c that SE 5 and 6 were assigned to port 44c (PID 1502) and SEM 96d that SE 7, 8, and 9 were assigned to port 44d (PID 1503).

When a service endpoint is assigned to a port, the SEM associated with that port passes the assigned SE number to the port driver for that port using the port PID number associated with the SE number.

To load instances of software applications on the correct boards, the NMS creates software load records (SLR) 128a–128n in configuration database 42. The SLR includes the name 130 (FIG. 14) of a control shim executable file and an LID 132 for cards on which the application must be spawned. In the continuing example, NMS 60 creates SLR 128a including the executable name atm_cntrl.exe and card LID 30 (row 134). The configuration database detects LID 30 in SLR 128a and sends slave SRMs 37b (line card 16a) and 37o (line card 16n) a change notification including the name of the executable file (e.g., atm_cntrl.exe) to be loaded. The primary slave SRMs then download and execute a copy of atm_cntrl.exe 135 from memory 40 to spawn the ATM controllers (e.g., ATM controller 136 on line card 16a). Since slave SRM 37o is on backup line card 16n, it may or may not spawn an ATM controller in backup mode. Software backup is described in more detail below. Instead of downloading a copy of atm_cntrl.exe 135 from memory 40, a slave SRM may download it from another line card that already downloaded a copy from memory 40. There may be instances when downloading from a line card is quicker than downloading from central processor 12. Through software load records and the tables in configuration database 42, applications are downloaded and executed without the need for the system services, including the SRM, or any other software in the kernel to have information as to how the applications should be configured. The control shims (e.g., atm_cntrl.exe 135) interpret the next layer of the application (e.g., ATM) configuration.

For each application that needs to be spawned, for example, an ATM application and a SONET application, the NMS creates an application group table. Referring to FIG. 12, ATM group table 108 indicates that four instances of ATM (i.e., group number 1, 2, 3, 4)—corresponding to four enabled ports 44a–44n—are to be started on line card 16a (LID 30). If other instances of ATM are started on other line cards, they would also be listed in ATM group table 108 but associated with the appropriate line card LID. ATM group table 108 may also include additional information needed to execute ATM applications on each particular line card. (See description of software backup below.)

In the above example, one instance of ATM was started for each port on the line card. This provides resiliency and fault isolation should one instance of ATM fail or should one port suffer a failure. An even more resilient scheme would include multiple instances of ATM for each port. For example, one instance of ATM may be started for each path received by a port.

The application controllers on each board now need to know how many instances of the corresponding application they need to spawn. This information is in the application group table in the configuration database. Through the active query feature, the configuration database notifies the application controller of records associated with the board's LID from corresponding application group tables. In the continuing example, configuration database 42 sends ATM controller 136 records from ATM group table 108 that correspond to LID 30 (line card 16a). With these records, ATM controller 136 learns that there are four ATM groups associated with LID 30 meaning ATM must be instantiated four times on line card 16a. ATM controller 136 asks slave SRM 37b to download and execute four instances (ATM 110–113, FIG. 15) of atm.exe 138.

Once spawned, each instantiation of ATM 110–113 sends an active database query to search ATM interface table 114 for its corresponding group number and to retrieve associated records. The data in the records indicates how many ATM interfaces each instantiation of ATM needs to spawn. Alternatively, a master ATM application (not shown) running on central processor 12 may perform active queries of the configuration database and pass information to each slave ATM application running on the various line cards regarding the number of ATM interfaces each slave ATM application needs to spawn.

Figure 15:
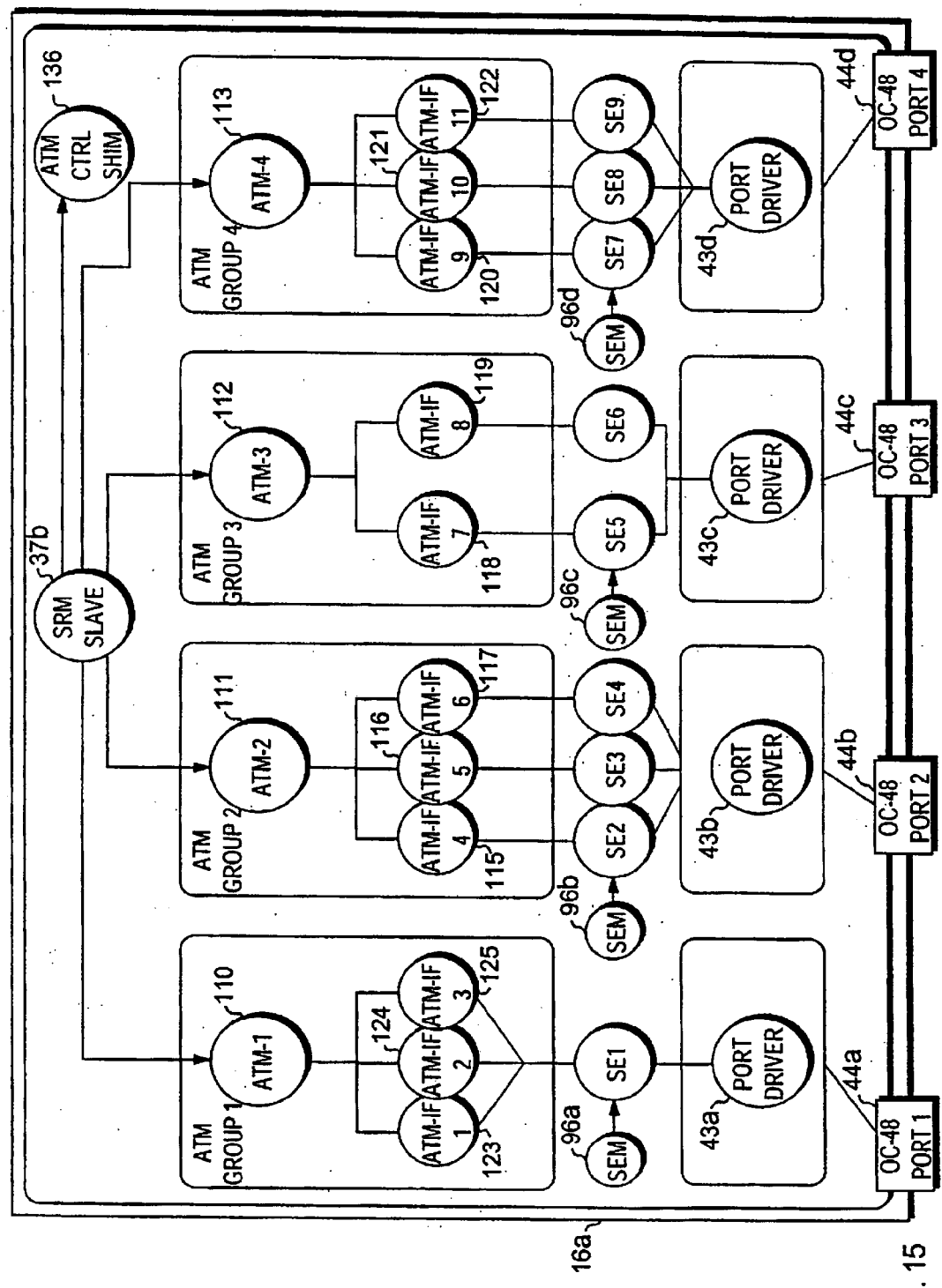
FIG. 15 is a block and flow diagram of a line card and a method for executing multiple instances of processes.

Referring to FIGS. 13 and 15, for each instance of ATM 110–113 there may be one or more ATM interfaces. To configure these ATM interfaces, the NMS creates an ATM interface table 114. There may be one ATM interface 115–122 per path/service endpoint or multiple virtual ATM interfaces 123–125 per path. This flexibility is left up to the user and NMS, and the ATM interface table allows the NMS to communicate this configuration information to each instance of each application running on the different line cards. For example, ATM interface table 114 indicates that for ATM group 1, service endpoint 1, there are three virtual ATM interfaces (ATM-IF 1–3) and for ATM group 2, there is one ATM interface for each service endpoint: ATM-IF 4 and SE 2; ATM-IF 5 and SE 3; and ATM-IF 6 and SE 4.

Computer system 10 is now ready to operate as a network switch using line card 16a and ports 44a–44d. The user will likely provide the NMS with further instructions to configure more of computer system 10. For example, instances of other software applications, such as an IP application, and additional instances of ATM may be spawned (as described above) on line cards 16a or other boards in computer system 10.

As shown above, all application dependent data resides in memory 40 and not in kernel software. Consequently, changes may be made to applications and configuration data in memory 40 to allow hot (while computer system 10 is running) upgrades of software and hardware and configuration changes. Although the above described power-up and configuration of computer system 10 is complex, it provides massive flexibility as described in more detail below.

Inter-Process Communication:

As described above, the operating system assigns a unique process identification number (proc_id) to each spawned process. Each process has a name, and each process knows the names of other processes with which it needs to communicate. The operating system keeps a list of process names and the assigned process identification numbers. Processes send messages to other processes using the assigned process identification numbers without regard to what board is executing each process (i.e., process location). Application Programming Interfaces (APIs) define the format and type of information included in the messages.

The modular software architecture configuration model requires a single software process to support multiple configurable objects. For example, as described above, an ATM application may support configurations requiring multiple ATM interfaces and thousands of permanent virtual connections per ATM interface. The number of processes and configurable objects in a modular software architecture can quickly grow especially in a distributed processing system. If the operating system assigns a new process for each configurable object, the operating system's capabilities may be quickly exceeded. For example, the operating system may be unable to assign a process for each ATM interface, each service endpoint, each permanent virtual circuit, etc. In some instances, the process identification numbering scheme itself may not be large enough. Where protected memory is supported, the system may have insufficient memory to assign each process and configurable object a separate memory block. In addition, supporting a large number of independent processes may reduce the operating system's efficiency and slow the operation of the entire computer system.

Figure 16A:
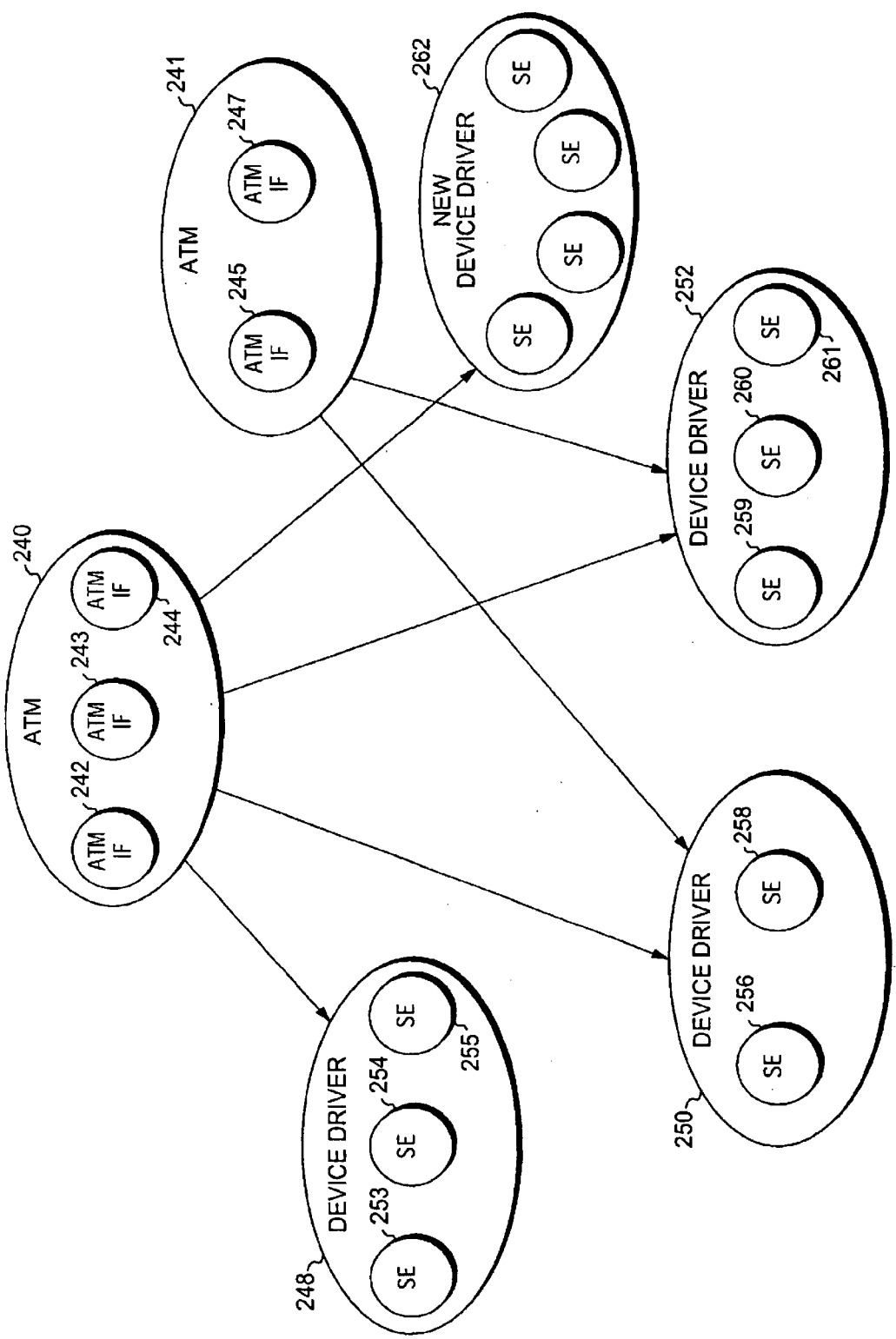
FIGS. 16a–16b are flow diagrams illustrating a method for assigning logical names for inter-process communications.

One alternative is to assign a unique process identification number to only certain high level processes. Referring to FIG. 16a, for example, process identification numbers may only be assigned to each ATM process (e.g., ATMs 240, 241) and not to each ATM interface (e.g., ATM IFs 242–247) and process identification numbers may only be assigned to each port device driver (e.g., device drivers 248, 250, 252) and not to each service endpoint (e.g., SE 253–261). A disadvantage to this approach is that objects within one high level process will likely need to communicate with objects within other high level processes. For example, ATM interface 242 within ATM 240 may need to communicate with SE 253 within device driver 248. ATM IF 242 needs to know if SE 253 is active and perhaps certain other information about SE 253. Since SE 253 was not assigned a process identification number, however, neither ATM 240 nor ATM IF 242 knows if it exists. Similarly, ATM IF 242 knows it needs to communicate with SE 253 but does not know that device driver 248 controls SE 253.

One possible solution is to hard code the name of device driver 248 into ATM 240. ATM 240 then knows it must communicate with device driver 248 to learn about the existence of any service endpoints within device driver 248 that may be needed by ATM IF 242, 243 or 244. Unfortunately, this can lead to scalability issues. For instance, each instantiation of ATM (e.g., ATM 240, 241) needs to know the name of all device drivers (e.g., device drivers 248, 250, 252) and must query each device driver to locate each needed service endpoint. An ATM query to a device driver that does not include a necessary service endpoint is a waste of time and resources. In addition, each high level process must periodically poll other high level processes to determine whether objects within them are still active (i.e., not terminated) and whether new objects have been started. If the object status has not changed between polls, then the poll wasted resources. If the status did change, then communications have been stalled for the length of time between polls. In addition, if a new device driver is added (e.g., device driver 262), then ATM 240 and 241 cannot communicate with it or any of the service endpoints within it until they have been upgraded to include the new device driver's name.

Preferably, computer system 10 implements a name server process and a flexible naming procedure. The name server process allows high level processes to register information about the objects within them and to subscribe for information about the objects with which they need to communicate. The flexible naming procedure is used instead of hard coding names in processes. Each process, for example, applications and device drivers, use tables in the configuration database to derive the names of other configurable objects with which they need to communicate. For example, both an ATM application and a device driver process may use an assigned service endpoint number from the service endpoint table (SET) to derive the name of the service endpoint that is registered by the device driver and subscribed for by the ATM application. Since the service endpoint numbers are assigned by the NMS during configuration, stored in SET 76 and passed to local SEMs, they will not be changed if device drivers or applications are upgraded or restarted.

Figure 16B:
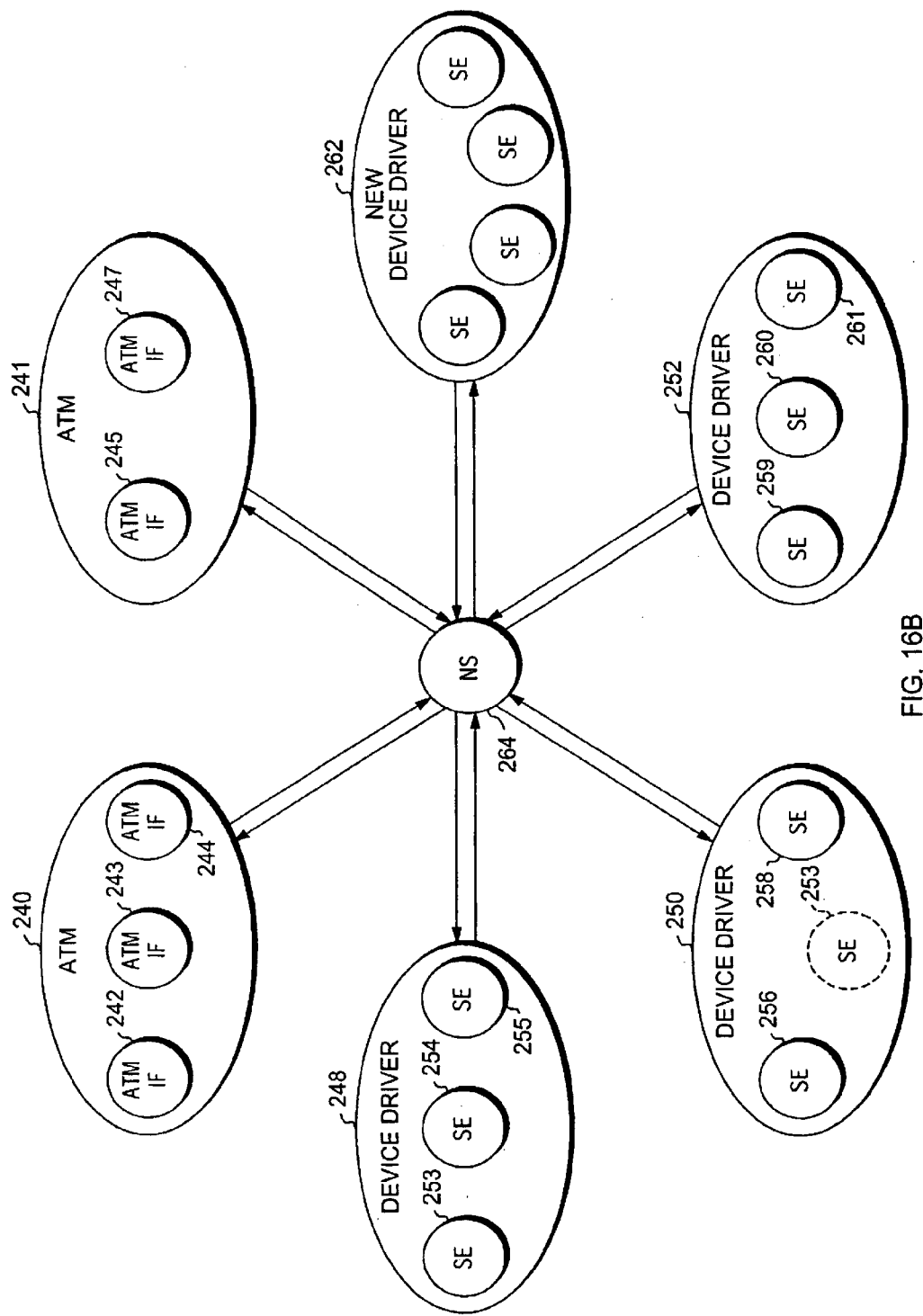

Referring to FIG. 16b, for example, when device drivers 248, 250 and 252 are started they each register with name server (NS) 264. Each device driver provides a name, a process identification number and the name of each of its service endpoints. Each device driver also updates the name server as service endpoints are started, terminated or restarted. Similarly, each instantiation of ATM 240, 241 subscribes with name server 264 and provides its name, process identification number and the name of each of the service endpoints in which it is interested. The name server then notifies ATM 240 and 241 as to the process identification of the device driver with which they should communicate to reach a desired service endpoint. The name server updates ATM 240 and 241 in accordance with updates from the device drivers. As a result, updates are provided only when necessary (i.e., no wasted resources), and the computer system is highly scalable. For example, if a new device driver 262 is started, it simply registers with name server 264, and name server 264 notifies either ATM 240 or 241 if a service endpoint in which they are interested is within the new device driver. The same is true if a new instantiation of ATM—perhaps an upgraded version—is started or if either an ATM application or a device driver fails and is restarted.

Figure 16C:
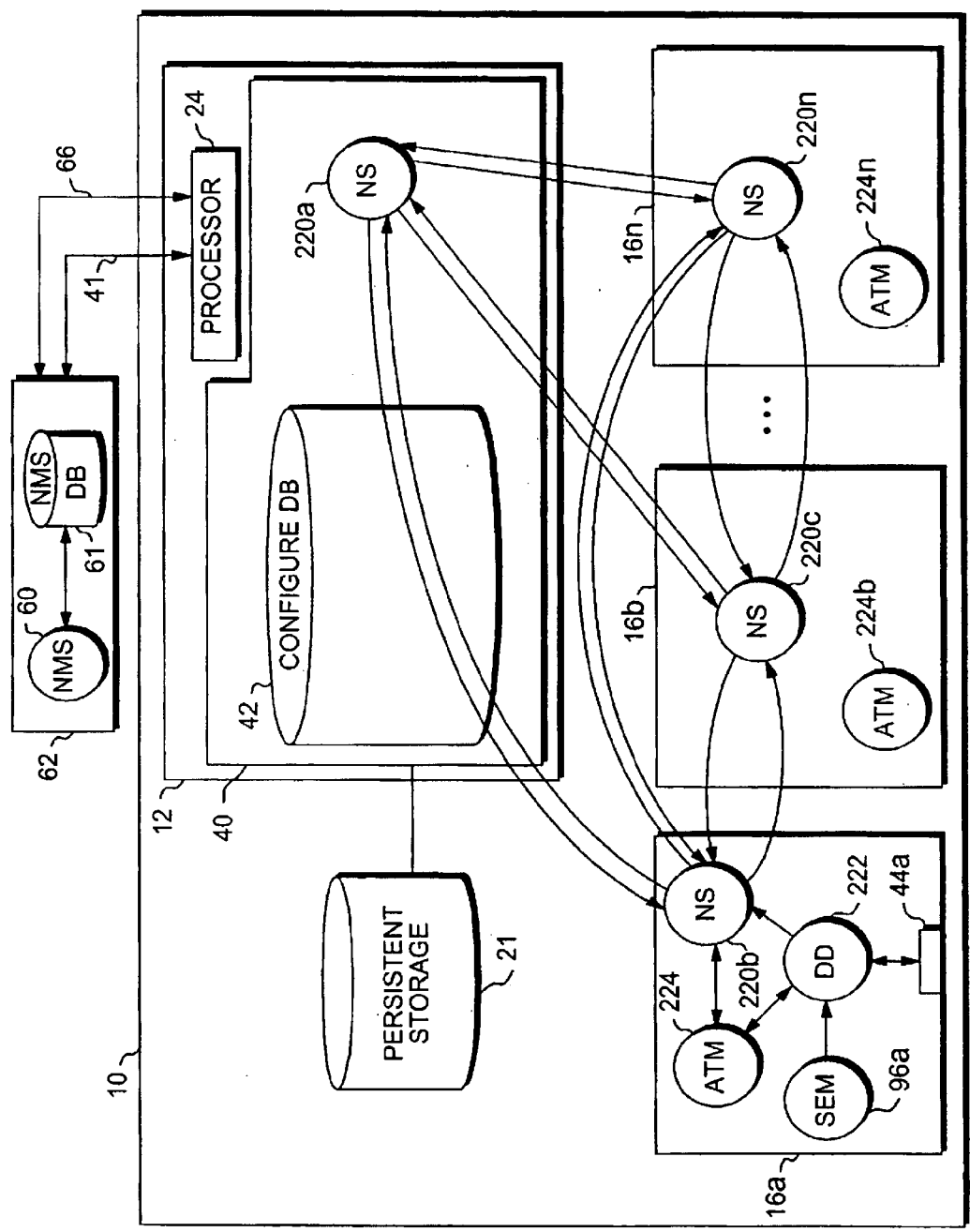
FIG. 16c is a block and flow diagram of a computer system incorporating a modular system architecture and illustrating a method for using logical names for inter-process communications.

Referring to FIG. 16c, when the SEM, for example, SEM 96a, notifies a device driver, for example, device driver (DD) 222, of its assigned SE number, DD 222 uses the SE number to generate a device driver name. In the continuing example from above, where the ATM over SONET protocol is to be delivered to port 44a and DD 222, the device driver name may be for example, atm.se1. DD 222 publishes this name to NS 220b along with the process identification assigned by the operating system and the name of its service endpoints.

Applications, for example, ATM 224, also use SE numbers to generate the names of device drivers with which they need to communicate and subscribe to NS 220b for those device driver names, for example, atm.se1. If the device driver has published its name and process identification with NS 220b, then NS 220b notifies ATM 224 of the process identification number associated with atm.se1 and the name of its service endpoints. ATM 224 can then use the process identification to communicate with DD 222 and, hence, any objects within DD 222. If device driver 222 is restarted or upgraded, SEM 96a will again notify DD 222 that its associated service endpoint is SE 1 which will cause DD 222 to generate the same name of atm.se1. DD 222 will then re-publish with NS 220b and include the newly assigned process identification number. NS 220b will provide the new process identification number to ATM 224 to allow the processes to continue to communicate. Similarly, if ATM 224 is restarted or upgraded, it will use the service endpoint numbers from ATM interface table 114 and, as a result, derive the same name of atm.se1 for DD 222. ATM 224 will then re-subscribe with NS 220b.

Computer system 10 includes a distributed name server (NS) application including a name server process 220a–220n on each board (central processor and line card). Each name server process handles the registration and subscription for the processes on its corresponding board. For distributed applications, after each application (e.g., ATM 224a–224n) registers with its local name server (e.g., 220b–220n), the name server registers the application with each of the other name servers. In this way, only distributed applications are registered/subscribed system wide which avoids wasting system resources by registering local processes system wide.

The operating system, through the use of assigned process identification numbers, allows for inter-process communication (IPC) regardless of the location of the processes within the computer system. The flexible naming process allows applications to use data in the configuration database to determine the names of other applications and configurable objects, thus, alleviating the need for hard coded process names. The name server notifies individual processes of the existence of the processes and objects with which they need to communicate and the process identification numbers needed for that communication. The termination, re-start or upgrade of an object or process is, therefore, transparent to other processes, with the exception of being notified of new process identification numbers. For example, due to a configuration change initiated by the user of the computer system, service endpoint 253 (FIG. 16b), may be terminated within device driver 248 and started instead within device driver 250. This movement of the location of object 253 is transparent to both ATM 240 and 241. Name server 264 simply notifies whichever processes have subscribed for SE 253 of the newly assigned process identification number corresponding to device driver 250.

The name server or a separate binding object manager (BOM) process may allow processes and configurable objects to pass additional information adding further flexibility to inter-process communications. For example, flexibility may be added to the application programming interfaces (APIs) used between processes. As discussed above, once a process is given a process identification number by the name server corresponding to an object with which it needs to communicate, the process can then send messages to the other process in accordance with a predefined application programming interface (API). Instead of having a predefined API, the API could have variables defined by data passed through the name server or BOM, and instead of having a single API, multiple APIs may be available and the selection of the API may be dependent upon information passed by the name server or BOM to the subscribed application.

Figure 16D:
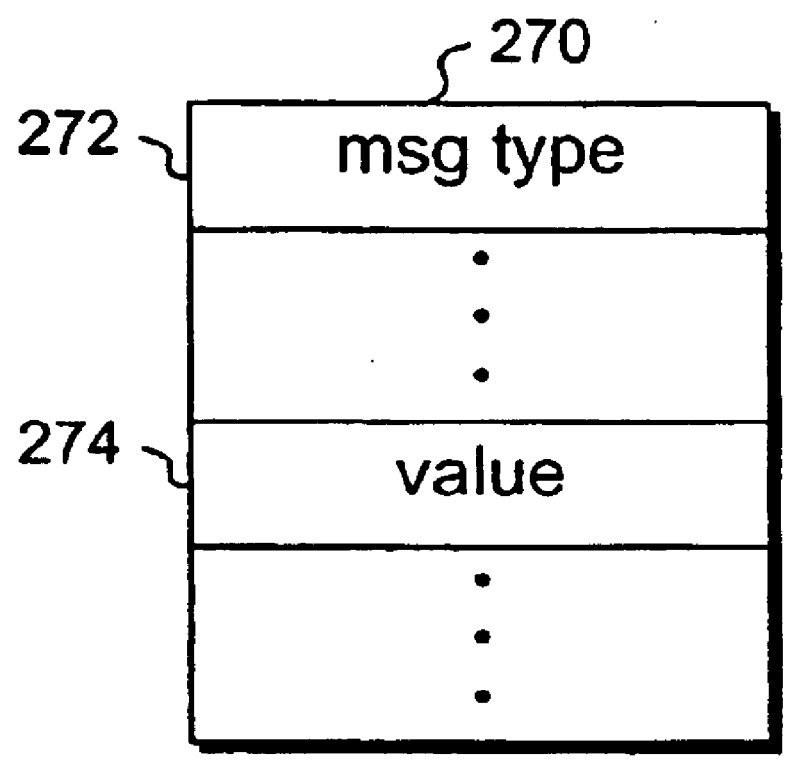
FIG. 16d is a chart representing a message format.

Referring to FIG. 16d, a typical API will have a predefined message format 270 including, for example, a message type 272 and a value 274 of a fixed number of bits (e.g., 32). Processes that use this API must use the predefined message format. If a process is upgraded, it will be forced to use the same message format or change the API/message format which would require that all processes that use this API also be similarly upgraded to use the new API. Instead, the message format can be made more flexible by passing information through the name server or BOM. For example, instead of having the value field 274 be a fixed number of bits, when an application registers a name and process identification number it may also register the number of bits it plans on using for the value field (or any other field). Perhaps a zero indicates a value field of 32 bits and a one indicates a value filed of 64 bits. Thus, both processes know the message format but some flexibility has been added.

In addition to adding flexibility to the size of fields in a message format, flexibility may be added to the overall message format including the type of fields included in the message. When a process registers its name and process identification number, it may also register a version number indicating which API version should be used by other processes wishing to communicate with it. For example, device driver 250 (FIG. 16b) may register SE 258 with NS 264 and provide the name of SE 258, device driver 250's process identification number and a version number one, and device driver 252 may register SE 261 with NS 264 and provide the name of SE 261, device driver 252's process identification number and a version number (e.g., version number two). If ATM 240 has subscribed for either SE 258 or SE 261, then NS 264 notifies ATM 240 that SE 258 and SE 261 exist and provides the process identification numbers and version numbers. The version number tells ATM 240 what message format and information SE 258 and SE 261 expect. The different message formats for each version may be hard coded into ATM 240 or ATM 240 may access system memory or the configuration database for the message formats corresponding to service endpoint version one and version two. As a result, the same application may communicate with different versions of the same configurable object using a different API.

This also allows an application, for example, ATM, to be upgraded to support new configurable objects, for example, new ATM interfaces, while still being backward compatible by supporting older configurable objects, for example, old ATM interfaces. Backward compatibility has been provided in the past through revision numbers, however, initial communication between processes involved polling to determine version numbers and where multiple applications need to communicate, each would need to poll the other. The name server/BOM eliminates the need for polling.

As described above, the name server notifies subscriber applications each time a subscribed for process is terminated. Instead, the name server/BOM may not send such a notification unless the System Resiliency Manager (SRM) tells the name server/BOM to send such a notification. For example, depending upon the fault policy/resiliency of the system, a particular software fault may simply require that a process be restarted. In such a situation, the name server/BOM may not notify subscriber applications of the termination of the failed process and instead simply notify the subscriber applications of the newly assigned process identification number after the failed process has been restarted. Data that is sent by the subscriber processes after the termination of the failed process and prior to the notification of the new process identification number may be lost but the recovery of this data (if any) may be less problematic than notifying the subscriber processes of the failure and having them hold all transmissions. For other faults, or after a particular software fault occurs a predetermined number of times, the SRM may then require the name server/BOM to notify all subscriber processes of the termination of the failed process. Alternatively, if a terminated process does not re-register within a predetermined amount of time, the name server/BOM may then notify all subscriber processes of the termination of the failed process.

Configuration Change:

Over time the user will likely make hardware changes to the computer system that require configuration changes. For example, the user may plug a fiber or cable (i.e., network connection) into an as yet unused port, in which case, the port must be enabled and, if not already enabled, then the port's line card must also be enabled. As other examples, the user may add another path to an already enabled port that was not fully utilized, and the user may add another line card to the computer system. Many types of configuration changes are possible, and the modular software architecture allows them to be made while the computer system is running (hot changes). Configuration changes may be automatically copied to persistent storage as they are made so that if the computer system is shut down and rebooted, the memory and configuration database will reflect the last known state of the hardware.

To make a configuration change, the user informs the NMS of the particular change, and similar to the process for initial configuration, the NMS changes the appropriate tables in the configuration database (copied to the NMS database) to implement the change.

Figure 17:
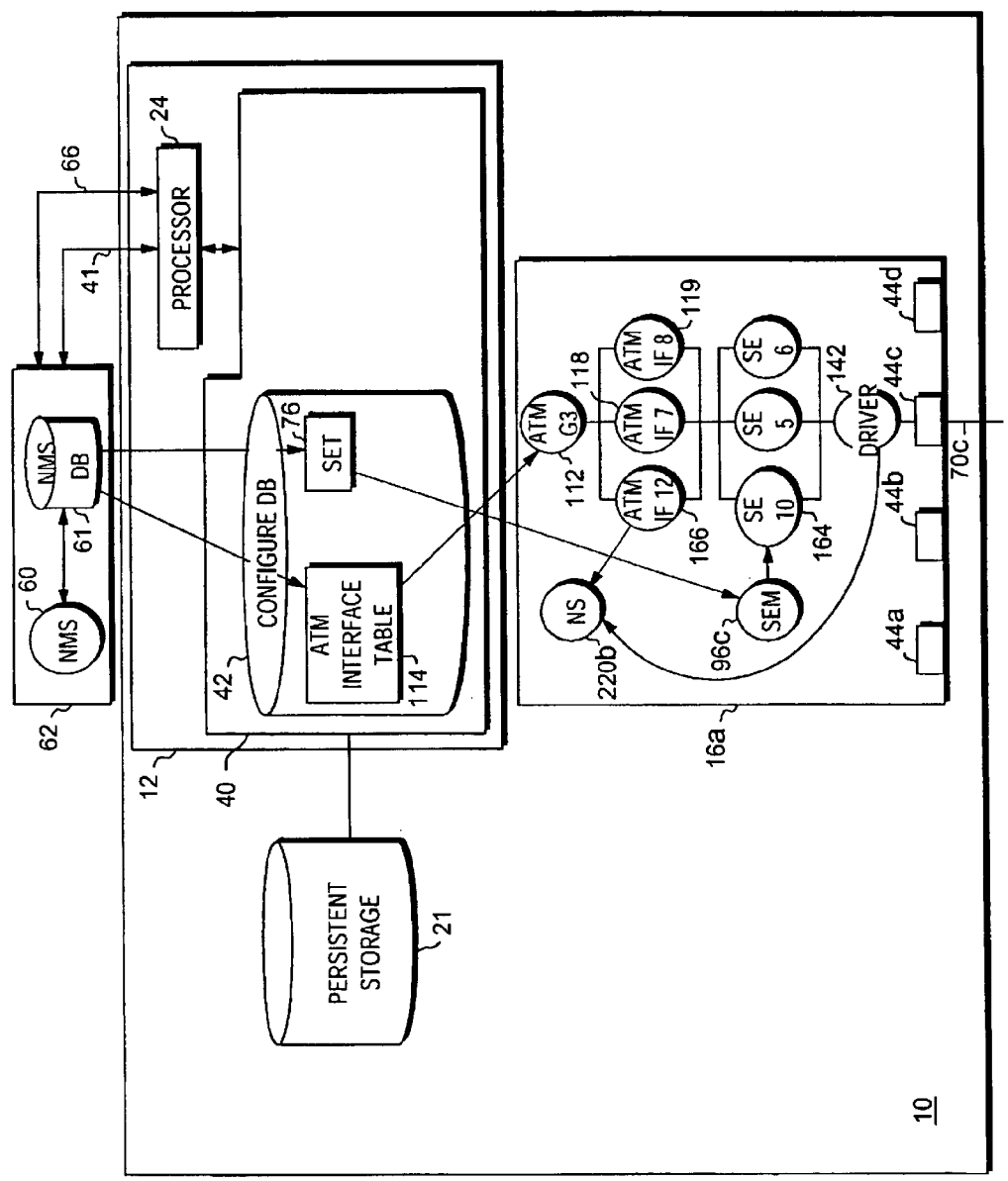
FIGS. 17–19 are block and flow diagrams of a computer system incorporating a modular system architecture and illustrating methods for making configuration changes.

Referring to FIG. 17, in one example of a configuration change, the user notifies the NMS that an additional path will be carried by SONET fiber 70c connected to port 44c. A new service endpoint (SE) 164 and a new ATM interface 166 are needed to handle the new path. The NMS adds a new record (row 168, FIG. 10) to service endpoint table (SET) 76 to include service endpoint 10 corresponding to port physical identification number (PID) 1502 (port 44c). The NMS also adds a new record (row 170, FIG. 13) to ATM instance table 114 to include ATM interface (IF) 12 corresponding to ATM group 3 and SE 10. Configuration database 42 may automatically copy the changes made to SET 76 and ATM instance table 114 to persistent storage 21 such that if the computer system is shut down and rebooted, the changes to the configuration database will be maintained.

Configuration database 42 also notifies (through the active query process) SEM 96c that a new service endpoint (SE 10) was added to the SET corresponding to its port (PID 1502), and configuration database 42 also notifies ATM instantiation 112 that a new ATM interface (ATM-IF 166) was added to the ATM interface table corresponding to ATM group 3. ATM 112 establishes ATM interface 166 and SEM 96c notifies port driver 142 that it has been assigned SE10. A communication link is established through NS 220b. Device driver 142 generates a service endpoint name using the assigned SE number and publishes this name and its process identification number with NS 220b. ATM interface 166 generates the same service endpoint name and subscribes to NS 220b for that service endpoint name. NS 220b provides ATM interface 166 with the process identification assigned to DD 142 allowing ATM interface 166 to communicate with device driver 142.

Certain board changes to computer system 10 are also configuration changes. After power-up and configuration, a user may plug another board into an empty computer system slot or remove an enabled board and replace it with a different board. In the case where applications and drivers for a line card added to computer system 10 are already loaded, the configuration change is similar to initial configuration. The additional line card may be identical to an already enabled line card, for example, line card 16a or if the additional line card requires different drivers (for different components) or different applications (e.g., IP), the different drivers and applications are already loaded because computer system 10 expects such cards to be inserted.

Figure 18:
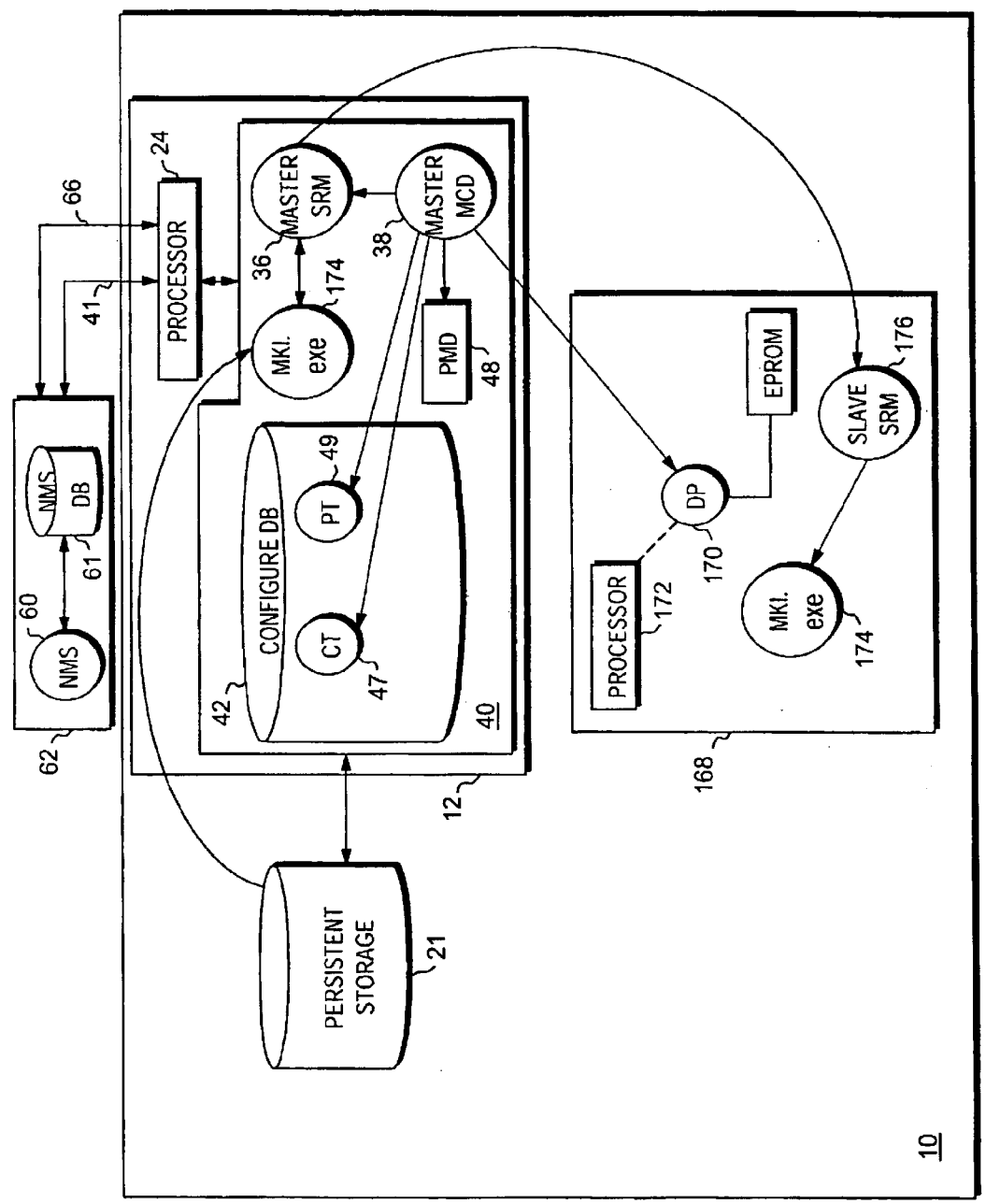

Referring to FIG. 18, while computer system 10 is running, when another line card 168 is inserted, master MCD 38 detects the insertion and communicates with a diagnostic program 170 being executed by the line card's processor 172 to learn the card's type and version number. MCD 38 uses the information it retrieves to update card table 47 and port table 49. MCD 38 then searches physical module description (PMD) file 48 in memory 40 for a record that matches the retrieved card type and version number and retrieves the name of the mission kernel image executable file (MKI.exe) that needs to be loaded on line card 168. Once determined, master MCD 38 passes the name of the MKI executable file to master SRM 36. SRM 36 downloads MKI executable file 174 from persistent storage 21 and passes it to a slave SRM 176 running on line card 168. The slave SRM executes the received MKI executable file.

Figure 19:
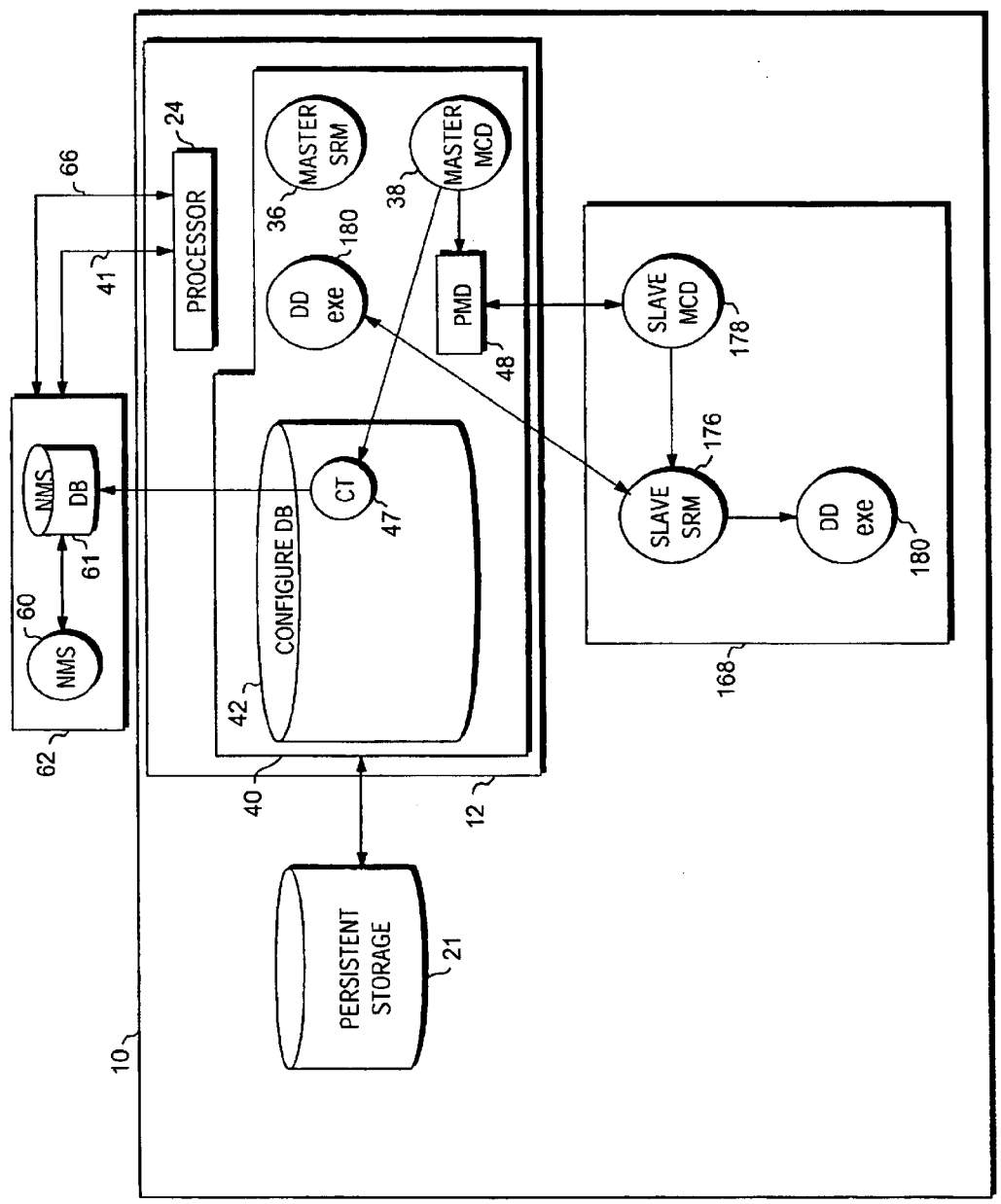

Referring to FIG. 19, slave MCD 178 then searches PMD file 48 in memory 40 on central processor 12 for a match with its line card's type and version number to find the names of all the device driver executable files associated needed by its line card. Slave MCD 178 provides these names to slave SRM 176 which then downloads and executes the device driver executable files (DD.exe) 180 from memory 40.

When master MCD 38 updates card table 47, configuration database 42 updated NMS database 61 which sends NMS 60 a notification of the change including card type and version number, the slot number into which the card was inserted and the physical identification (PID) assigned to the card by the master MCD. The NMS is updated, assigns an LID and updates the logical to physical table and notifies the user of the new hardware. The user then tells the NMS how to configure the new hardware, and the NMS implements the configuration change as described above for initial configuration.

Logical Model Change:

Where applications and device drivers for a new line card are not already loaded and where changes or upgrades to already loaded applications and device drivers are needed, logical model 280 (FIGS. 2–3) must be changed and new view ids and APIs and new DDL files must be re-generated. Software model 286 is changed to include models of the new or upgraded software, and hardware model 284 is changed to include models of any new hardware. New logical model 280' is then used by code generator 336 to re-generate view ids and APIs for each application, including any new applications, for example, ATM version two 360, or device drivers, for example, device driver 362, and to re-generate DDL files 344' and 348' including new SQL commands and data relevant to the new hardware and/or software. Each application, including any new applications or drivers, is then pulled into the build process and links in a corresponding view id and API. The new applications and/or device drivers and the new DDL files as well as any new hardware are then sent to the user of computer system 10.

New and upgraded applications and device drivers being used by way of an example, and it should be understood that other processes, for example, modular system services and new Mission Kernel Images (MKIs), may be changed or upgraded in the same fashion.

Figure 20:
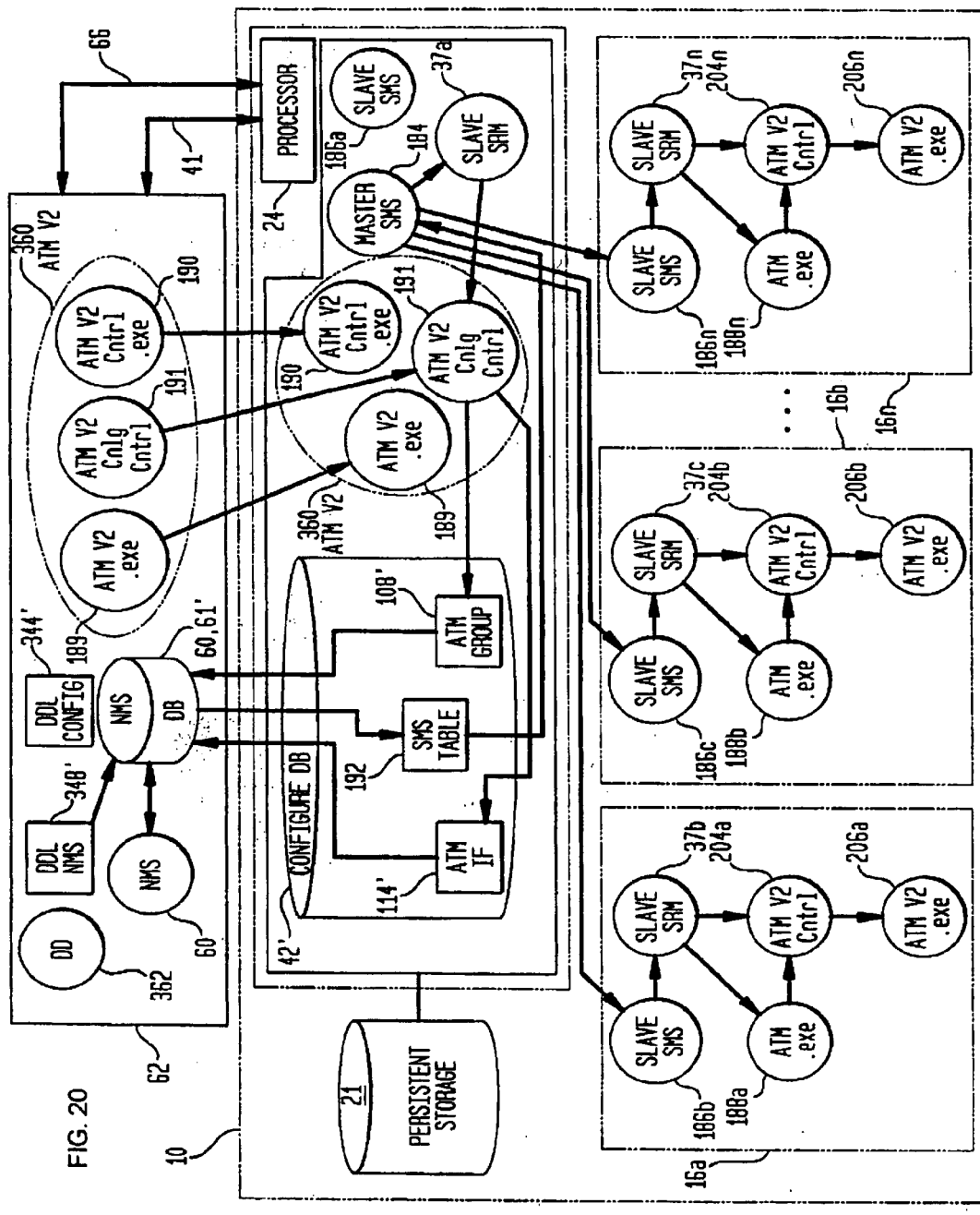
FIG. 20 is a block and flow diagram of a computer system incorporating a modular system architecture and illustrating a method for distributing logical model changes to users.

Referring to FIG. 20, the user instructs the NMS to download the new applications and/or device drivers, for example, ATM version two 360 and device driver 362, as well as the new DDL files, for example, DDL files 344' and 348', into memory on work station 62. The NMS uses new NMS database DDL file 348' to upgrade NMS database 61 into new NMS database 61'. Alternatively, a new NMS database may be created using DDL file 348' and both databases temporarily maintained.

Application Upgrade:

For new applications and application upgrades, the NMS works with a software management system (SMS) service to implement the change while the computer system is running (hot upgrades or additions). The SMS is one of the modular system services, and like the MCD and the SRM, the SMS is a distributed application. Referring to FIG. 20, a master SMS 184 is executed by central processor 12 while slave SMSs 186a–186n are executed on each board.

Upgrading a distributed application that is running on multiple boards is more complicated than upgrading an application running on only one board. As an example of a distributed application upgrade, the user may want to upgrade all ATM applications running on various boards in the system using new ATM version two 360. This is by way of example, and it should be understood, that only one ATM application may be upgraded so long as it is compatible with the other versions of ATM running on other boards. ATM version two 360 may include many sub-processes, for example, an upgraded ATM application executable file (ATMv2.exe 189), an upgraded ATM control executable file (ATMv2_cntrl.exe 190) and an ATM configuration control file (ATMv2_cnfg_cntrl.exe). The NMS downloads ATMv2.exe 189, ATMv2_cntrl.exe and ATMv2_cnfg cntrl.exe to memory 40 on central processor 12.

Figure 21:
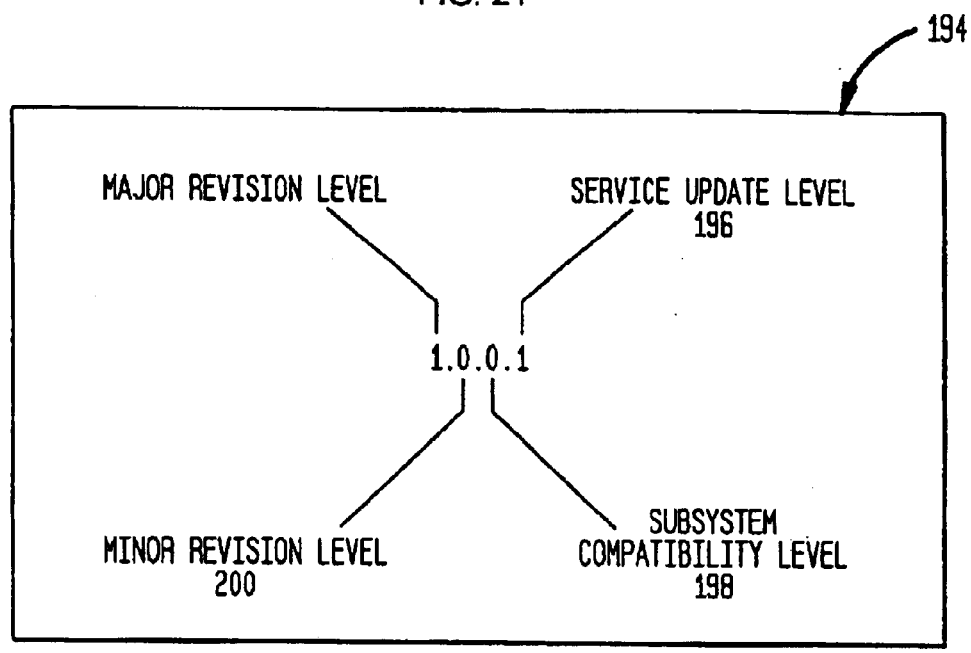
FIG. 21 is a block and flow diagram of a computer system incorporating a modular system architecture and illustrating a method for making a process upgrade.

The NMS then writes a new record into SMS table 192 indicating the scope of the configuration update. The scope of an upgrade may be indicated in a variety of ways. In one embodiment, the SMS table includes a field for the name of the application to be changed and other fields indicating the changes to be made. In another embodiment, the SMS table includes a revision number field 194 (FIG. 21) through which the NMS can indicate the scope of the change. Referring to FIG. 21, the right most position in the revision number may indicate, for example, the simplest configuration update (e.g., a bug fix), in this case, termed a "service update level" 196. Any software revisions that differ by only the service update level can be directly applied without making changes in the configuration database or API changes between the new and current revision. The next position may indicate a slightly more complex update, in this case, termed a "subsystem compatibility level" 198. These changes include changes to the configuration database and/ or an API. The next position may indicate a "minor revision level" 200 update indicating more comprehensive changes in both the configuration database and one or more APIs. The last position may indicate a "major revision level" 202 update indicative of wholesale changes in multiple areas and may require a reboot of the computer system to implement. For a major revision level change, the NMS will download a complete image including a kernel image.

During initial configuration, the SMS establishes an active query on SMS table 192. Consequently, when the NMS changes the SMS table, the configuration database sends a notification to master SMS 184 including the change. In some instances, the change to an application may require changes to configuration database 42. The SMS determines the need for configuration conversion based on the scope of the release or update. If the configuration database needs to be changed, then the software, for example, ATM version two 360, provided by the user and downloaded by the NMS also includes a configuration control executable file, for example, ATMv2_cnfig_cntrl.exe 191, and the name of this file will be in the SMS table record. The master SMS then directs slave SRM 37a on central processor 12 to execute the configuration control file which uses DDL file 344' to upgrade old configuration database 42 into new configuration database 42' by creating new tables, for example, ATM group table 108' and ATM interface table 114'.

Existing processes using their view ids and APIs to access new configuration database 42' in the same manner as they accessed old configuration database 42. However, when new processes (e.g., ATM version two 360 and device driver 362) access new configuration database 42', their view ids and APIs allow them to access new tables and data within new configuration database 42'.

The master SMS also reads ATM group table 108' to determine that instances of ATM are being executed on line cards 16a–16n. In order to upgrade a distributed application, in this instance, ATM, the Master SMS will use a lock step procedure. Master SMS 184 tells each slave SMS 186b–186n to stall the current versions of ATM. When each slave responds, Master SMS 184 then tells slave SMSs 186b–186n to download and execute ATMv2_cntrl.exe 190 from memory 40. Upon instructions from the slave SMSs, slave SRMs 37b–37n download and execute copies of ATMv2_cntrl.exe 204a–204n. The slave SMSs also pass data to the ATMv2cntrl.exe file through the SRM. The data instructs the control shim to start in upgrade mode and passes required configuration information. The upgraded ATMv2 controllers 204a–204n then use ATM group table 108' and ATM interface table 114' as described above to implement ATMv2 206a–206n on each of the line cards. In this example, each ATM controller is shown implementing one instance of ATM on each line card, but as explained below, the ATM controller may implement multiple instances of ATM on each line card.

As part of the upgrade mode, the updated versions of ATMv2 206a–206n retrieve active state from the current versions of ATM 188a–188n. The retrieval of active state can be accomplished in the same manner that a redundant or backup instantiation of ATM retrieves active state from the primary instantiation of ATM. When the upgraded instances of ATMv2 are executing and updated with active state, the ATMv2 controllers notify the slave SMSs 186b–186n on their board and each slave SMS 186b–186n notifies master SMS 184. When all boards have notified the master SMS, the master SMS tells the slave SMSs to switchover to ATMv2 206a–206n. The slave SMSs tell the slave SRMs running on their board, and the slave SRMs transition the new ATMv2 processes to the primary role. This is termed "lock step upgrade" because each of the line cards is switched over to the new ATMv2 processes simultaneously.

There may be upgrades that require changes to multiple applications and to the APIs for those applications. For example, a new feature may be added to ATM that also requires additional functionality to be added to the Multi-Protocol Label Switching (MPLS) application. The additionally functionality may change the peer-to-peer API for ATM, the peer-to-peer API for MPLS and the API between ATM and MPLS. In this scenario, the upgrade operation must avoid allowing the "new" version of ATM to communicate with itself or the "old" version of MPLS and vice versa. The master SMS will use the release number scheme to determine the requirements for the individual upgrade. For example, the upgrade may be from release 1.0.0.0 to 1.0.1.3 where the release differs by the subsystem compatibility level. The SMS implements the upgrade in a lock step fashion. All instances of ATM and MPLS are upgraded first. The slave SMS on each line card then directs the slave SRM on its board to terminate all "old" instances of ATM and MPLS and switchover to the new instances of MPLS and ATM. The simultaneous switchover to new versions of both MPLS and ATM eliminate any API compatibility errors.

Figure 22:
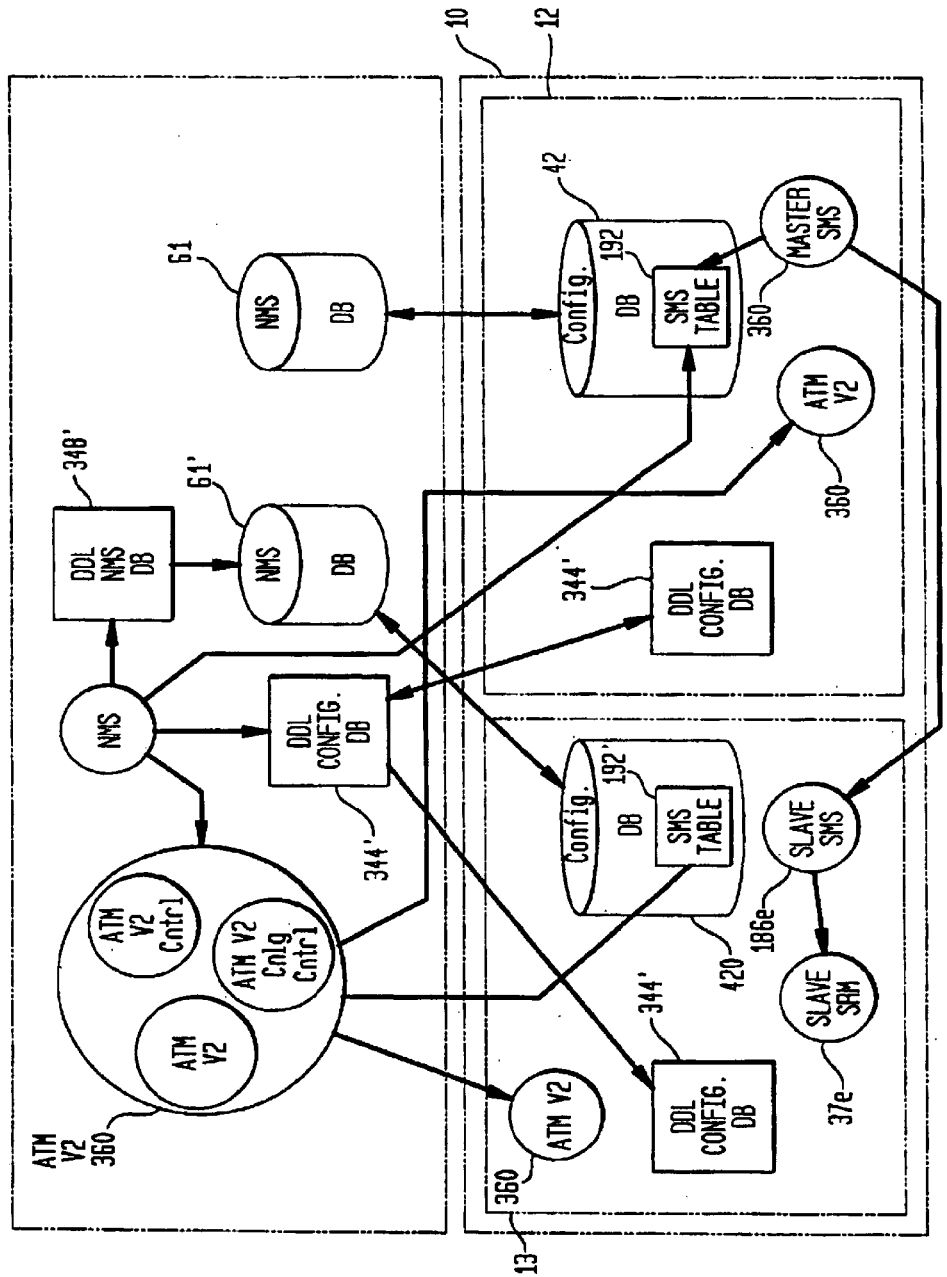
FIG. 22 is a block diagram representing a revision numbering scheme.

Referring to FIG. 22, instead of directly upgrading configuration database 42 on central processor 12, a backup configuration database 420 on a backup central processor 13 may be upgraded first. As described above, computer system 10 includes central processor 12. Computer system 10 may also include a redundant or backup central processor 13 that mirrors or replicates the active state of central processor 12. Backup central processor 13 is generally in stand-by mode unless central processor 12 fails at which point a fail-over to backup central processor 13 is initiated to allow the backup central processor to be substituted for central processor 12. In addition to failures, backup central processor 13 may be used for software and hardware upgrades that require changes to the configuration database. Through backup central processor 13, upgrades can be made to backup configuration database 420 instead of to configuration database 42.

The upgrade is begun as discussed above with the NMS downloading ATM version two 360—including ATMv2.exe 189, ATMv2_cntrl.exe and ATMv2_cnfg_cntrl.exe—and DDL file 344' to memory on central processor 12. Simultaneously, because central processor 13 is in backup mode, the application and DDL file are also copied to memory on central processor 13. The NMS also creates a software load record in SMS table 192, 192' indicating the upgrade. In this embodiment, when the SMS determines that the scope of the upgrade requires an upgrade to the configuration database, the master SMS instructs slave SMS 186e on central processor 13 to perform the upgrade. Slave SMS 186e works with slave SRM 37e to cause backup processor 13 to change from backup mode to upgrade mode.

In upgrade mode, backup processor 13 stops replicating the active state of central processor 12. Any changes made to new configuration database 420 are copied to new NMS database 61'. Slave SMS 186e then directs slave SRM 37e to execute the configuration control file which uses DDL file 344' to upgrade configuration database 420.

Once configuration database 420 is upgraded, a fail-over or switch-over from central processor 12 to backup central processor 13 is initiated. Central processor 13 then begins acting as the primary central processor and applications running on central processor 13 and other boards throughout computer system 10 begin using upgraded configuration database 420.

Central processor 12 may not become the backup central processor right away. Instead, central processor 12 with its older copy of configuration database 42 stays dormant in case an automatic downgrade is necessary (described below). If the upgrade goes smoothly and is committed (described below), then central processor 12 will begin operating in backup mode and replace old configuration database 42 with new configuration database 420.

Figure 23:
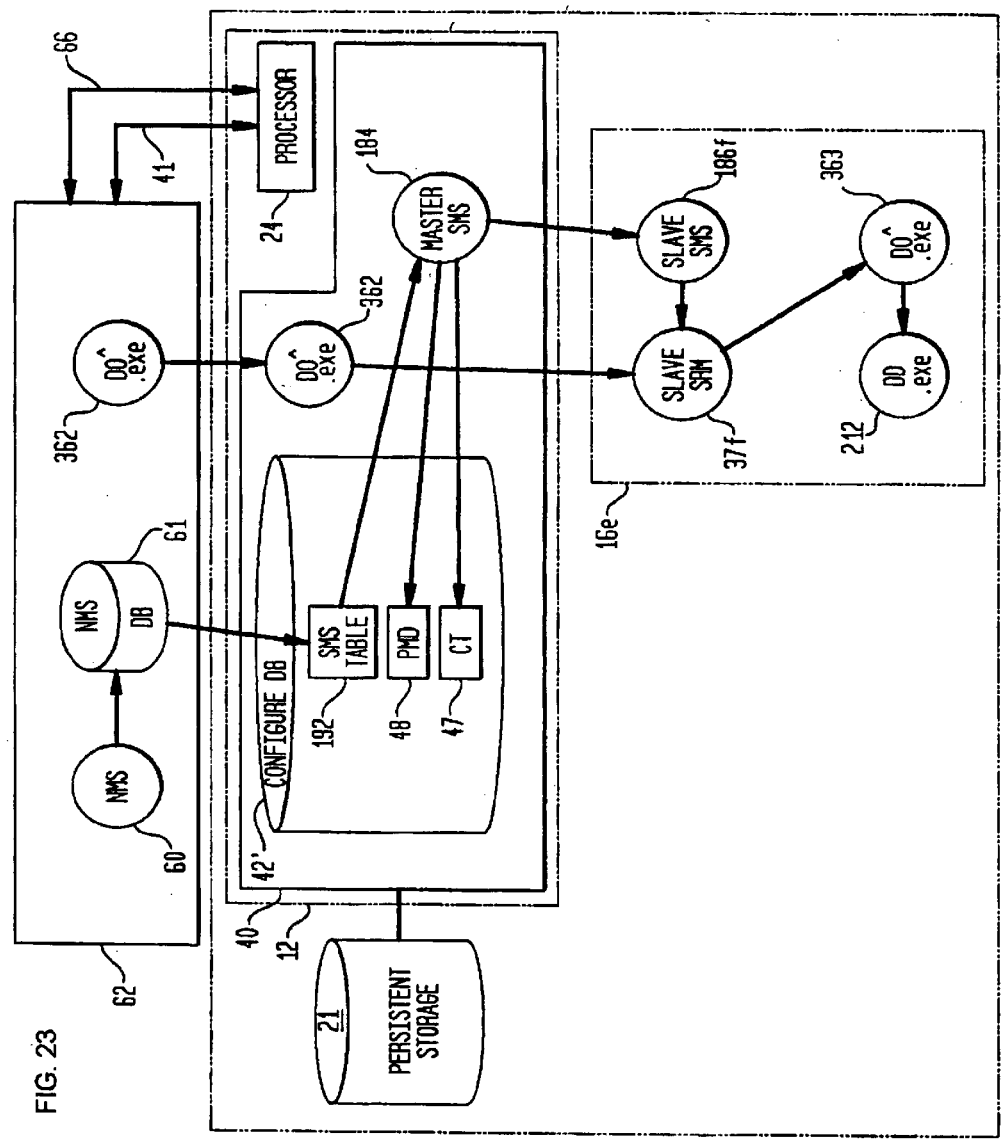
FIG. 23 is a block and flow diagram of a computer system incorporating a modular system architecture and illustrating a method for making a device driver upgrade.

Device Driver Upgrade:

Device driver software may also be upgraded and the implementation of device driver upgrades is similar to the implementation of application upgrades. The user informs the NMS of the device driver change and provides a copy of the new software (e.g., DD^.exe 362, FIGS. 20 and 23). The NMS downloads the new device driver to memory 40 on central processor 12, and the NMS writes a new record in SMS table 192 indicating the device driver upgrade. Configuration database 42 sends a notification to master SMS 184 including the name of the driver to be upgraded. To determine where the original device driver is currently running in computer system 10, the master SMS searches PMD file 48 for a match of the device driver name (existing device driver, not upgraded device driver) to learn with which module type and version number the device driver is associated. The device driver may be running on one or more boards in computer system 10. As described above, the PMD file corresponds the module type and version number of a board with the mission kernel image for that board as well as the device drivers for that board. The SMS then searches card table 47 for a match with the module type and version number found in the PMD file. Card table 47 includes records corresponding module type and version number with the physical identification (PID) and slot number of that board. The master SMS now knows the board or boards within computer system 10 on which to load the upgraded device driver. If the device driver is for a particular port, then the SMS must also search the port table to learn the PID for that port.

The master SMS notifies each slave SMS running on boards to be upgraded of the name of the device driver executable file to download and execute. In the example, master SMS 184 sends slave SMS 186f the name of the upgraded device driver (DD^.exe 362) to download. Slave SMS 186f tells slave SRM to download and execute DD^.exe 362 in upgrade mode. Once downloaded, DD^.exe 363 (copy of DD^.exe 362) gathers active state information from the currently running DD.exe 212 in a similar fashion as a redundant or backup device driver would gather active state. DD^.exe 362 then notifies slave SRM 37f that active state has been gathered, and slave SRM 37f stops the current DD.exe 212 process and transitions the upgraded DD^.exe 362 process to the primary role.

Automatic Downgrade:

Often, implementation of an upgrade, can cause unexpected errors in the upgraded software, in other applications or in hardware. As described above, a new configuration database 42' (FIG. 20) is generated and changes to the new configuration database are made in new tables (e.g., ATM interface table 114' and ATM group table 108', FIG. 20) and new executable files (e.g., ATMv2.exe 189, ATMv2_cntrl.exe 190 and ATMv2_cnfg_cntrl.exe 191) are downloaded to memory 40. Importantly, the old configuration database records and the original application files are not deleted or altered. In the embodiment where changes are made directly to configuration database 42 on central processor 12, they are made only in non-persistent memory until committed (described below). In the embodiment where changes are made to backup configuration database 420 on backup central processor 13, original configuration database 42 remains unchanged.

Because the operating system provides a protected memory model that assigns different process blocks to different processes, including upgraded applications, the original applications will not share memory space with the upgraded applications and, therefore, cannot corrupt or change the memory used by the original application. Similarly, memory 40 is capable of simultaneously maintaining the original and upgraded versions of the configuration database records and executable files as well as the original and upgraded versions of the applications (e.g., ATM 188a–188n). As a result, the SMS is capable of an automatic downgrade on the detection of an error. To allow for automatic downgrade, the SRMs pass error information to the SMS. The SMS may cause the system to revert to the old configuration and application (i.e., automatic downgrade) on any error or only for particular errors.

As mentioned, often upgrades to one application may cause unexpected faults or errors in other software. If the problem causes a system shut down and the configuration upgrade was stored in persistent storage, then the system, when powered back up, will experience the error again and shut down again. Since, the upgrade changes to the configuration database are not copied to persistent storage 21 until the upgrade is committed, if the computer system is shut down, when it is powered back up, it will use the original version of the configuration database and the original executable files, that is, the computer system will experience an automatic downgrade.

Additionally, a fault induced by an upgrade may cause the system to hang, that is, the computer system will not shut down but will also become inaccessible by the NMS and inoperable. To address this concern, in one embodiment, the NMS and the master SMS periodically send messages to each other indicating they are executing appropriately. If the SMS does not receive one of these messages in a predetermined period of time, then the SMS knows the system has hung. The master SMS may then tell the slave SMSs to revert to the old configuration (i.e., previously executing copies of ATM 188a–188n) and if that does not work, the master SMS may re-start/re-boot computer system 10. Again, because the configuration changes were not saved in persistent storage, when the computer system powers back up, the old configuration will be the one implemented.

Evaluation Mode:

Instead of implementing a change to a distributed application across the entire computer system, an evaluation mode allows the SMS to implement the change in only a portion of the computer system. If the evaluation mode is successful, then the SMS may fully implement the change system wide. If the evaluation mode is unsuccessful, then service interruption is limited to only that portion of the computer system on which the upgrade was deployed. In the above example, instead of executing the upgraded ATMv2 189 on each of the line cards, the ATMv2 configuration convert file 191 will create an ATMv2 group table 108' indicating an upgrade only to one line card, for example, line card 16a. Moreover, if multiple instantiations of ATM are running on line card 16a (e.g., one instantiation per port), the ATMv2 configuration convert file may indicate through ATMv2 interface table 114' that the upgrade is for only one instantiation (e.g., one port) on line card 16a. Consequently, a failure is likely to only disrupt service on that one port, and again, the SMS can further minimize the disruption by automatically downgrading the configuration of that port on the detection of an error. If no error is detected during the evaluation mode, then the upgrade can be implemented over the entire computer system.

Upgrade Commitment:

Upgrades are made permanent by saving the new application software and new configuration database and DDL file in persistent storage and removing the old configuration data from memory 40 as well as persistent storage. As mentioned above, changes may be automatically saved in persistent storage as they are made in non-persistent memory (no automatic downgrade), or the user may choose to automatically commit an upgrade after a successful time interval lapses (evaluation mode). The time interval from upgrade to commitment may be significant. During this time, configuration changes may be made to the system. Since these changes are typically made in non-persistent memory, they will be lost if the system is rebooted prior to upgrade commitment. Instead, to maintain the changes, the user may request that certain configuration changes made prior to upgrade commitment be copied into the old configuration database in persistent memory. Alternatively, the user may choose to manually commit the upgrade at his or her leisure. In the manual mode, the user would ask the NMS to commit the upgrade and the NMS would inform the master SMS, for example, through a record in the SMS table.

Independent Process Failure and Restart:

Depending upon the fault policy managed by the slave SRMs on each board, the failure of an application or device driver may not immediately cause an automatic downgrade during an upgrade process. Similarly, the failure of an application or device driver during normal operation may not immediately cause the fail over to a backup or redundant board. Instead, the slave SRM running on the board may simply restart the failing process. After multiple failures by the same process, the fault policy may cause the SRM to take more aggressive measures such as automatic downgrade or fail-over.

Figure 24:
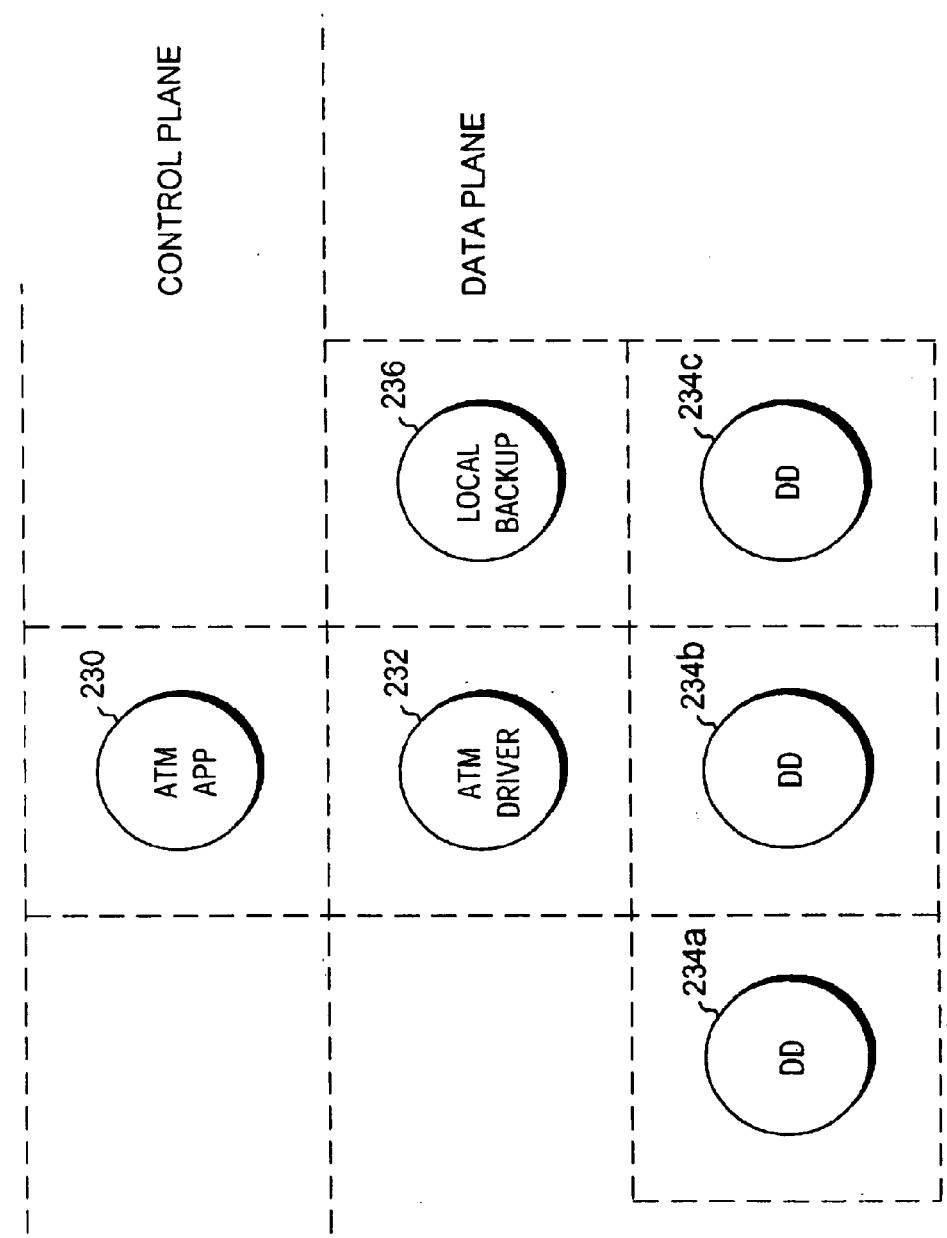
FIG. 24 is a block diagram representing processes within separate protected memory blocks.

Referring to FIG. 24, if an application, for example, ATM application 230 fails, the slave SRM on the same board as ATM 230 may simply restart it without having to reboot the entire system. As described above, under the protected memory model, a failing process cannot corrupt the memory blocks used by other processes. Typically, an application and its corresponding device drivers would be part of the same memory block or even part of the same software program, such that if the application failed, both the application and device drivers would need to be restarted. Under the modular software architecture, however, applications, for example ATM application 230, are independent of the device drivers, for example, ATM driver 232 and Device Drivers (DD) 234a–234c. This separation of the data plane (device drivers) and control plane (applications) results in the device drivers being peers of the applications. Hence, while the ATM application is terminated and restarted, the device drivers continue to function.

For network devices, this separation of the control plane and data plane means that the connections previously established by the ATM application are not lost when ATM fails and hardware controlled by the device drivers continue to pass data through connections previously established by the ATM application. Until the ATM application is restarted and re-synchronized (e.g., through an audit process, described below) with the active state of the device drivers, no new network connections may be established but the device drivers continue to pass data through the previously established connections to allow the network device to minimize disruption and maintain high availability.

Local Backup:

If a device driver, for example, device driver 234, fails instead of an application, for example, ATM 230, then data cannot be passed. For a network device, it is critical to continue to pass data and not lose network connections. Hence, the failed device driver must be brought back up (i.e., recovered) as soon as possible. In addition, the failing device driver may have corrupted the hardware it controls, therefore, that hardware must be reset and reinitialized. The hardware may be reset as soon as the device driver termi-nates or the hardware may be reset later when the device driver is restarted. Resetting the hardware stops data flow. In some instances, therefore, resetting the hardware will be delayed until the device driver is restarted to minimize the time period during which data is not flowing. Alternatively, the failing device driver may have corrupted the hardware, thus, resetting the hardware as soon as the device driver is terminated may be important to prevent data corruption. In either case, the device driver re-initializes the hardware during its recovery.

Again, because applications and device drivers are assigned independent memory blocks, a failed device driver can be restarted without having to restart associated applications and device drivers. Independent recovery may save significant time as described above for applications. In addition, restoring the data plane (i.e., device drivers) can be simpler and faster than restoring the control plane (i.e., applications). While it may be just as challenging in terms of raw data size, device driver recovery may simply require that critical state data be copied into place in a few large blocks, as opposed to application recovery which requires the successive application of individual configuration elements and considerable parsing, checking and analyzing. In addition, the application may require data stored in the configuration database on the central processor or data stored in the memory of other boards. The configuration database may be slow to access especially since many other applications also access this database. The application may also need time to access a management information base (MIB) interface.

To increase the speed with which a device driver is brought back up, the restarted device driver program accesses local backup 236. In one example, local backup is a simple storage/retrieval process that maintains the data in simple lists in physical memory (e.g., random access memory, RAM) for quick access. Alternatively, local backup may be a database process, for example, a Polyhedra database, similar to the configuration database.

Local backup 236 stores the last snap shot of critical state information used by the original device driver before it failed. The data in local backup 236 is in the format required by the device driver. In the case of a network device, local back up data may include path information, for example, service endpoint, path width and path location. Local back up data may also include virtual interface information, for example, which virtual interfaces were configured on which paths and virtual circuit (VC) information, for example, whether each VC is switched or passed through segmentation and reassembly (SAR), whether each VC is a virtual channel or virtual path and whether each VC is multicast or merge. The data may also include traffic parameters for each VC, for example, service class, bandwidth and/or delay requirements.

Using the data in the local backup allows the device driver to quickly recover. An Audit process resynchronizes the restarted device driver with associated applications and other device drivers such that the data plane can again transfer network data. Having the backup be local reduces recovery time. Alternatively, the backup could be stored remotely on another board but the recovery time would be increased by the amount of time required to download the information from the remote location.

Audit Process:

It is virtually impossible to ensure that a failed process is synchronized with other processes when it restarts, even when backup data is available. For example, an ATM application may have set up or torn down a connection with a device driver but the device driver failed before it updated corresponding backup data. When the device driver is restarted, it will have a different list of established connections than the corresponding ATM application (i.e., out of synchronization). The audit process allows processes like device drivers and ATM applications to compare information, for example, connection tables, and resolve differences. For instance, connections included in the driver's connection table and not in the ATM connection table were likely torn down by ATM prior to the device driver crash and are, therefore, deleted from the device driver connection table. Connections that exist in the ATM connection table and not in the device driver connection table were likely set up prior to the device driver failure and may be copied into the device driver connection table or deleted from the ATM connection table and re-set up later. If an ATM application fails and is restarted, it must execute an audit procedure with its corresponding device driver or drivers as well as with other ATM applications since this is a distributed application.

Vertical Fault Isolation:

Typically, a single instance of an application executes on a single card or in a system. Fault isolation, therefore, occurs at the card level or the system level, and if a fault occurs, an entire card—and all the ports on that card—or the entire system—and all the ports in the system—is affected. In a large communications platform, thousands of customers may experience service outages due to a single process failure.

For resiliency and fault isolation one or more instances of an application and/or device driver may be started per port on each line card. Multiple instances of applications and device drivers are more difficult to manage and require more processor cycles than a single instance of each but if an application or device driver fails, only the port those processes are associated with is affected. Other applications and associated ports—as well as the customers serviced by those ports—will not experience service outages. Similarly, a hardware failure associated with only one port will only affect the processes associated with that port. This is referred to as vertical fault isolation.

Figure 25:
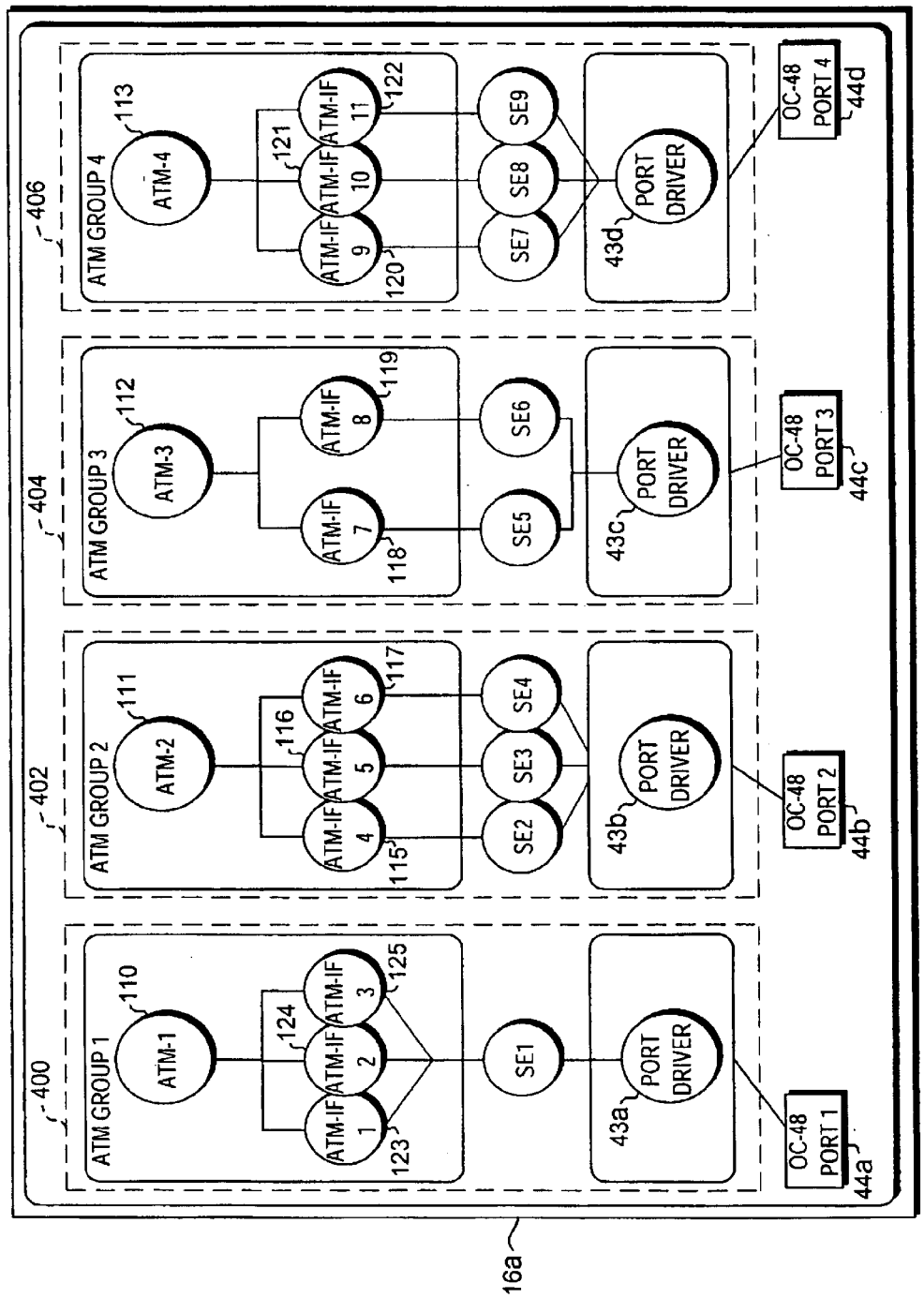
FIG. 25 is a block and flow diagram of a line card and a method for accomplishing vertical fault isolation.

Referring to FIG. 25, as one example, line card 16a is shown to include four vertical stacks 400, 402, 404, and 406. Vertical stack 400 includes one instance of ATM 110 and one device driver 43a and is associated with port 44a. Similarly, vertical stacks 402, 404 and 406 include one instance of ATM 111, 112, 113 and one device driver 43b, 43c, 43d, respectively and each vertical stack is associated with a separate port 44b, 44c, 44d, respectively. If ATM 112 fails, then only vertical stack 404 and its associated port 44c are affected. Service is not disrupted on the other ports (ports 44a, 44b, 44d) since vertical stacks 400, 402, and 406 are unaffected and the applications and drivers within those stacks continue to execute and transmit data. Similarly, if device driver 43b fails, then only vertical stack 402 and its associated port 44b are affected.

Vertical fault isolation allows processes to be deployed in a fashion supportive of the underlying hardware architecture and allows processes associated with particular hardware (e.g., a port) to be isolated from processes associated with other hardware (e.g., other ports) on the same or a different line card. Any single hardware or software failure will affect only those customers serviced by the same vertical stack. Vertical fault isolation provides a fine grain of fault isolation and containment. In addition, recovery time is reduced to only the time required to re-start a particular application or driver instead of the time required to re-start all the processes associated with a line card or the entire system.

Fault/Event Detection:

Traditionally, fault detection and monitoring does not receive a great deal of attention from network equipment designers. Hardware components are subjected to a suite of diagnostic tests when the system powers up. After that, the only way to detect a hardware failure is to watch for a red light on a board or wait for a software component to fail when it attempts to use the faulty hardware. Software monitoring is also reactive. When a program fails, the operating system usually detects the failure and records minimal debug information.

Current methods provide only sporadic coverage for a narrow set of hard faults. Many subtler failures and events often go undetected. For example, hardware components sometimes suffer a minor deterioration in functionality, and changing network conditions stress the software in ways that were never expected by the designers. At times, the software may be equipped with the appropriate instrumentation to detect these problems before they become hard failures, but even then, network operators are responsible for manually detecting and repairing the conditions.

Systems with high availability goals must adopt a more proactive approach to fault and event monitoring. In order to provide comprehensive fault and event detection, different hierarchical levels of fault/event management software are provided that intelligently monitor hardware and software and proactively take action in accordance with a defined fault policy. A fault policy based on hierarchical scopes ensures that for each particular type of failure the most appropriate action is taken. This is important because over-reacting to a failure, for example, re-booting an entire computer system or re-starting an entire line card, may severely and unnecessarily impact service to customers not affected by the failure, and under-reacting to failures, for example, restarting only one process, may not completely resolve the fault and lead to additional, larger failures. Monitoring and proactively responding to events may also allow the computer system and network operators to address issues before they become failures. For example, additional memory may be assigned to programs or added to the computer system before a lack of memory causes a failure.

Figure 26:
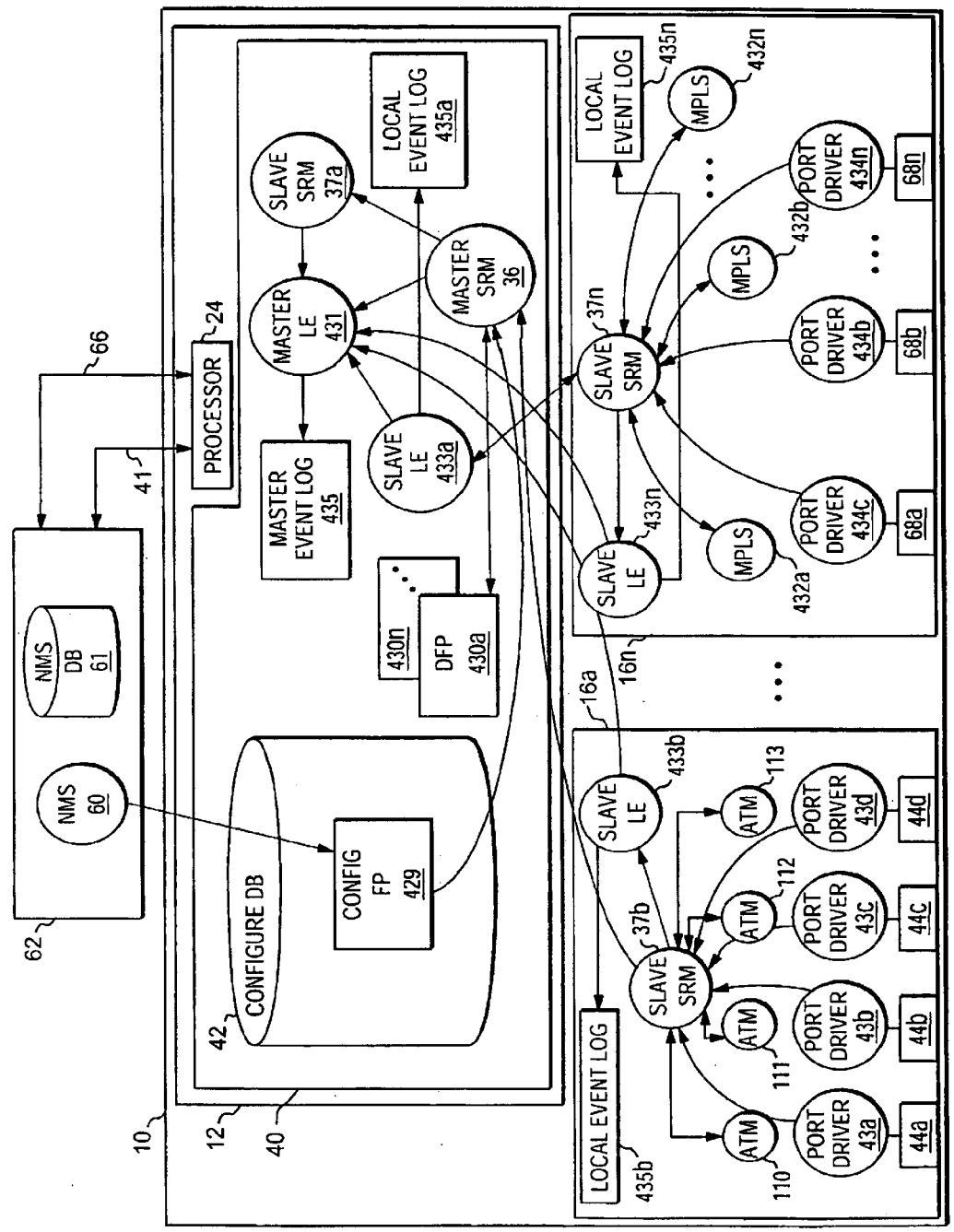
FIG. 26 is a block and flow diagram of a computer system incorporating a hierarchical and configurable fault management system and illustrating a method for accomplishing fault escalation.

Hierarchical Scopes and Escalation:

Referring to FIG. 26, in one embodiment, master SRM 36 serves as the top hierarchical level fault/event manager, each slave SRM 37a–37n serves as the next hierarchical level fault/event manager, and software applications resident on each board, for example, ATM 110–113 and device drivers 43a–43d on line card 16a include sub-processes that serve as the lowest hierarchical level fault/event managers (i.e., local resiliency managers, LRM). Master SRM 36 downloads default fault policy (DFP) files (metadata) 430a–430n from persistent storage to memory 40. Master SRM 36 reads a master default fault policy file (e.g., DFP 430a) to understand its fault policy, and each slave SRM 37a–37n downloads a default fault policy file (e.g., DFP 430b–430n) corresponding to the board on which the slave SRM is running. Each slave SRM then passes to each LRM a fault policy specific to each local process.

A master logging entity 431 also runs on central processor 12 and slave logging entities 433a–433n run on each board. Notifications of failures and other events are sent by the master SRM, slave SRMs and LRMs to their local logging entity which then notifies the master logging entity. The master logging entity enters the event in a master event log file 435. Each local logging entity may also log local events in a local event log file 435a–435n.

In addition, a fault policy table 429 may be created in configuration database 42 by the NMS when the user wishes to over-ride some or all of the default fault policy (see configurable fault policy below), and the master and slave SRMs are notified of the fault policies through the active query process.

Figure 27:
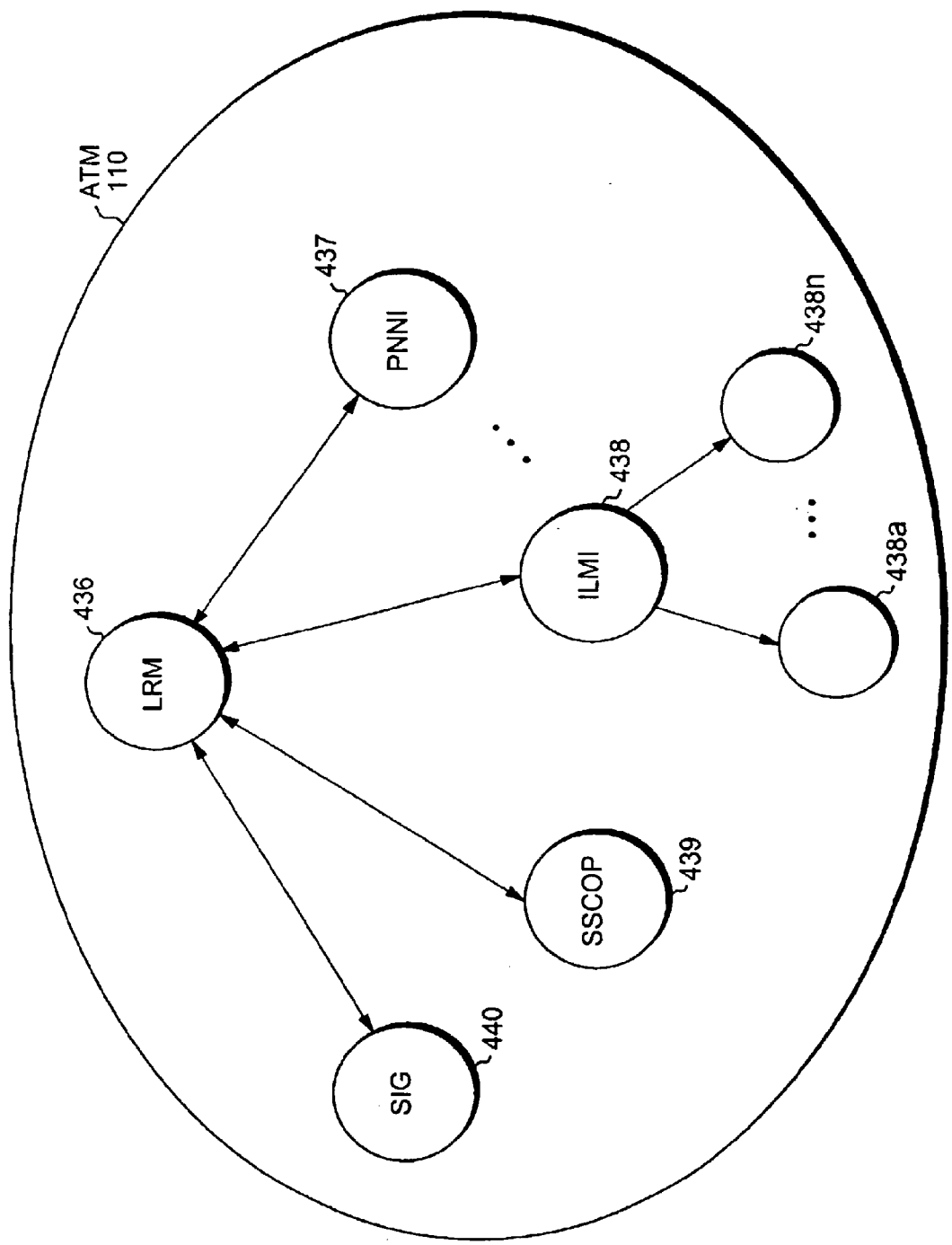
FIG. 27 is a block diagram of an application having multiple sub-processes.

Referring to FIG. 27, as one example, ATM application 110 includes many sub-processes including, for example, an LRM program 436, a Private Network-to-Network Interface (PNNI) program 437, an Interim Link Management Interface (ILMI) program 438, a Service Specific Connection Oriented Protocol (SSCOP) program 439, and an ATM signaling (SIG) program 440. ATM application 110 may include many other sub-programs only a few have been shown for convenience. Each sub-process may also include sub-processes, for example, ILMI sub-processes 438a–438n. In general, the upper level application (e.g., ATM 110) is assigned a process memory block that is shared by all its sub-processes.

If, for example, SSCOP 439 detects a fault, it notifies LRM 436. LRM 436 passes the fault to local slave SRM 37b, which catalogs the fault in the ATM application's fault history and sends a notice to local slave logging entity 433b. The slave logging entity sends a notice to master logging entity 431, which may log the event in master log event file 435. The local logging entity may also log the failure in local event log 435a. LRM 436 also determines, based on the type of failure, whether it can fully resolve the error and do so without affecting other processes outside its scope, for example, ATM 111–113, device drivers 43a–43d and their sub-processes and processes running on other boards. If yes, then the LRM takes corrective action in accordance with its fault policy. Corrective action may include restarting SSCOP 439 or resetting it to a known state.

Since all sub-processes within an application, including the LRM sub-process, share the same memory space, it may be insufficient to restart or reset a failing sub-process (e.g., SSCOP 439). Hence, for most failures, the fault policy will cause the LRM to escalate the failure to the local slave SRM. In addition, many failures will not be presented to the LRM but will, instead, be presented directly to the local slave SRM. These failures are likely to have been detected by either processor exceptions, OS errors or low-level system service errors. Instead of failures, however, the sub-processes may notify the LRM of events that may require action. For example, the LRM may be notified that the PNNI message queue is growing quickly. The LRM's fault policy may direct it to request more memory from the operating system. The LRM will also pass the event to the local slave SRM as a non-fatal fault. The local slave SRM will catalog the event and log it with the local logging entity, which may also log it with the master logging entity. The local slave SRM may take more severe action to recover from an excessive number of these non-fatal faults that result in memory requests.

If the event or fault (or the actions required to handle either) will affect processes outside the LRM's scope, then the LRM notifies slave SRM 37b of the event or failure. In addition, if the LRM detects and logs the same failure or event multiple times and in excess of a predetermined threshold set within the fault policy, the LRM may escalate the failure or event to the next hierarchical scope by notifying slave SRM 37b. Alternatively or in addition, the slave SRM may use the fault history for the application instance to determine when a threshold is exceeded and automatically execute its fault policy. When slave SRM 37b detects or is notified of a failure or event, it notifies slave logging entity 435b. The slave logging entity notifies master logging entity 431, which may log the failure or event in master event log 435, and the slave logging entity may also log the failure or event in local event log 435b. Slave SRM 37b also determines, based on the type of failure or event, whether it can handle the error without affecting other processes outside its scope, for example, processes running on other boards. If yes, then slave SRM 37b takes corrective action in accordance with its fault policy and logs the fault. Corrective action may include re-starting one or more applications on line card 16a.

If the fault or recovery actions will affect processes outside the slave SRM's scope, then the slave SRM notifies master SRM 36. In addition, if the slave SRM has detected and logged the same failure multiple times and in excess of a predetermined threshold, then the slave SRM may escalate the failure to the next hierarchical scope by notifying master SRM 36 of the failure. Alternatively, the master SRM may use its fault history for a particular line card to determine when a threshold is exceeded and automatically execute its fault policy.

When master SRM 36 detects or receives notice of a failure or event, it notifies slave logging entity 433a, which notifies master logging entity 431. The master logging entity 431 may log the failure or event in master log file 435 and the slave logging entity may log the failure or event in local event log 435a. Master SRM 36 also determines the appropriate corrective action based on the type of failure or event and its fault policy. Corrective action may require failing-over one or more line cards 16a–16n or other boards, including central processor 12, to redundant backup boards or, where backup boards are not available, simply shutting particular boards down. Some failures may require the master SRM to re-boot the entire computer system.

An example of a common error is a memory access error. As described above, when the slave SRM starts a new instance of an application, it requests a protected memory block from the local operating system. The local operating systems assign each instance of an application one block of local memory and then program the local memory management unit (MMU) hardware with which processes have access (read and/or write) to each block of memory. An MMU detects a memory access error when a process attempts to access a memory block not assigned to that process. This type of error may result when the process generates an invalid memory pointer. The MMU prevents the failing process from corrupting memory blocks used by other processes (i.e., protected memory model) and sends a hardware exception to the local processor. A local operating system fault handler detects the hardware exception and determines which process attempted the invalid memory access. The fault handler then notifies the local slave SRM of the hardware exception and the process that caused it. The slave SRM determines the application instance within which the fault occurred and then goes through the process described above to determine whether to take corrective action, such as restarting the application, or escalate the fault to the master SRM.

As another example, a device driver, for example, device driver 43a may determine that the hardware associated with its port, for example, port 44a, is in a bad state. Since the failure may require the hardware to be swapped out or failed-over to redundant hardware or the device driver itself to be re-started, the device driver notifies slave SRM 37b. The slave SRM then goes through the process described above to determine whether to take corrective action or escalate the fault to the master SRM.

As a third example, if a particular application instance repeatedly experiences the same software error but other similar application instances running on different ports do not experience the same error, the slave SRM may determine that it is likely a hardware error. The slave SRM would then notify the master SRM which may initiate a fail-over to a backup board or, if no backup board exists, simply shut down that board or only the failing port on that board. Similarly, if the master SRM receives failure reports from multiple boards indicating Ethernet failures, the master SRM may determine that the Ethernet hardware is the problem and initiate a fail-over to backup Ethernet hardware. Consequently, the failure type and the failure policy determine at what scope recovery action will be taken. The higher the scope of the recovery action, the larger the temporary loss of services. Speed of recovery is one of the primary considerations when establishing a fault policy. Restarting a single software process is much faster than switching over an entire board to a redundant board or re-booting the entire computer system. When a single process is restarted, only a fraction of a card's services are affected. Allowing failures to be handled at appropriate hierarchical levels avoids unnecessary recovery actions while ensuring that sufficient recovery actions are taken, both of which minimize service disruption to customers.

Hierarchical Descriptors:

Hierarchical descriptors may be used to provide information specific to each failure or event. The hierarchical descriptors provide granularity with which to report faults, take action based on fault history and apply fault recovery policies. The descriptors can be stored in master event log file 435 or local event log files 435a–435n through which faults and events may be tracked and displayed to the user and allow for fault detection at a fine granular level and proactive response to events. In addition, the descriptors can be matched with descriptors in the fault policy to determine the recovery action to be taken.

Figure 28:
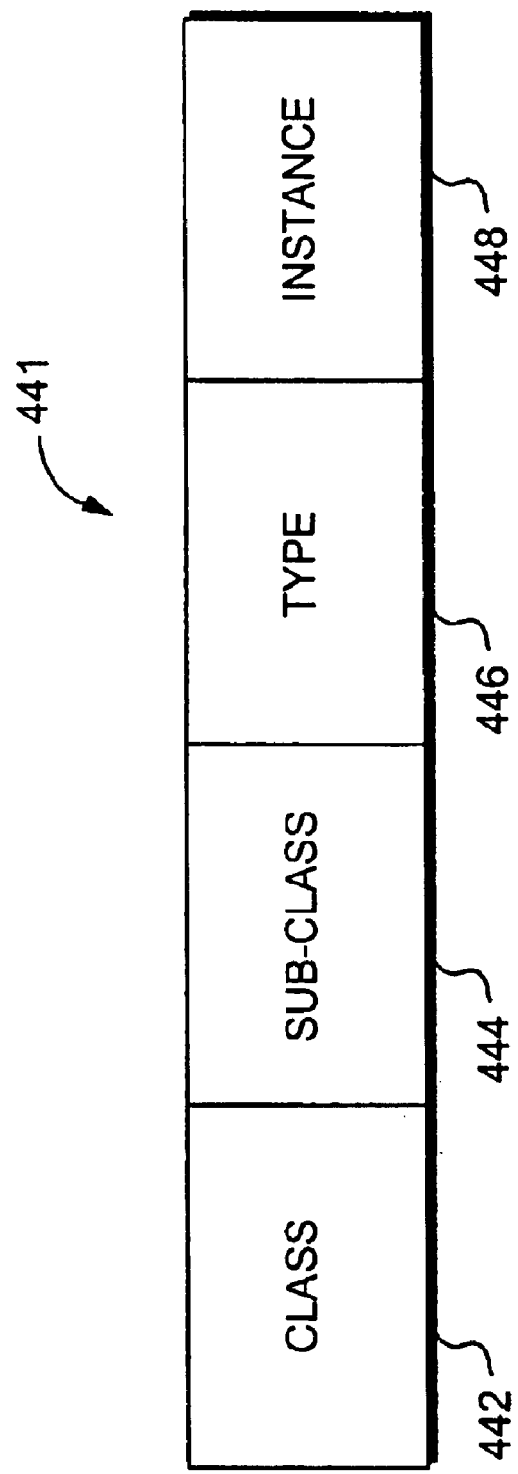
FIG. 28 is a block diagram of a hierarchical fault descriptor.

Referring to FIG. 28, in one embodiment, a descriptor 441 includes a top hierarchical class field 442, a next hierarchical level sub-class field 444, a lower hierarchical level type field 446 and a lowest level instance field 448. The class field indicates whether the failure or event is related (or suspected to relate) to hardware or software. The subclass field categorizes events and failures into particular hardware or software groups. For example, under the hardware class, subclass indications may include whether the fault or event is related to memory, Ethernet, switch fabric or network data transfer hardware. Under the software class, subclass indications may include whether the fault or event is a system fault, an exception or related to a specific application, for example, ATM.

The type field more specifically defines the subclass failure or event. For example, if a hardware class, Ethernet subclass failure has occurred, the type field may indicate a more specific type of Ethernet failure, for instance, a cyclic redundancy check (CRC) error or a runt packet error. Similarly, if a software class, ATM failure or event has occurred, the type field may indicate a more specific type of ATM failure or event, for instance, a private network-to-network interface (PNNI) error or a growing message queue event. The instance field identifies the actual hardware or software that failed or generated the event. For example, with regard to a hardware class, Ethernet subclass, CRC type failure, the instance indicates the actual Ethernet port that experienced the failure. Similarly, with regard to a software class, ATM subclass, PNNI type, the instance indicates the actual PNNI sub-program that experienced the failure or generated the event.

When a fault or event occurs, the hierarchical scope that first detects the failure or event creates a descriptor by filling in the fields described above. In some cases, however, the Instance field is not applicable. The descriptor is sent to the local logging entity, which may log it in the local event log file before notifying the master logging entity, which may log it in the master event log file 435. The descriptor may also be sent to the local slave SRM, which tracks fault history based on the descriptor contents per application instance. If the fault or event is escalated, then the descriptor is passed to the next higher hierarchical scope.

When slave SRM 37b receives the fault/event notification and the descriptor, it compares it to descriptors in the fault policy for the particular scope in which the fault occurred looking for a match or a best case match which will indicate the recovery procedure to follow. Fault descriptors within the fault policy can either be complete descriptors or have wildcards in one or more fields. Since the descriptors are hierarchical from left to right, wildcards in descriptor fields only make sense from right to left. The fewer the fields with wildcards, the more specific the descriptor. For example, a particular fault policy may apply to all software faults and would, therefore, include a fault descriptor having the class field set to "software" and the remaining fields—subclass, type, and instance—set to wildcard or "match all." The slave SRM searches the fault policy for the best match (i.e., the most fields matched) with the descriptor to determine the recovery action to be taken.

Configurable Fault Policy:

In actual use, a computer system is likely to encounter scenarios that differ from those in which the system was designed and tested. Consequently, it is nearly impossible to determine all the ways in which a computer system might fail, and in the face of an unexpected error, the default fault policy that was shipped with the computer system may cause the hierarchical scope (master SRM, slave SRM or LRM) to under-react or over-react. Even for expected errors, after a computer system ships, certain recovery actions in the default fault policy may be determined to be over aggressive or too lenient. Similar issues may arise as new software and hardware is released and/or upgraded.

A configurable fault policy allows the default fault policy to be modified to address behavior specific to a particular upgrade or release or to address behavior that was learned after the implementation was released. In addition, a configurable fault policy allows users to perform manual overrides to suit their specific requirements and to tailor their policies based on the individual failure scenarios that they are experiencing. The modification may cause the hierarchical scope to react more or less aggressively to particular known faults or events, and the modification may add recovery actions to handle newly learned faults or events. The modification may also provide a temporary patch while a software or hardware upgrade is developed to fix a particular error.

If an application runs out of memory space, it notifies the operating system and asks for more memory. For certain applications, this is standard operating procedure. As an example, an ATM application may have set up a large number of virtual circuits and to continue setting up more, additional memory is needed. For other applications, a request for more memory indicates a memory leak error. The fault policy may require that the application be re-started causing some service disruption. It may be that re-starting the application eventually leads to the same error due to a bug in the software. In this instance, while a software upgrade to fix the bug is developed, a temporary patch to the fault policy may be necessary to allow the memory leak to continue and prevent repeated application re-starts that may escalate to line card re-start or fail-over and eventually to a re-boot of the entire computer system. A temporary patch to the default fault policy may simply allow the hierarchical scope, for example, the local resiliency manager or the slave SRM, to assign additional memory to the application. Of course, an eventual re-start of the application is likely to be required if the application's leak consumes too much memory.

A temporary patch may also be needed while a hardware upgrade or fix is developed for a particular hardware fault. For instance, under the default fault policy, when a particular hardware fault occurs, the recovery policy may be to fail-over to a backup board. If the backup board includes the same hardware with the same hardware bug, for example, a particular semiconductor chip, then the same error will occur on the backup board. To prevent a repetitive fail-over while a hardware fix is developed, the temporary patch to the default fault policy may be to restart the device driver associated with the particular hardware instead of failing-over to the backup board.

In addition to the above needs, a configurable fault policy also allows purchasers of computer system 10 (e.g., network service providers) to define their own policies. For example, a network service provider may have a high priority customer on a particular port and may want all errors and events (even minor ones) to be reported to the NMS and displayed to the network manager. Watching all errors and events might give the network manager early notice of growing resource consumption and the need to plan to dedicate additional resources to this customer.

As another example, a user of computer system 10 may want to be notified when any process requests more memory. This may give the user early notice of the need to add more memory to their system or to move some customers to different line cards.

Referring again to FIG. 26, to change the default fault policy as defined by default fault policy (DFP) files 430a–430n, a configuration fault policy file 429 is created by the NMS in the configuration database. An active query notification is sent by the configuration database to the master SRM indicating the changes to the default fault policy. The master SRM notifies any slave SRMs of any changes to the default fault policies specific to the boards on which they are executing, and the slave SRMs notify any LRMs of any changes to the default fault policies specific to their process. Going forward, the default fault policies—as modified by the configuration fault policy—are used to detect, track and respond to events or failures.

Alternatively, active queries may be established with the configuration database for configuration fault policies specific to each board type such that the slave SRMs are notified directly of changes to their default fault policies.

A fault policy (whether default or configured) is specific to a particular scope and descriptor and indicates a particular recovery action to take. As one example, a temporary patch may be required to handle hardware faults specific to a known bug in an integrated circuit chip. The configured fault policy, therefore, may indicate a scope of all line cards, if the component is on all line cards, or only a specific type of line card that includes that component. The configured fault policy may also indicate that it is to be applied to all hardware faults with that scope, for example, the class will indicate hardware (HW) and all other fields will include wildcards (e.g., HW.*.*.*). Instead, the configured fault policy may only indicate a particular type of hardware failure, for example, CRC errors on transmitted Ethernet packets (e.g., HW.Ethernet.TxCRC.*).

Redundancy:

As previously mentioned, a major concern for service providers is network downtime. In pursuit of "five 9's availability" or 99.999% network up time, service providers must minimize network outages due to equipment (i.e., hardware) and all too common software failures. Developers of computer systems often use redundancy measures to minimize downtime and enhance system resiliency. Redundant designs rely on alternate or backup resources to overcome hardware and/or software faults. Ideally, the redundancy architecture allows the computer system to continue operating in the face of a fault with minimal service disruption, for example, in a manner transparent to the service provider's customer.

Generally, redundancy designs come in two forms: 1:1 and 1:N. In a so-called "1:1 redundancy" design, a backup element exists for every active or primary element (i.e., hardware backup). In the event that a fault affects a primary element, a corresponding backup element is substituted for the primary element. If the backup element has not been in a "hot" state (i.e., software backup), then the backup element must be booted, configured to operate as a substitute for the failing element, and also provided with the "active state" of the failing element to allow the backup element to take over where the failed primary element left off. The time required to bring the software on the backup element to an "active state" is referred to as synchronization time. A long synchronization time can significantly disrupt system service, and in the case of a computer network device, if synchronization is not done quickly enough, then hundreds or thousands of network connections may be lost which directly impacts the service provider's availability statistics and angers network customers.

To minimize synchronization time, many 1:1 redundancy schemes support hot backup of software, which means that the software on the backup elements mirror the software on the primary elements at some level. The "hotter" the backup element—that is, the closer the backup mirrors the primary—the faster a failed primary can be switched over or failed over to the backup. The "hottest" backup element is one that runs hardware and software simultaneously with a primary element conducting all operations in parallel with the primary element. This is referred to as a "1+1 redundancy" design and provides the fastest synchronization.

Significant costs are associated with 1:1 and 1+1 redundancy. For example, additional hardware costs may include duplicate memory components and printed circuit boards including all the components on those boards. The additional hardware may also require a larger supporting chassis. Space is often limited, especially in the case of network service providers who may maintain hundreds of network devices. Although 1:1 redundancy improves system reliability, it decreases service density and decreases the mean time between failures. Service density refers to the proportionality between the net output of a particular device and its gross hardware capability. Net output, in the case of a network device (e.g., switch or router), might include, for example, the number of calls handled per second. Redundancy adds to gross hardware capability but not to the net output and, thus, decreases service density. Adding hardware increases the likelihood of a failure and, thus, decreases the mean time between failures. Likewise, hot backup comes at the expense of system power. Each active element consumes some amount of the limited power available to the system. In general, the 1+1 or 1:1 redundancy designs provide the highest reliability but at a relatively high cost. Due to the importance of network availability, most network service providers prefer the 1+1 redundancy design to minimize network downtime.

In a 1:N redundancy design, instead of having one backup element per primary element, a single backup element or spare is used to backup multiple (N) primary elements. As a result, the 1:N design is generally less expensive to manufacture, offers greater service density and better mean time between failures than the 1:1 design and requires a smaller chassis/less space than a 1:1 design. One disadvantage of such a system, however, is that once a primary element fails over to the backup element, the system is no longer redundant (i.e., no available backup element for any primary element). Another disadvantage relates to hot state backup. Because one backup element must support multiple primary elements, the typical 1:N design provides no hot state on the backup element leading to long synchronization times and, for network devices, the likelihood that connections will be dropped and availability reduced.

Even where the backup element provides some level of hot state backup it generally lacks the processing power and memory to provide a full hot state backup (i.e., 1+N) for all primary elements. To enable some level of hot state backup for each primary element, the backup element is generally a "mega spare" equipped with a more powerful processor and additional memory. This requires customers to stock more hardware than in a design with identical backup and primary elements. For instance, users typically maintain extra hardware in the case of a failure. If a primary fails over to the backup, the failed primary may be replaced with a new primary. If the primary and backup elements are identical, then users need only stock that one type of board, that is, a failed backup is also replaced with the same hardware used to replace the failed primary. If they are different, then the user must stock each type of board, thereby increasing the user's cost.

Distributed Redundancy:

A distributed redundancy architecture spreads software backup (hot state) across multiple elements. Each element may provide software backup for one or more other elements. For software backup alone, therefore, the distributed redundancy architecture eliminates the need for hardware backup elements (i.e., spare hardware). Where hardware backup is also provided, spreading resource demands across multiple elements makes it possible to have significant (perhaps full) hot state backup without the need for a mega spare. Identical backup (spare) and primary hardware provides manufacturing advantages and customer inventory advantages. A distributed redundancy design is less expensive than many 1:1 designs and a distributed redundancy architecture also permits the location of the hardware backup element to float, that is, if a primary element fails over to the backup element, when the failed primary element is replaced, that new hardware may serve as the hardware backup.

Figure 29:
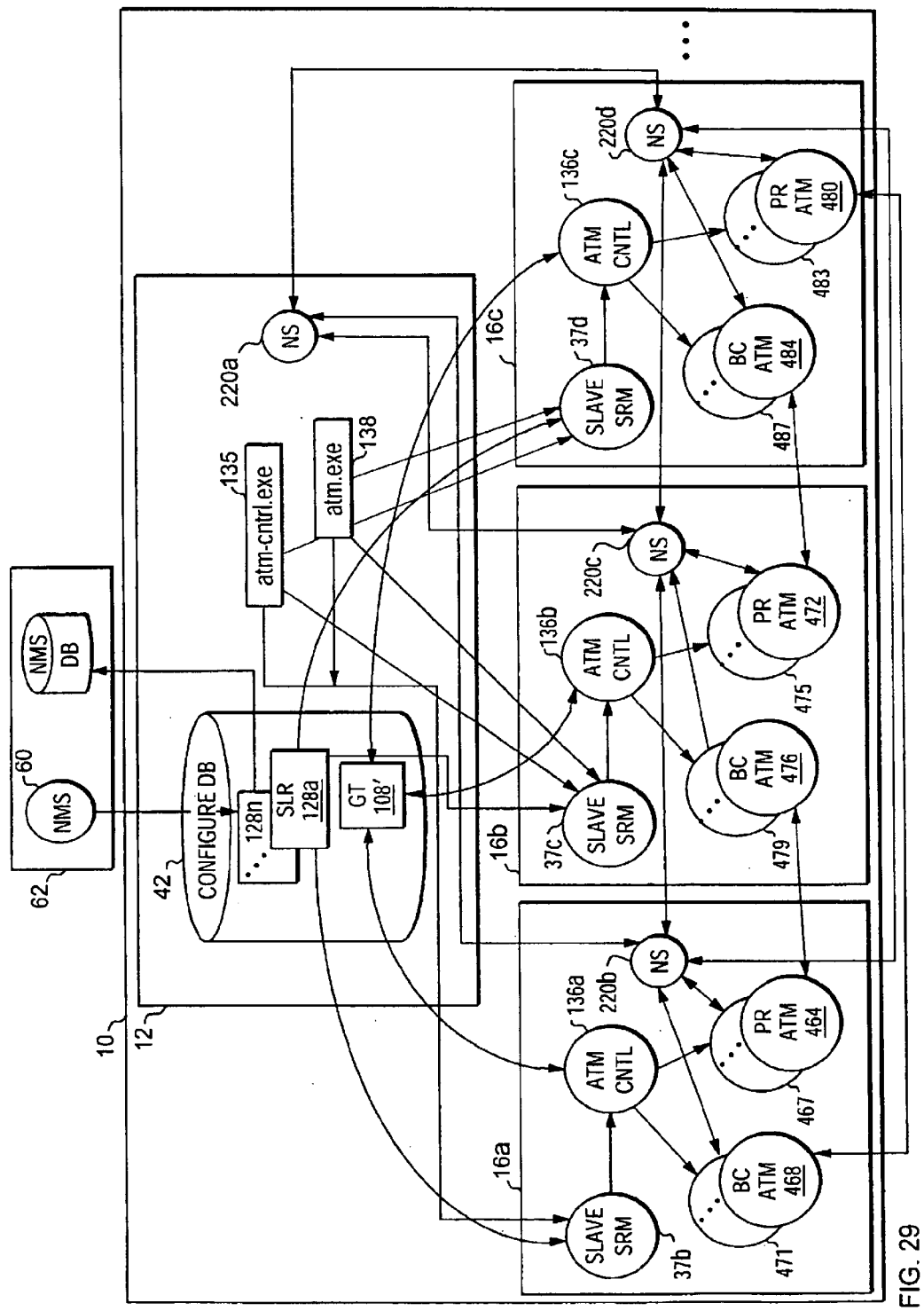
FIG. 29 is a block and flow diagram of a computer system incorporating a distributed redundancy architecture and illustrating a method for accomplishing distributed software redundancy.

Software Redundancy:

In its simplest form, a distributed redundancy system provides software redundancy (i.e., backup) with or without redundant (i.e., backup) hardware, for example, with or without using backup line card 16*n* as discussed earlier with reference to the logical to physical card table (FIG. 11*a*). Referring to FIG. 29, computer system 10 includes primary line cards 16*a*, 16*b* and 16*c*. Computer system 10 will likely include additional primary line cards; only three are discussed herein (and shown in FIG. 29) for convenience. As described above, to load instances of software applications, the NMS creates software load records (SLR) 128*a*–128*n* in configuration database 42. The SLR includes the name of a control shim executable file and a logical identification (LID) associated with a primary line card on which the application is to be spawned. In the current example, there either are no hardware backup line cards or, if there are, the slave SRM executing on that line card does not download and execute backup applications.

As one example, NMS 60 creates SLR 128*a* including the executable name atm_cntrl.exe and card LID 30 (line card 16*a*), SLR 128*b* including atm_cntrl.exe and LID 31 (line card 16*b*) and SLR 128*c* including atm_cntrl.exe and LID 32 (line card 16*c*). The configuration database detects LID 30, 31 and 32 in SLRs 128*a*, 128*b* and 128*c*, respectively, and sends slave SRMs 37*b*, 37*c* and 37*d* (line cards 16*a*, 16*b*, and 16*c*) notifications including the name of the executable file (e.g., atm_cntrl.exe) to be loaded. The slave SRMs then download and execute a copy of atm_cntrl.exe 135 from memory 40 to spawn ATM controllers 136*a*, 136*b* and 136*c*.

Through the active query feature, the ATM controllers are sent records from group table (GT) 108' (FIG. 30) indicating how many instances of ATM each must start on their associated line cards. Group table 108' includes a primary line card LID field 447 and a backup line card LID field 449 such that, in addition to starting primary instances of ATM, each primary line card also executes backup instances of ATM. For example, ATM controller 136*a* receives records 450–453 and 458–461 from group table 108' including LID 30 (line card 16*a*). Records 450–453 indicate that ATM controller 136*a* is to start four primary instantiations of ATM 464–467 (FIG. 29), and records 458–461 indicate that ATM controller 136*a* is to start four backup instantiations of ATM 468–471 as backup for four primary instantiations on LID 32 (line card 16*c*). Similarly, ATM controller 136*b* receives records 450–457 from group table 108' including LID 31 (line card 16*b*). Records 454–457 indicate that ATM controller 136*b* is to start four primary instantiations of ATM 472–475, and records 450–453 indicate that ATM controller 136*b* is to start four backup instantiations of ATM 476–479 as backup for four primary instantiations on LID 30 (line card 16*a*). ATM controller 136*c* receives records 454–461 from group table 108' including LID 32 (line card 16*c*). Records 458–461 indicate that ATM controller 136*c* is to start four primary instantiations of ATM 480–483, and records 454–457 indicate that ATM controller 136*c* is to start four backup instantiations of ATM 484–487 as backup for four primary instantiations on LID 31 (line card 16*b*). ATM controllers 136*a*, 136*b* and 136*c* then download atm.exe 138 and generate the appropriate number of ATM instantiations and also indicate to each instantiation whether it is a primary or backup instantiation. Alternatively, the ATM controllers may download atm.exe and generate the appropriate number of primary ATM instantiations and download a separate backup_atm.exe and generate the appropriate number of backup ATM instantiations.

Each primary instantiation registers with its local name server 220*b*–220*d*, as described above, and each backup instantiation subscribes to its local name server 220*b*–220*d* for information about its corresponding primary instantiation. The name server passes each backup instantiation at least the process identification number assigned to its corresponding primary instantiation, and with this, the backup instantiation sends a message to the primary instantiation to set up a dynamic state check-pointing procedure. Periodically or asynchronously as state changes, the primary instantiation passes dynamic state information to the backup instantiation (i.e., check-pointing). In one embodiment, a Redundancy Manager Service available from Harris and Jefferies of Dedham, Mass. may be used to allow backup and primary instantiations to pass dynamic state information. If the primary instantiation fails, it can be re-started, retrieve its last known dynamic state from the backup instantiation and then initiate an audit procedure (as described above) to resynchronize with other processes. The retrieval and audit process will normally be completed very quickly, resulting in no discernable service disruption.

Although each line card in the example above is instructed by the group table to start four instantiations of ATM, this is by way of example only. The user could instruct the NMS to set up the group table to have each line card start one or more instantiations and to have each line card start a different number of instantiations.

Figure 31A:
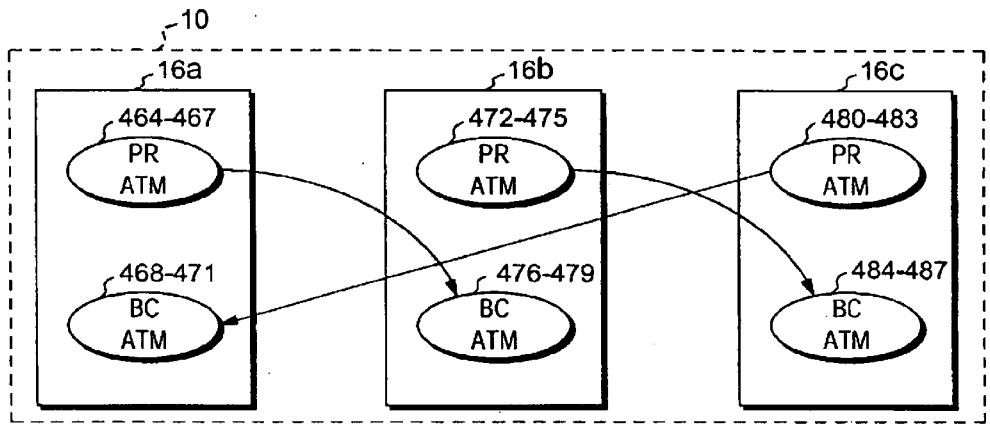
FIGS. 31a–31c, 32a–32c, 33a–33d and 34a–34b are block and flow diagrams of a computer system incorporating a distributed redundancy architecture and illustrating methods for accomplishing distributed redundancy and recovery after a failure.
Figure 31B:
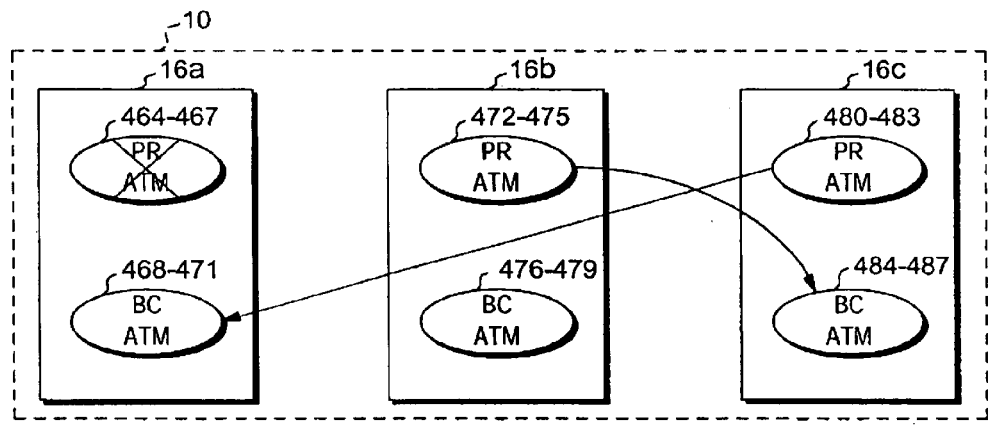
Figure 31C:
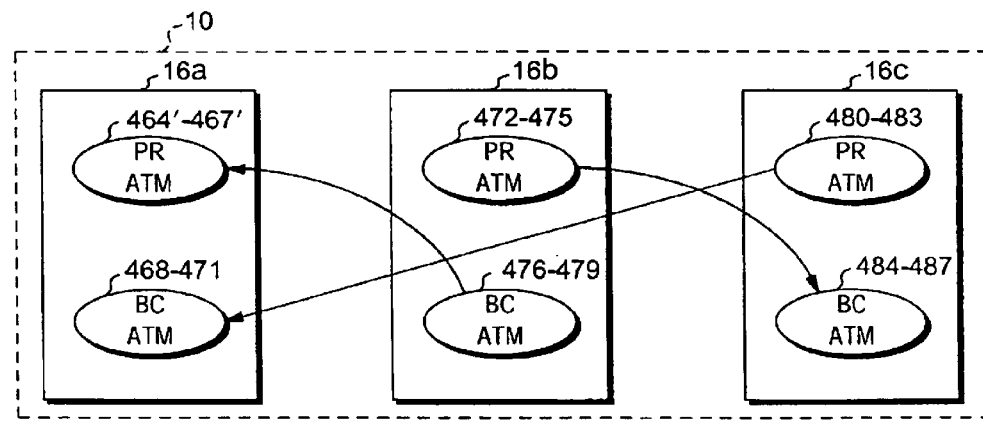

Referring to FIGS. 31a–31c, if one or more of the primary processes on element 16a (ATM 464–467) experiences a software fault (FIG. 31b), the processor on line card 16a may terminate and restart the failing process or processes. Once the process or processes are restarted (ATM 464'–467', FIG. 31c), they retrieve a copy of the last known dynamic state (i.e., backup state) from corresponding backup processes (ATM 476–479) executing on line card 16b and initiate an audit process to synchronize retrieved state with the dynamic state of associated other processes. The backup state represents the last known active or dynamic state of the process or processes prior to termination, and retrieving this state from line card 16b allows the restarted processes on line card 16a to quickly resynchronize and continue operating. The retrieval and audit process will normally be completed very quickly, and in the case of a network device, quick resynchronization may avoid losing network connections, resulting in no discernable service disruption.

Figure 32A:
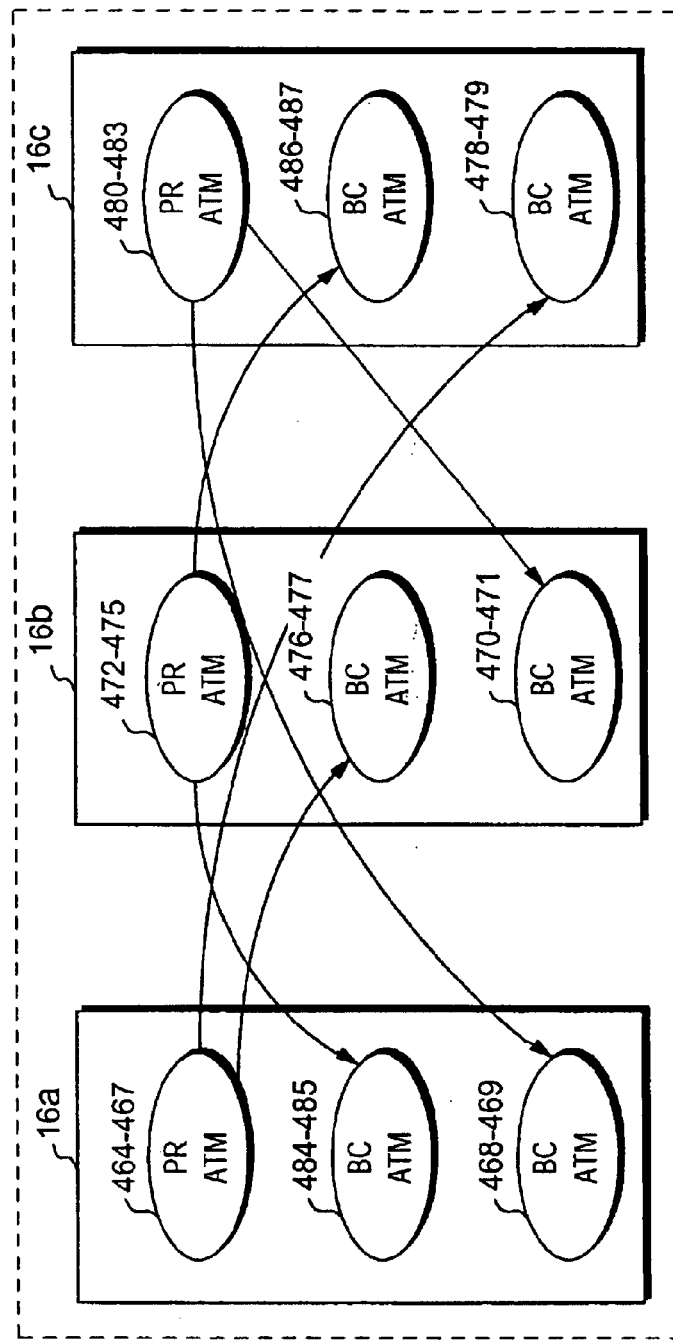
Figure 32B:
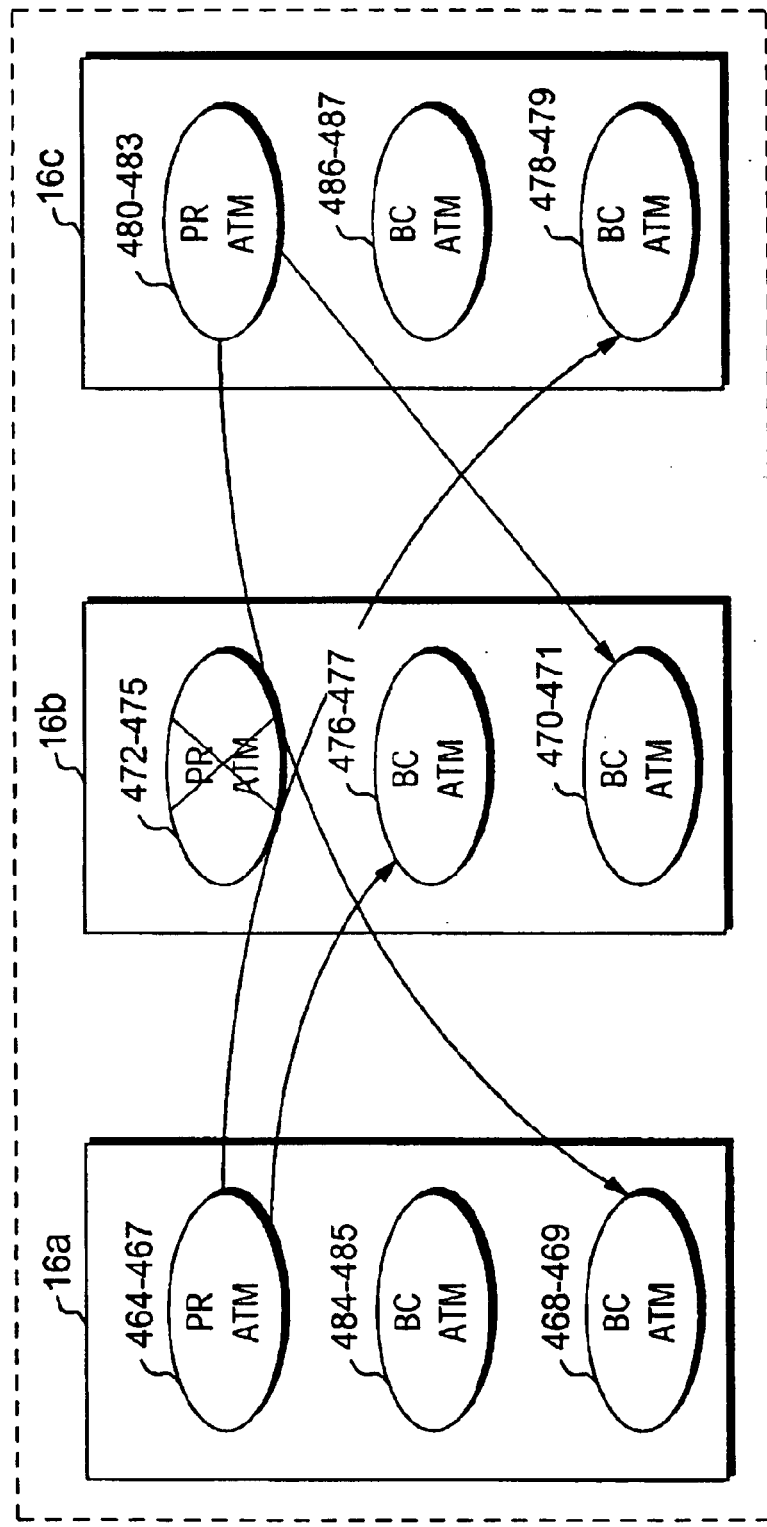
Figure 32C:
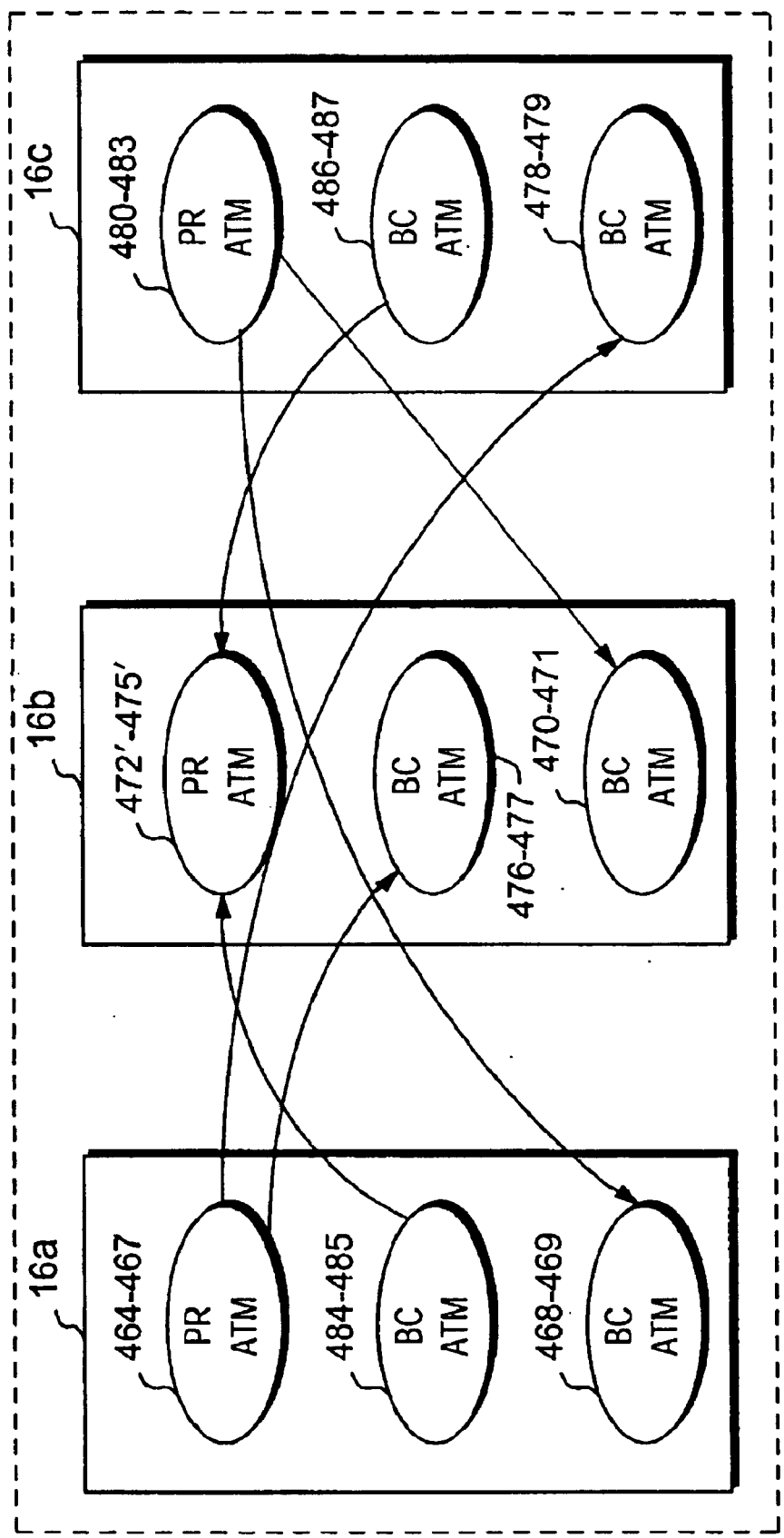

If, instead of restarting a particular application, the software fault experienced by line card 16a requires the entire element to be shut down and rebooted, then all of the processes executing on line card 16a will be terminated including backup processes ATM 468–471. When the primary processes are restarted, backup state information is retrieved from backup processes executing on line card 16b as explained above. Simultaneously, the restarted backup processes on line card 16a again initiate the check-pointing procedure with primary ATM processes 480–483 executing on line card 16c to again serve as backup processes for these primary processes. Referring to FIGS. 32a–32c, the primary processes executing on one line card may be backed-up by backup processes running on one or more other line cards. In addition, each primary process may be backed-up by one or more backup processes executing on one or more of the other line cards.

Since the operating system assigns each process its own memory block, each primary process may be backed-up by a backup process running on the same line card. This would minimize the time required to retrieve backup state and resynchronize if a primary process fails and is restarted. In a computer system that includes a spare or backup line card (described below), the backup state is best saved on another line card such that in the event of a hardware fault, the backup state is not lost and can be copied from the other line card. If memory and processor limitations permit, backup processes may run simultaneously on the same line card as the primary process and on another line card such that software faults are recovered from using local backup state and hardware faults are recovered from using remote backup state.

Where limitations on processing power or memory make full hot state backup impossible or impractical, only certain hot state data will be stored as backup. The level of hot state backup is inversely proportional to the resynchronization time, that is, as the level of hot state backup increases, resynchronization time decreases. For a network device, backup state may include critical information that allows the primary process to quickly re-synchronize.

Critical information for a network device may include connection data relevant to established network connections (e.g., call set up information and virtual circuit information). For example, after primary ATM applications 464–467, executing on line card 16a, establish network connections, those applications send critical state information relevant to those connections to backup ATM applications 479–476 executing on line card 16b. Retrieving connection data allows the hardware (i.e., line card 16a) to send and receive network data over the previously established network connections preventing these connections from being terminated/dropped.

Although ATM applications were used in the examples above, this is by way of example only. Any application (e.g., IP or MPLS), process (e.g., MCD or NS) or device driver (e.g., port driver) may have a backup process started on another line card to store backup state through a check-pointing procedure.

Hardware and Software Backup:

By adding one or more hardware backup elements (e.g., line card 16n) to the computer system, the distributed redundancy architecture provides both hardware and software backup. Software backup may be spread across all of the line cards or only some of the line cards. For example, software backup may be spread only across the primary line cards, only on one or more backup line cards or on a combination of both primary and backup line cards.

Figure 33A:
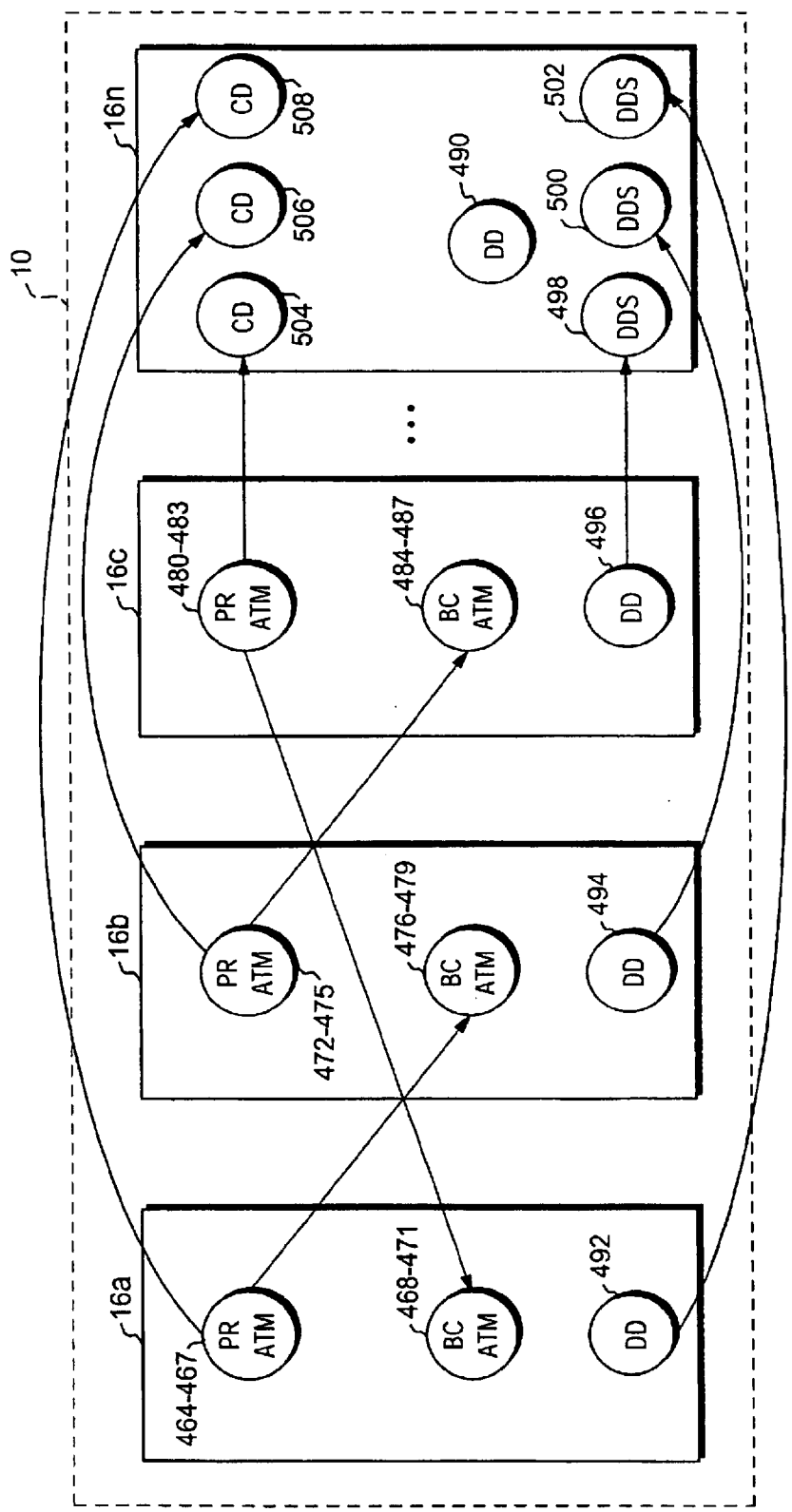

Referring to FIG. 33a, in the continuing example, line cards 16a, 16b and 16c are primary hardware elements and line card 16n is a spare or backup hardware element. In this example, software backup is spread across only the primary line cards. Alternatively, backup line card 16n may also execute backup processes to provide software backup. Backup line card 16n may execute all backup processes such that the primary elements need not execute any backup processes or line card 16n may execute only some of the backup processes. Regardless of whether backup line card 16n executes any backup processes, it is preferred that line card 16n be at least partially operational and ready to use the backup processes to quickly begin performing as if it was a failed primary line card.

There are many levels at which a backup line card may be partially operational. For example, the backup line card's hardware may be configured and device driver processes 490 loaded and ready to execute. In addition, the active state of the device drivers 492, 494, and 496 on each of the primary line cards may be stored as backup device driver state (DDS) 498, 500, 502 on backup line card 16n such that after a primary line card fails, the backup device driver state corresponding to that primary element is used by device driver processes 490 to quickly synchronize the hardware on backup line card 16n. In addition, data reflecting the network connections established by each primary process may be stored within each of the backup processes or independently on backup line card 16n, for example, connection data (CD) 504, 506, 508. Having a copy of the connection data on the backup line card allows the hardware to quickly begin transmitting network data over previously established connections to avoid the loss of these connections and minimize service disruption. The more operational (i.e., hotter) backup line card 16n is the faster it will be able to transfer data over network connections previously established by the failed primary line card and resynchronize with the rest of the system.

Figure 33B:
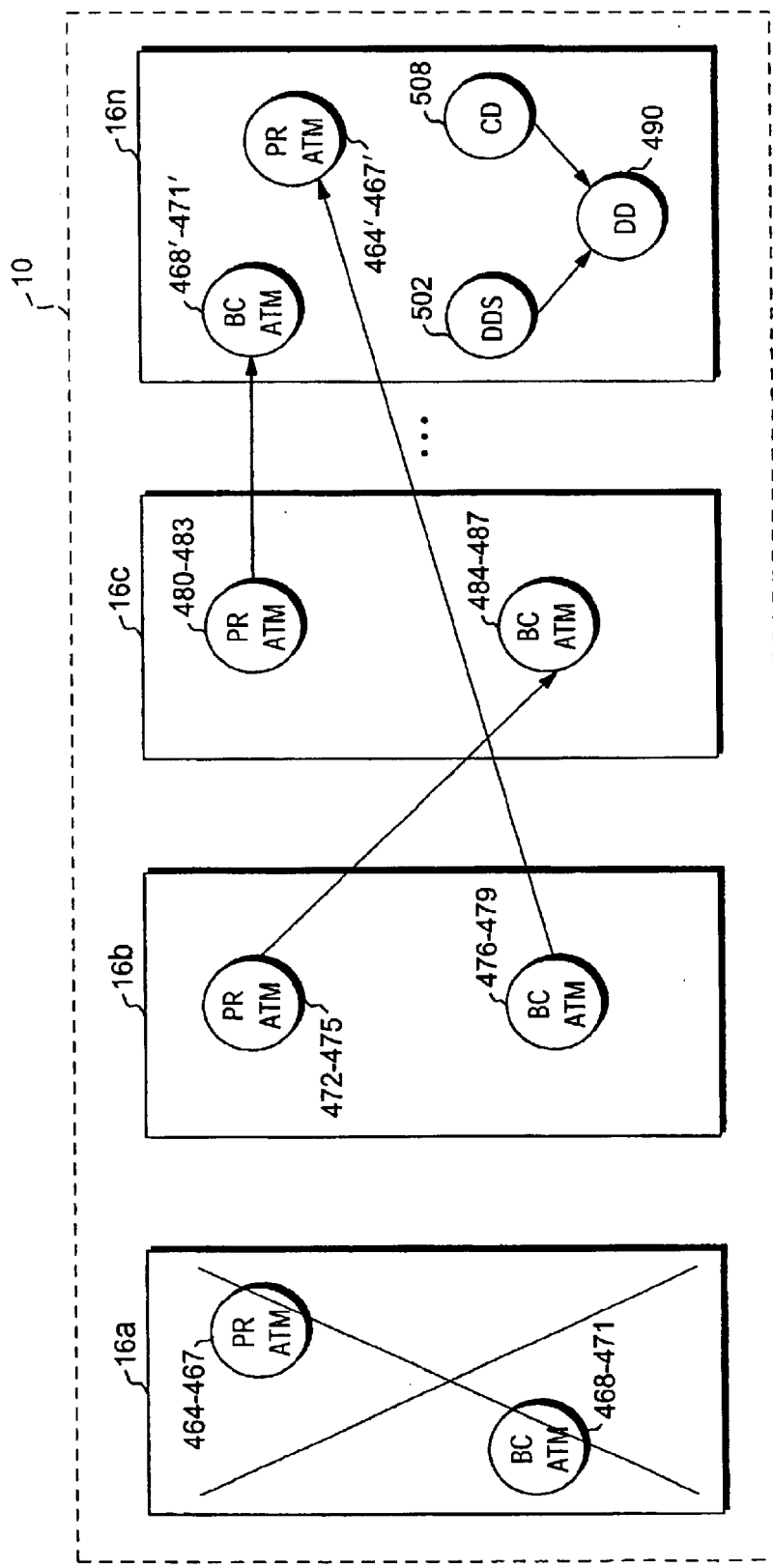

In the case of a primary line card hardware fault, the backup or spare line card takes the place of the failed primary line card. The backup line card starts new primary processes that register with the name server on the backup line card and begin retrieving active state from backup processes associated with the original primary processes. As described above, the same may also be true for software faults. Referring to FIG. 33b, if, for example, line card 16a in computer system 10 is affected by a fault, the slave SRM executing on backup line card 16n may start new primary processes 464'–467' corresponding to the original primary processes 464–467. The new primary processes register with the name server process executing on line card 16n and begin retrieving active state from backup processes 476–479 on line card 16b. This is referred to as a "fail-over" from failed primary line card 16a to backup line card 16n.

As discussed above, preferably, backup line card 16n is partially operational. While active state is being retrieved from backup processes on line card 16b, device driver processes 490 use device driver state 502 and connection data 508 corresponding to failed primary line card 16a to quickly continue passing network data over previously established connections. Once the active state is retrieved then the ATM applications resynchronize and may begin establishing new connections and tearing down old connections.

Figure 33C:
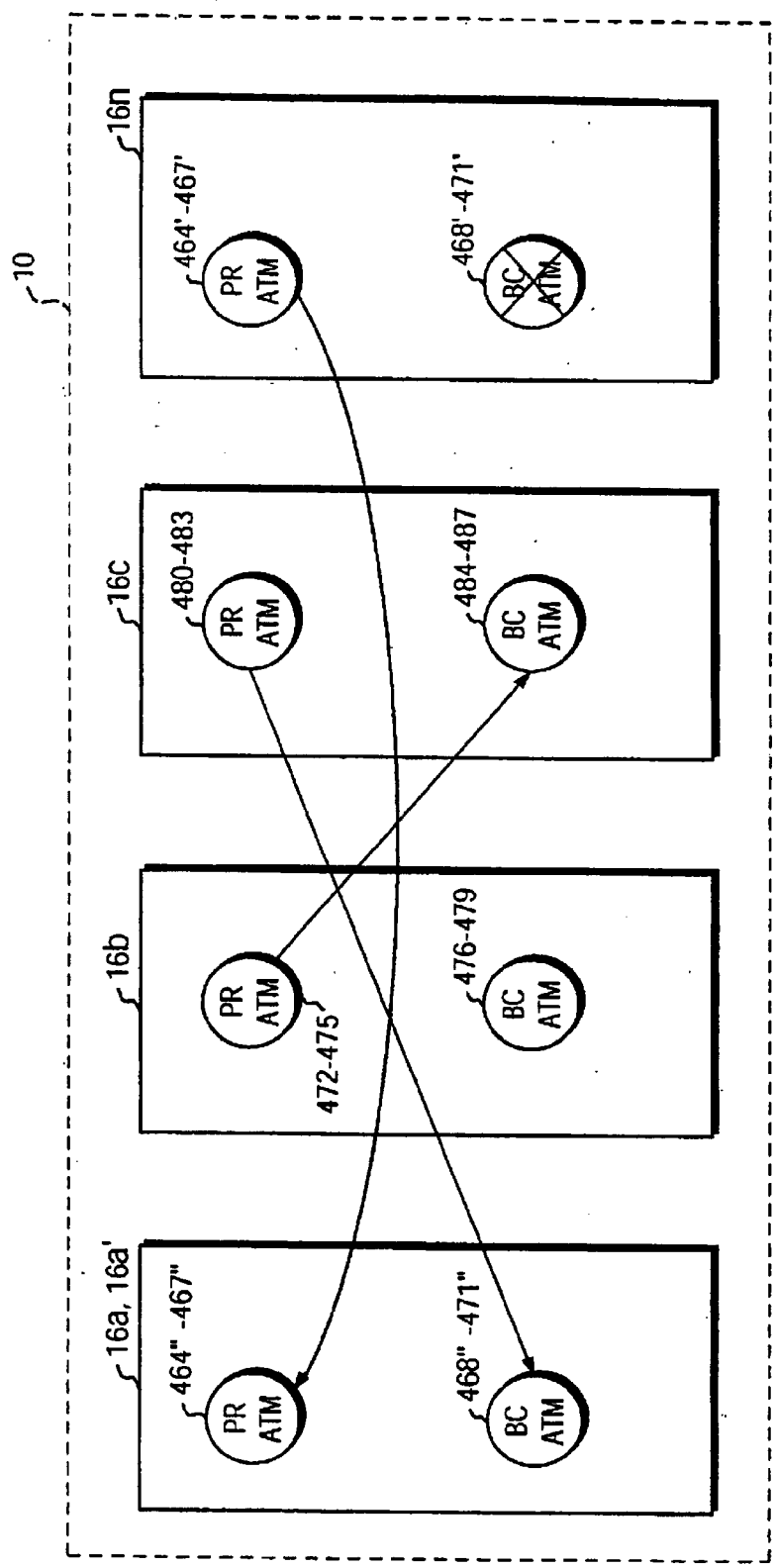

Floating Backup Element:

Referring to FIG. 33c, when the fault is detected on line card 16a, diagnostic tests may be run to determine if the error was caused by software or hardware. If the fault is a software error, then line card 16a may again be used as a primary line card. If the fault is a hardware error, then line card 16a is replaced with a new line card 16a' that is booted and configured and again ready to be used as a primary element. In one embodiment, once line card 16a or 16a' is ready to serve as a primary element, a fail-over is initiated from line card 16n to line card 16a or 16a' as described above, including starting new primary processes 464"–467" and retrieving active state from primary processes 464'–467' on line card 16n (or backup processes 476–479 on line card 16b). Backup processes 468"–471" are also started, and those backup processes initiate a check-pointing procedure with primary processes 480–483 on line card 16c. This fail-over may cause the same level of service interruption as an actual failure.

Figure 33D:
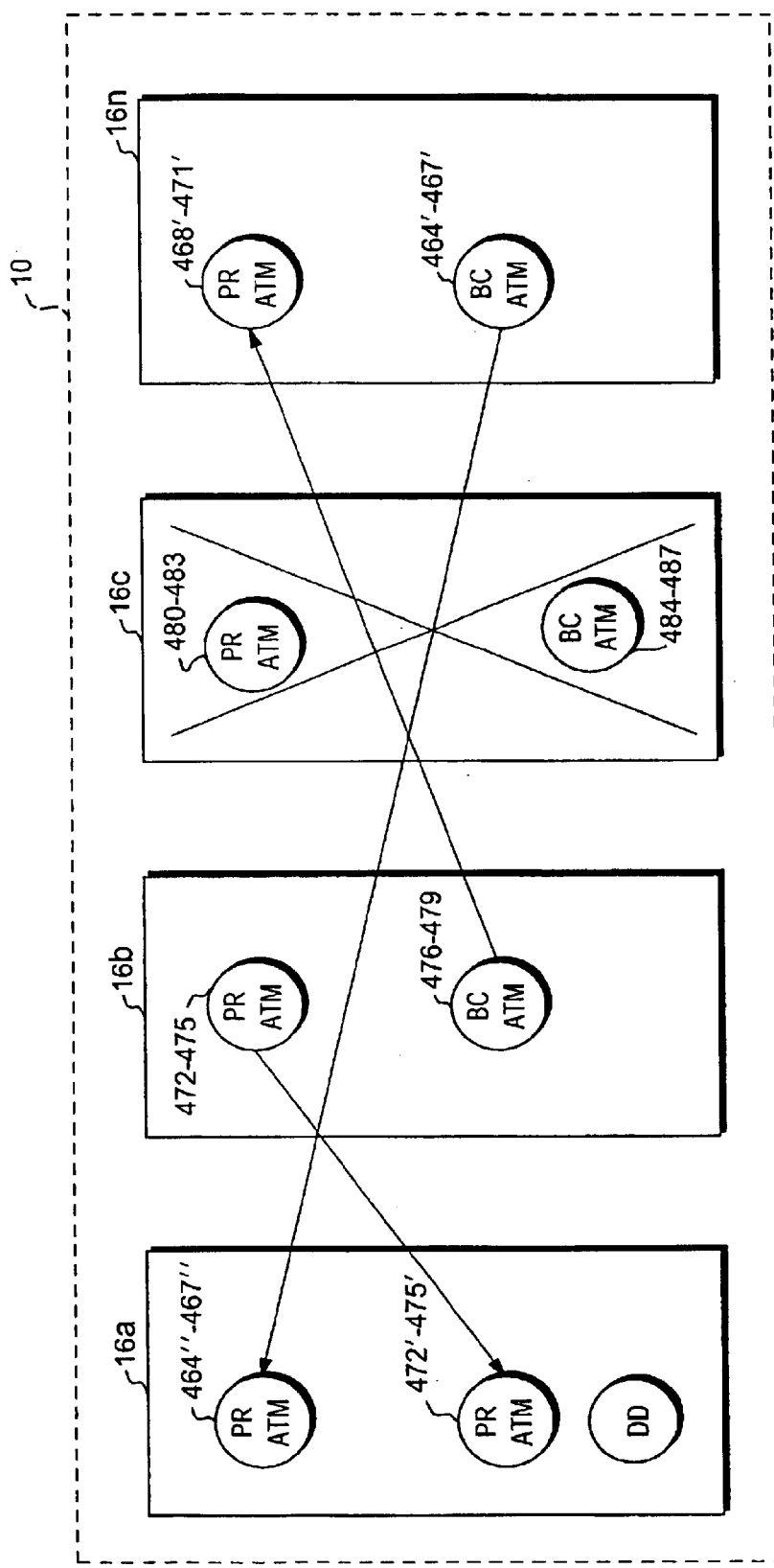

Instead of failing-over from line card 16n back to line card 16a or 16a' and risking further service disruption, line card 16a or 16a' may serve as the new backup line card with line card 16n serving as the primary line card. If line cards 16b, 16c or 16n experience a fault, a fail-over to line card 16a is initiated as discussed above and the primary line card that failed (or a replacement of that line card) serves as the new backup line card. This is referred to as a "floating" backup element. Referring to FIG. 33d, if, for example, line card 16c experiences a fault, primary processes 480'–483' are started on backup line card 16a and active state is retrieved from backup processes 464'–467' on line card 16n. After line card 16c is rebooted or replaced and rebooted, it serves as the new backup line card for primary line cards 16a, 16b and 16n.

Alternatively, computer system 10 may be physically configured to only allow a line card in a particular chassis slot, for example, line card 16n, to serve as the backup line card. This may be the case where physically, the slot line card 16n is inserted within is wired to provide the necessary connections to allow line card 16n to communicate with each of the other line cards but no other slot provides these connections. In addition, even where the computer system is capable of allowing line cards in other chassis slots to act as the backup line card, the person acting as network manager, may prefer to have the backup line card in each of his computer systems in the same slot. In either case, where only line card 16n serves as the backup line card, once line card 16a (or any other failed primary line card) is ready to act as a primary line card again, a fail-over, as described above, is initiated from line card 16n to the primary line card to allow line card 16n to again serve as a backup line card to each of the primary line cards.

Figure 34A:
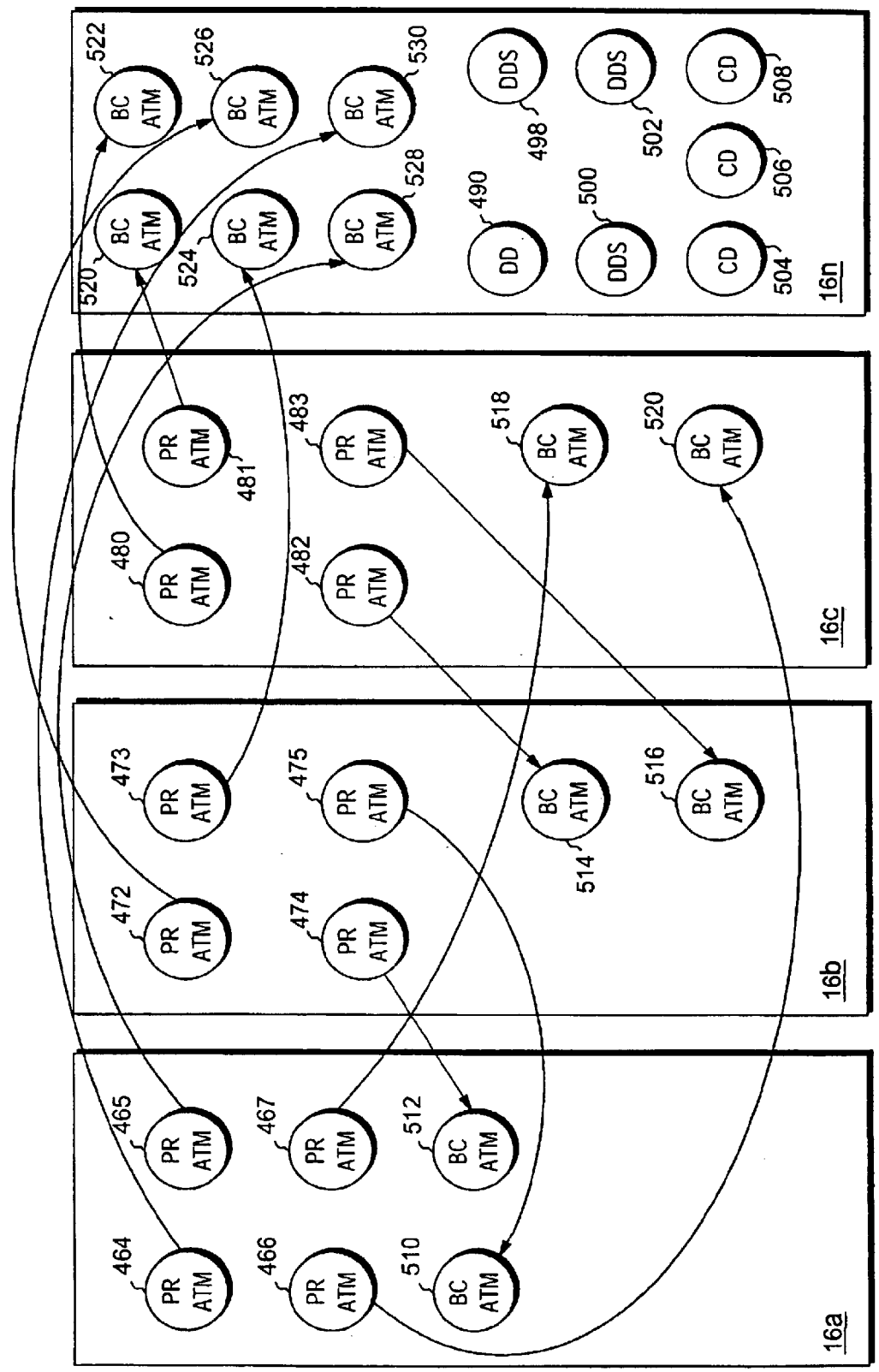
Figure 34B:
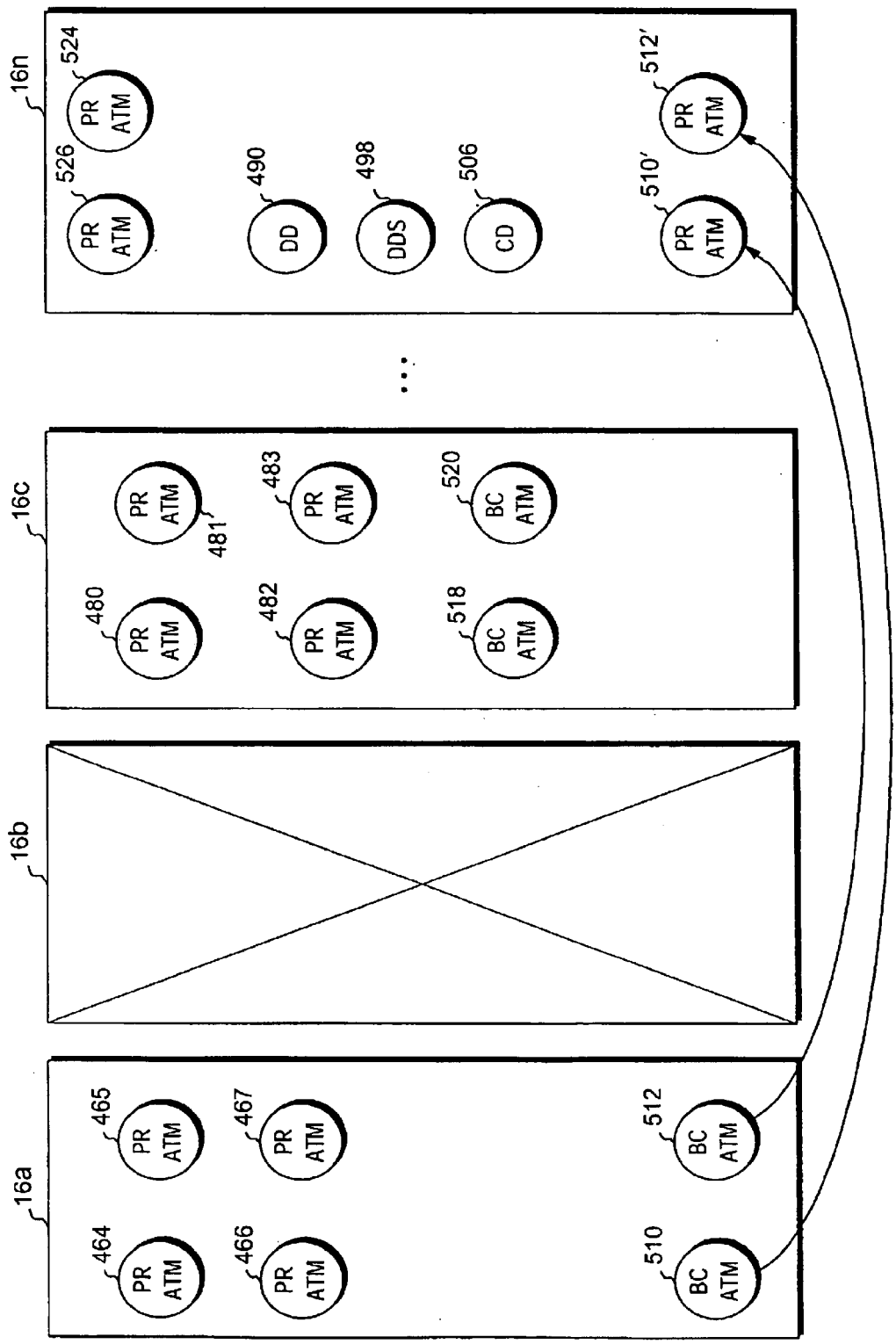

Balancing Resources:

Typically, multiple processes or applications are executed on each primary line card. Referring to FIG. 34a, in one embodiment, each primary line card 16a, 16b, 16c executes four applications. Due to physical limitations (e.g., memory space, processor power), each primary line card may not be capable of fully backing up four applications executing on another primary line card. The distributed redundancy architecture allows backup processes to be spread across multiple line cards, including any backup line cards, to more efficiently use all system resources.

For instance, primary line card 16a executes backup processes 510 and 512 corresponding to primary processes 474 and 475 executing on primary line card 16b. Primary line card 16b executes backup processes 514 and 516 corresponding to primary processes 482 and 483 executing on primary line card 16c, and primary line card 16c executes backup processes 518 and 520 corresponding to primary processes 466 and 467 executing on primary line card 16a. Backup line card 16n executes backup processes 520, 522, 524, 526, 528 and 530 corresponding to primary processes 464, 465, 472, 473, 480 and 481 executing on each of the primary line cards. Having each primary line card execute backup processes for only two primary processes executing on another primary line card reduces the primary line card resources required for backup. Since backup line card 16n is not executing primary processes, more resources are available for backup. Hence, backup line card 16n executes six backup processes corresponding to six primary processes executing on primary line cards. In addition, backup line card 16n is partially operational and is executing device driver processes 490 and storing device driver backup state 498, 500 and 502 corresponding to the device drivers on each of the primary elements and network connection data 504, 506 and 508 corresponding to the network connections established by each of the primary line cards.

Alternatively, each primary line card could execute more or less than two backup processes. Similarly, each primary line card could execute no backup processes and backup line card 16n could execute all backup processes. Many alternatives are possible and backup processes need not be spread evenly across all primary line cards or all primary line cards and the backup line card.

Referring to FIG. 5b, if primary line card 16b experiences a failure, device drivers 490 on backup line card 16n begins using the device driver state, for example, DDS 498, corresponding to the device drivers on primary line card 16b and the network connection data, for example, CD 506, corresponding to the connections established by primary line card 16b to continue transferring network data. Simultaneously, backup line card 16n starts substitute primary processes 510' and 512' corresponding to the primary processes 474 and 475 on failed primary line card 16b. Substitute primary processes 510' and 512' retrieve active state from backup processes 510 and 512 executing on primary line card 16a. In addition, the slave SRM on backup line card 16n informs backup processes 526 and 524 corresponding to primary processes 472 and 473 on failed primary line card 16b that they are now primary processes. The new primary applications then synchronize with the rest of the system such that new network connections may be established and old network connections torn down. That is, backup line card 16n begins operating as if it were primary line card 16b.

Multiple Backup Elements:

In the examples given above, one backup line card is shown. Alternatively, multiple backup line cards may be provided in a computer system. In one embodiment, a computer system includes multiple different primary line cards. For example, some primary line cards may support the Asynchronous Transfer Mode (ATM) protocol while others support the Multi-Protocol Label Switching (MPLS) protocol, and one backup line card may be provided for the ATM primary line cards and another backup line card may be provided for the MPLS primary line cards. As another example, some primary line cards may support four ports while others support eight ports and one backup line card may be provided for the four port primaries and another backup line card may be provided for the eight port primaries. One or more backup line cards may be provided for each different type of primary line card.

Figure 35:
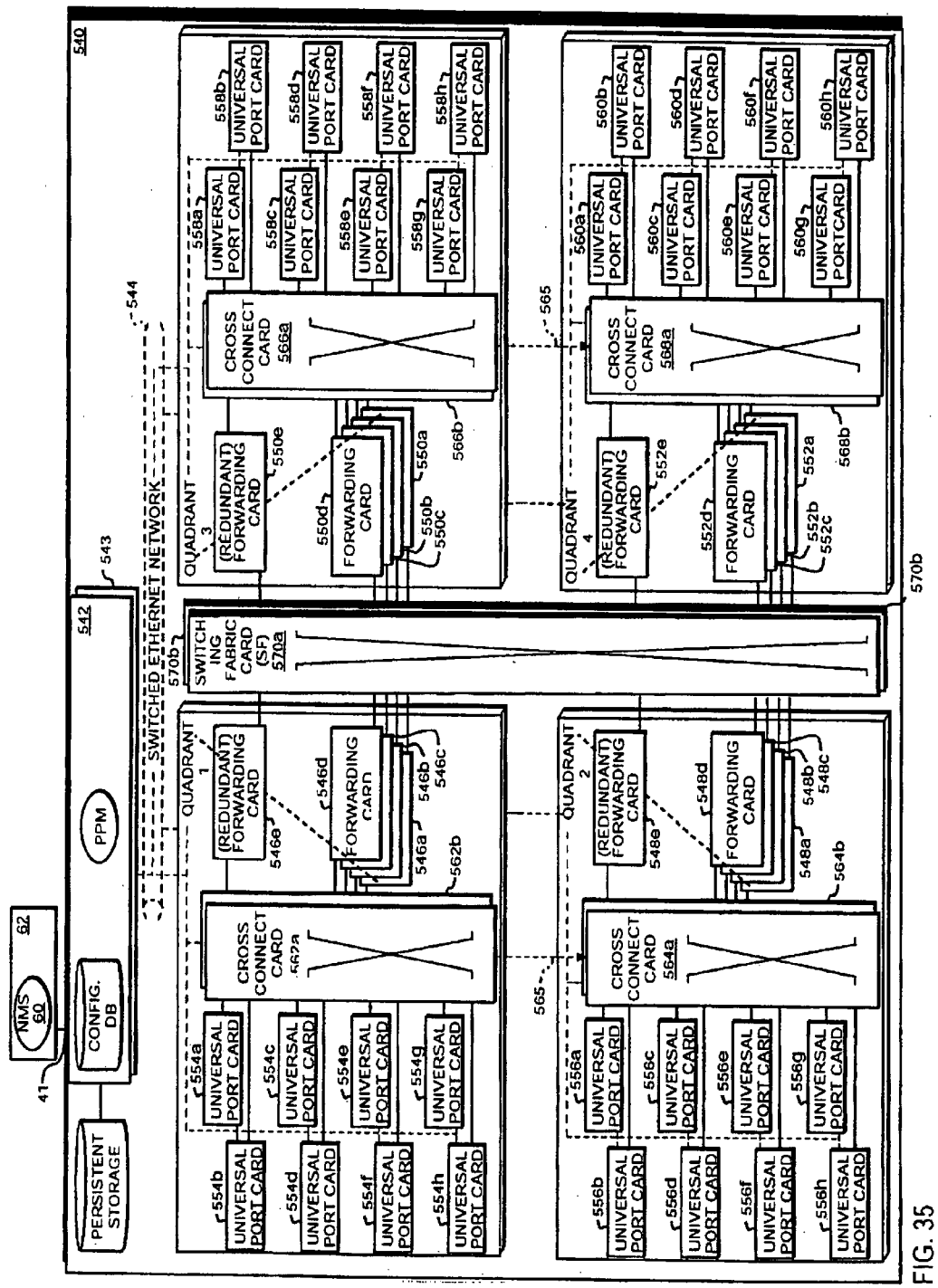
FIG. 35 is a block diagram of a network device.

Data Plane:

Referring to FIG. 35, a network device 540 includes a central processor 542, a redundant central processor 543 and a Fast Ethernet control bus 544 similar to central processors 12 and 13 and Ethernet 32 discussed above with respect to computer system 10. In addition, network device 540 includes forwarding cards (FC) 546a–546e, 548a–548e, 550a–550e and 552a–552e that are similar to line cards 16a–16n discussed above with respect to computer system 10. Network device 540 also includes (and computer system 10 may also include) universal port (UP) cards 554a–554h, 556a–556h, 558a–558h, and 560a–560h, cross-connection (XC) cards 562a–562b, 564a–564b, 566a–566b, and 568a–568b, and switch fabric (SF) cards 570a–570b. In one embodiment, network device 540 includes four quadrants where each quadrant includes five forwarding cards (e.g., 546a 546e), two cross connection cards (e.g., 562a–562b) and eight universal port cards (e.g., 554a–554h). Network device 540 is a distributed processing system. Each of the cards includes a processor and is connected to the Ethernet control bus. In addition, each of the cards are configured as described above with respect to line cards.

In one embodiment, the forwarding cards have a 1:4 hardware redundancy structure and distributed software redundancy as described above. For example, forwarding card 546e is the hardware backup for primary forwarding cards 546a–546d and each of the forwarding cards provide software backup. The cross-connection cards are 1:1 redundant. For example, cross-connection card 562b provides both hardware and software backup for cross-connection card 562a. Each port on the universal port cards may be 1:1, 1+1, 1:N redundant or not redundant at all depending upon the quality of service paid for by the customer associated with that port. For example, port cards 554e–554h may be the hardware and software backup cards for port cards 554a–554d in which case the port cards are 1:1 or 1+1 redundant. As another example, one or more ports on port card 554a may be backed-up by separate ports on one or more port cards (e.g., port cards 554b and 554c) such that each port is 1:1 or 1+1 redundant, one or more ports on port card 554a may not be backed-up at all (i.e., not redundant) and two or more ports on 554a may be backed-up by one port on another port card (e.g., port card 554b) such that those ports are 1:N redundant. Many redundancy structures are possible using the LID to PID Card table (LPCT) 100 (FIG. 9) and LID to PID Port table (LPPT) as described above.

Each port card includes one or more ports for connecting to external network connections. One type of network connection is an optical fiber carrying an OC-48 SONET stream, and as described above, an OC-48 SONET stream may include connections to one or more end points using one or more paths. A SONET fiber carries a time division multiplexed (TDM) byte stream of aggregated time slots (TS). A time slot has a bandwidth of 51 Mbps and is the fundamental unit of bandwidth for SONET. An STS-1 path has one time slot within the byte stream dedicated to it, while an STS-3c path (i.e., three concatenated STS-1s) has three time slots within the byte stream dedicated to it. The same or different protocols may be carried over different paths within the same TDM byte stream. In other words, ATM over SONET may be carried on an STS-1 path within a TDM byte stream that also includes IP over SONET on another STS-1 path or on an STS-3c path.

Through network management system 60 on workstation 62, after a user connects an external network connection to a port, the user may enable that port and one or more paths within that port (described below). Data received on a port card path is passed to the cross-connection card in the same quadrant as the port card, and the cross-connection card passes the path data to one of the five forwarding cards or eight port cards also within the same quadrant. The forwarding card determines whether the payload (e.g., packets, frames or cells) it is receiving includes user payload data or network control information. The forwarding card itself processes certain network control information and sends certain other network control information to the central processor over the Fast Ethernet control bus. The forwarding card also generates network control payloads and receives network control payloads from the central processor. The forwarding card sends any user data payloads from the cross-connection card or control information from itself or the central processor as path data to the switch fabric card. The switch fabric card then passes the path data to one of the forwarding cards in any quadrant, including the forwarding card that just sent the data to the switch fabric card. That forwarding card then sends the path data to the cross-connection card within its quadrant, which passes the path data to one of the port cards within its quadrant.

Figure 36:
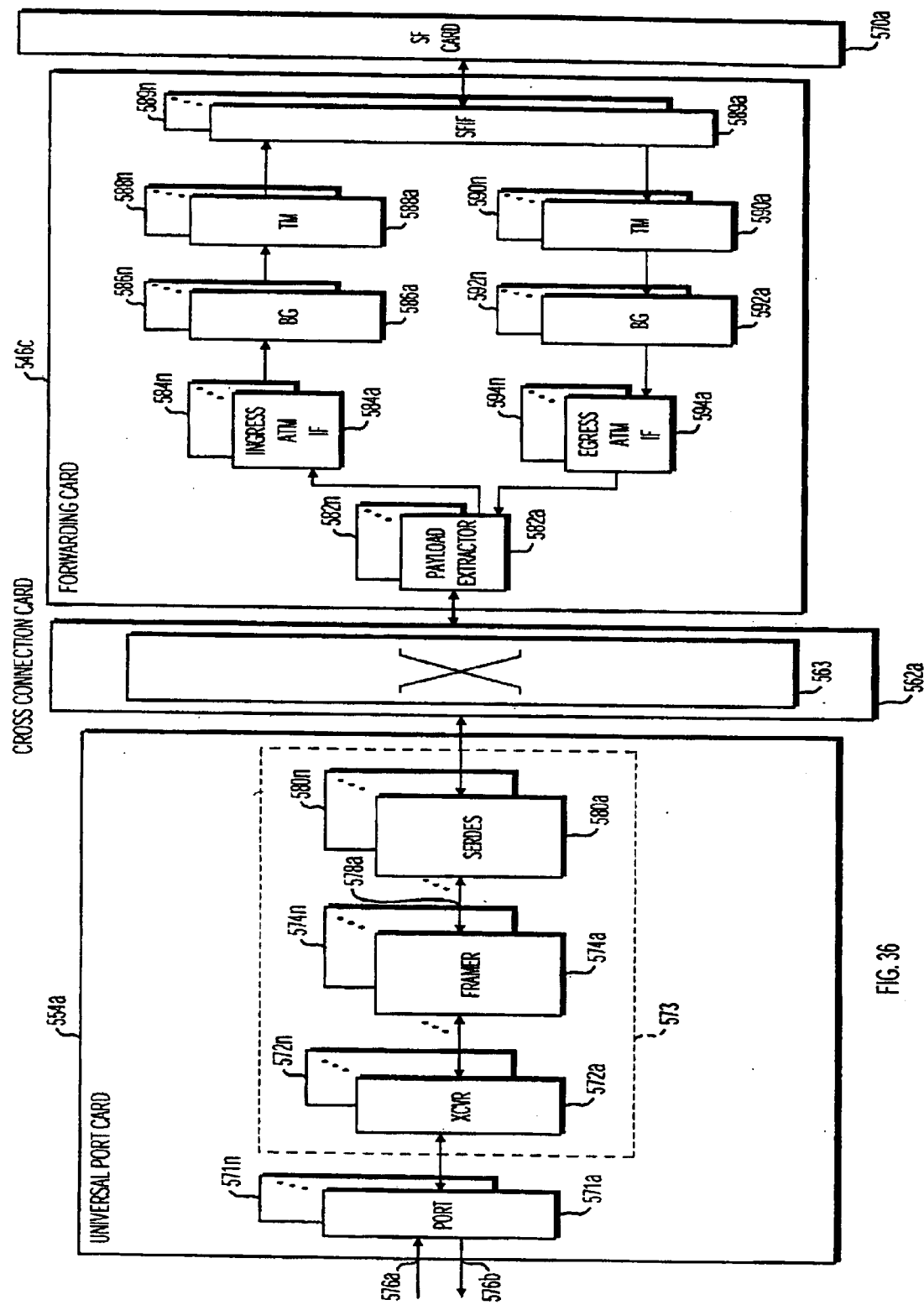
FIG. 36 is a block diagram of a portion of a data plane of a network device.

Referring to FIG. 36, in one embodiment, a universal port card 554a includes one or more ports 571a–571n connected to one or more transceivers 572a–572n. The user may connect an external network connection to each port. As one example, port 571a is connected to an ingress optical fiber 576a carrying an OC-48 SONET stream and an egress optical fiber 576b carrying an OC-48 SONET stream. Port 571 a passes optical data from the SONET stream on fiber 576a to transceiver 572a. Transceiver 572a converts the optical data into electrical signals that it sends to a SONET framer 574a. The SONET framer organizes the data it receives from the transceiver into SONET frames. SONET framer 574a sends data over a telecommunications bus 578a to a serializer-deserializer (SERDES) 580a that serializes the data into four serial lines with twelve STS-1 time slots each and transmits the four serial lines to cross-connect card 562a.

Each cross-connection card is a switch that provides connections between port cards and forwarding cards within its quadrant. Each cross-connection card is programmed to transfer each serial line on each port card within its quadrant to a forwarding card within its quadrant or to serial line on a port card, including the port card that transmitted the data to the cross-connection card. The programming of the cross-connect card is discussed in more detail below under Policy Based Provisioning.

Each forwarding card (e.g., forwarding card 546c) receives SONET frames over serial lines from the cross-connection card in its quadrant through a payload extractor chip (e.g., payload extractor 582a). In one embodiment, each forwarding card includes four payload extractor chips where each payload extractor chip represents a "slice" and each serial line input represents a forwarding card "port". Each payload extractor chip receives four serial line inputs, and since each serial line includes twelve STS-1 time slots, the payload extractor chips combine and separate time slots where necessary to output data paths with the appropriate number of time slots. Each STS-1 time slot may represent a separate data path, or multiple STS-1 time slots may need to be combined to form a data path. For example, an STS-3c path requires the combination of three STS-1 time slots to form a data path while an STS-48c path requires the combination of all forty-eight STS-1 time slots. Each path represents a separate network connection, for example, an ATM cell stream.

The payload extractor chip also strips off all vestigial SONET frame information and transfers the data path to an ingress interface chip. The ingress interface chip will be specific to the protocol of the data within the path. As one example, the data may be formatted in accordance with the ATM protocol and the ingress interface chip is an ATM interface chip (e.g., ATM IF 584a). Other protocols can also be implemented including, for example, Internet Protocol (IP), Multi-Protocol Label Switching (MPLS) protocol or Frame Relay.

The ingress ATM IF chip performs many functions including determining connection information (e.g., virtual circuit or virtual path information) from the ATM header in the payload. The ATM IF chip uses the connection information as well as a forwarding table to perform an address translation from the external address to an internal address. The ATM IF chip passes ATM cells to an ingress bridge chip (e.g., BG 586a–586b) which serves as an interface to an ingress traffic management chip or chip set (e.g., TM 588a–588n).

The traffic management chips ensure that high priority traffic, for example, voice data, is passed to switch fabric card 570a faster than lower priority traffic, for example, e-mail data. The traffic management chips may buffer lower priority traffic while higher priority traffic is transmitted, and in times of traffic congestion, the traffic management chips will ensure that low priority traffic is dropped prior to any high priority traffic. The traffic management chips also perform an address translation to add the address of the traffic management chip to which the data is going to be sent by the switch fabric card. The address corresponds to internal virtual circuits set up between forwarding cards by the software and available to the traffic management chips in tables.

The traffic management chips send the modified ATM cells to switch fabric interface chips (SFIF) 589a–589n that then transfer the ATM cells to switch fabric card 570a. The switch fabric card uses the address provided by the ingress traffic management chips to pass ATM cells to the appropriate egress traffic management chips (e.g., TM 590a–590n) on the various forwarding cards. In one embodiment, the switch fabric card 570a is a 320 Gbps, non-blocking fabric. Since each forwarding card serves as both an ingress and egress, the switching fabric card provides a high degree of flexibility in directing the data between any of the forwarding cards, including the forwarding card that sent the data to the switch fabric card.

When a forwarding card (e.g., forwarding card 546c) receives ATM cells from switch fabric card 570a, the egress traffic management chips re-translate the address of each cell and pass the cells to egress bridge chips (e.g., BG 592a–592b). The bridge chips pass the cells to egress ATM interface chips (e.g., ATM IF 594a–594n), and the ATM interface chips add a re-translated address to the payload representing an ATM virtual circuit. The ATM interface chips then send the data to the payload extractor chips (e.g., payload extractor 582a–582n) that separate, where necessary, the path data into STS-1 time slots and combine twelve STS-1 time slots into four serial lines and send the serial lines back through the cross-connection card to the appropriate port card.

The port card SERDES chips receive the serial lines from the cross-connection card and de-serialize the data and send it to SONET framer chips 574a–574n. The Framers properly format the SONET overhead and send the data back through the transceivers that change the data from electrical to optical before sending it to the appropriate port and SONET fiber.

Although the port card ports above were described as connected to a SONET fiber carrying an OC-48 stream, other SONET fibers carrying other streams (e.g., OC-12) and other types of fibers and cables, for example, Ethernet, may be used instead. The transceivers are standard parts available from many companies, including Hewlett Packard Company and Sumitomo Corporation. The SONET framer may be a Spectra chip available from PMC-Sierra, Inc. in British Columbia. A Spectra 2488 has a maximum bandwidth of 2488 Mbps and may be coupled with a 1xOC48 transceiver coupled with a port connected to a SONET optical fiber carrying an OC-48 stream also having a maximum bandwidth of 2488 Mbps. Instead, four SONET optical fibers carrying OC-12 streams each having a maximum bandwidth of 622 Mbps may be connected to four 1xOC12 transceivers and coupled with one Spectra 2488. Alternatively, a Spectra 4x155 may be coupled with four OC-3 transceivers that are coupled with ports connected to four SONET fibers carrying OC-3 streams each having a maximum bandwidth of 155 Mbps. Many variables are possible.

The SERDES chip may be a Telecommunications Bus Serializer (TBS) chip from PMC-Sierra, and each cross-connection card may include a Time Switch Element (TSE) from PMC-Sierra, Inc. Similarly, the payload extractor chips may be MACH 2488 chips and the ATM interface chips may be ATLAS chips both of which are available from PMC-Sierra. Several chips are available from Extreme Packet Devices (EPD), a subsidiary of PMC-Sierra, including PP3 bridge chips and Data Path Element (DPE) traffic management chips. The switch fabric interface chips may include a Switch Fabric Interface (SIF) chip also from EPD. Other switch fabric interface chips are available from Abrizio, also a subsidiary of PMC-Sierra, including a data slice chip and an enhanced port processor (EPP) chip. The switch fabric card may also include chips from Abrizio, including a cross-bar chip and a scheduler chip.

Although the port cards, cross-connection cards and forwarding cards have been shown as separate cards, this is by way of example only and they may be combined into one or more different cards.

Multiple Redundancy Schemes:

Coupling universal port cards to forwarding cards through a cross-connection card provides flexibility in data transmission by allowing data to be transmitted from any path on any port to any port on any forwarding card. In addition, decoupling the universal port cards and the forwarding cards enables redundancy schemes (e.g., 1:1, 1+1, 1:N, no redundancy) to be set up separately for the forwarding cards and universal port cards. The same redundancy scheme may be set up for both or they may be different. As described above, the LID to PID card and port tables are used to setup the various redundancy schemes for the line cards (forwarding or universal port cards) and ports. Network devices often implement industry standard redundancy schemes, such as those defined by the Automatic Protection Switching (APS) standard. In network device 540 (FIG. 35), an APS standard redundancy scheme may be implemented for the universal port cards while another redundancy scheme is implemented for the forwarding cards.

Referring again to FIG. 35, further data transmission flexibility may be provided by connecting (i.e., connections 565) each cross-connection card 562a–562b, 564a–564b, 566a–566b and 568a–568b to each of the other cross-connection cards. Through connections 565, a cross-connection card (e.g., cross-connection card 562a) may transmit data between any port or any path on any port on a universal port card (e.g., universal port cards 554a–554h) in its quadrant to a cross-connection card (e.g., cross-connection card 568a) in any other quadrant, and that cross-connection card (e.g., cross-connection card 568a) may transmit the data to any forwarding card (e.g., forwarding cards 552a 552e) or universal port card (e.g., universal port cards 560a–560h) in its quadrant. Similarly, any cross-connection card may transmit data received from any forwarding card in its quadrant to any other cross-connection card and that cross-connection card may transmit the data to any universal port card port in its quadrant.

Alternatively, the cross-connection cards in each quadrant may be coupled only with cross-connection cards in one other quadrant. For example, cross-connection cards in quadrants 1 and 2 may be connected and cross-connection cards in quadrants 3 and 4 may be connected. Similarly, the cross-connection cards in each quadrant may be coupled with cross-connection cards in only two other quadrants, or only the cross-connection cards in one quadrant (e.g., quadrant 1) may be connected to cross-connection cards in another quadrant (e.g., quadrant 2) while the cross-connection cards in the other quadrants (e.g., quadrants 3 and 4) are not connected to other cross-connection cards or are connected only to cross-connection cards in one quadrant (e.g., quadrant 2). Many variations are possible. Although these connections do not provide the flexibility of having all cross-connection cards inter-connected, these connections require less routing resources and still provide some increase in the data transmission flexibility of the network device.

The additional flexibility provided by inter-connecting one or more cross-connection cards may be used to optimize the efficiency of network device 540. For instance, a redundant forwarding card in one quadrant may be used as a backup for primary forwarding cards in other quadrants thereby reducing the number of backup modules and increasing the network device's service density. Similarly, a redundant universal port card or a redundant port on a universal port card in one quadrant may be used as a backup for primary universal port cards or ports in other quadrants. As previously mentioned, each primary forwarding card may support a different protocol (e.g., ATM, MPLS, IP, Frame Relay). Similarly, each universal port card may support a different protocol (e.g., SONET, Ethernet). A backup or spare forwarding card or universal port card must support the same protocol as the primary card or cards. If forwarding or universal port cards in one quadrant support multiple protocols and the cross-connection cards are not interconnected, then each quadrant may need multiple backup forwarding and universal port cards (i.e., one for each protocol supported). If each of the quadrants includes forwarding and universal port cards that support different protocols then each quadrant may include multiple backup forwarding and universal port cards further decreasing the network device's service density.

By inter-connecting the cross-connection cards, a forwarding card in one quadrant may serve as a backup for primary forwarding cards in its own quadrant and in other quadrants. Similarly, a universal port card or port in one quadrant may serve as a backup for a primary universal port card or port in its own quadrant and in other quadrants. For example, forwarding card 546e in quadrant 1 that supports a particular protocol (e.g., the ATM protocol) may serve as the backup forwarding card for primary forwarding cards supporting ATM in its own quadrant (e.g., forwarding cards 546a–546b) as well as for primary forwarding cards supporting ATM in quadrant 2 (e.g., forwarding cards 548b–548c) or all quadrants (e.g., forwarding card 550c in quadrant 3 and forwarding cards 552b–552d in quadrant 4). Similarly, forwarding card 548e in quadrant 2 that supports a different protocol (e.g., the MPLS protocol) may serve as the backup forwarding card for primary forwarding cards supporting MPLS in its own quadrant (e.g., forwarding cards 548a and 548d) as well as for primary forwarding cards supporting MPLS in quadrant 1 (e.g., forwarding card 546c) or all quadrants (e.g., forwarding card 550a in quadrant 3 and forwarding card 552a in quadrant 4). Even with this flexibility, to provide sufficient redundancy, multiple backup modules supporting the same protocol may be used, especially where a large number of primary modules support one protocol.

As previously discussed, each port on a universal port card may be connected to an external network connection, for example, an optical fiber transmitting data according to the SONET protocol. Each external network connection may provide multiple streams or paths and each stream or path may include data being transmitted according to a different protocol over SONET. For example, one path may include data being transmitted according to ATM over SONET while another path may include data being transmitted according to MPLS over SONET. The cross-connection cards may be programmed (as described below) to transmit protocol specific data (e.g., ATM, MPLS, IP, Frame Relay) from ports on universal port cards within their quadrants to forwarding cards within any quadrant that support the specific protocol. Because the traffic management chips on the forwarding cards provide protocol-independent addresses to be used by switch fabric cards 570a–570b, the switch fabric cards may transmit data between any of the forwarding cards regardless of the underlying protocol.

Alternatively, the network manager may dedicate each quadrant to a specific protocol by putting forwarding cards in each quadrant according to the protocol they support. Within each quadrant then, one forwarding card may be a backup card for each of the other forwarding cards (1:N, for network device 540, 1:4). Protocol specific data received from ports or paths on ports on universal port cards within any quadrant may then be forwarded by one or more cross-connection cards to forwarding cards within the protocol specific quadrant. For instance, quadrant 1 may include forwarding cards for processing data transmissions using the ATM protocol, quadrant 2 may include forwarding cards for processing data transmissions using the IP protocol, quadrant 3 may include forwarding cards for processing data transmissions using the MPLS protocol and quadrant 4 may be used for processing data transmissions using the Frame Relay protocol. ATM data received on a port path is then transmitted by one or more cross-connection cards to a forwarding card in quadrant 1, while MPLS data received on another path on that same port or on a path in another port is transmitted by one or more cross-connection cards to a forwarding card in quadrant 3.

Policy Based Provisioning:

Unlike the switch fabric card, the cross-connection card does not examine header information in a payload to determine where to send the data. Instead, the cross-connection card is programmed to transmit payloads, for example, SONET frames, between a particular serial line on a universal port card port and a particular serial line on a forwarding card port regardless of the information in the payload. As a result, one port card serial line and one forwarding card serial line will transmit data to each other through the cross-connection card until that programmed connection is changed.

In one embodiment, connections established through a path table and service endpoint table (SET) in a configuration database are passed to path managers on port cards and service endpoint managers (SEMs) on forwarding cards, respectively. The path managers and service endpoint managers then communicate with a cross-connect manager (CCM) on the cross-connection card in their quadrant to provide connection information. The CCM uses the connection information to generate a connection program table that is used by one or more components (e.g., a TSE chip 563) to program internal connection paths through the cross-connection card.

Figure 37:
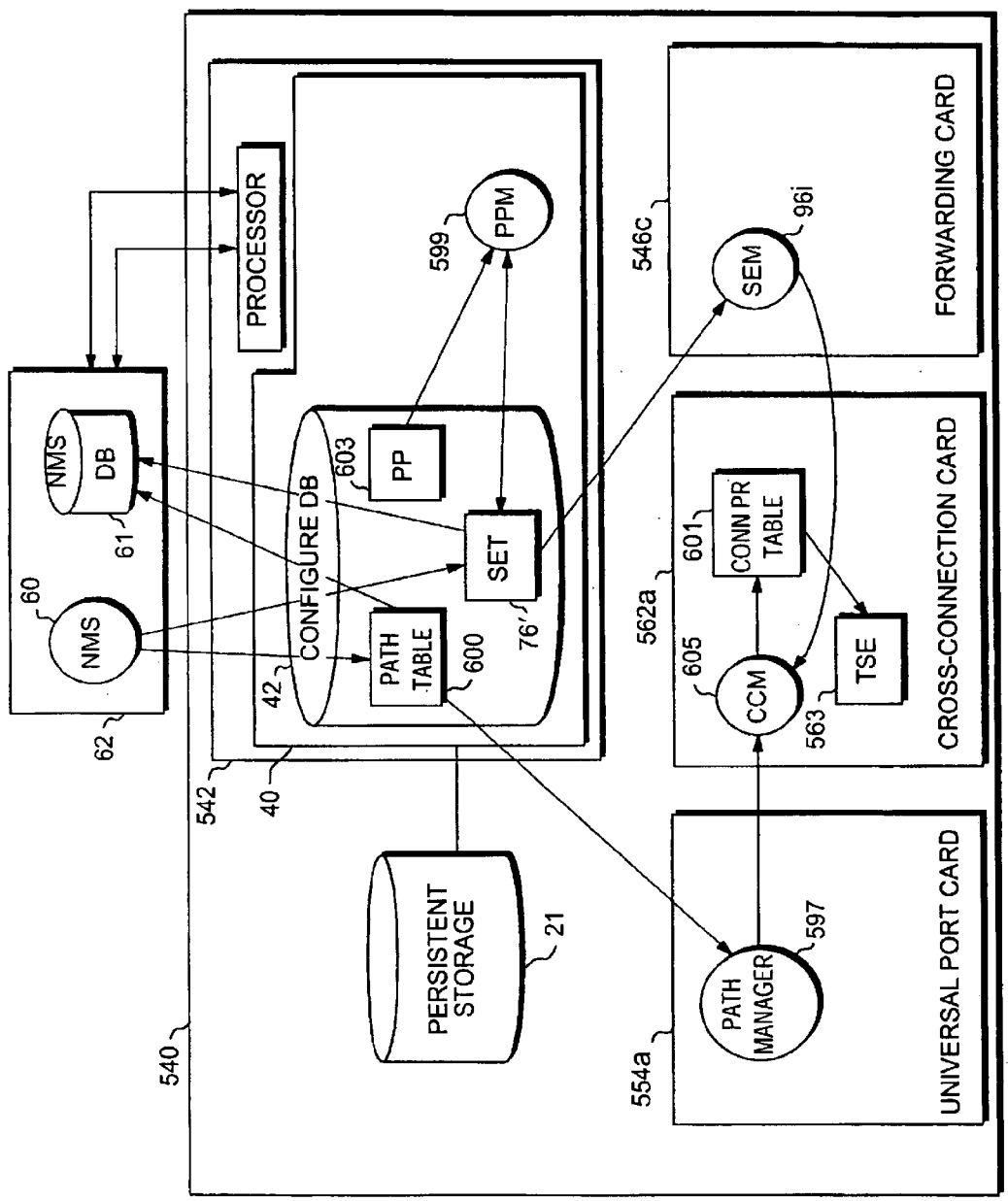
FIG. 37 is a block and flow diagram of a network device incorporating a policy provisioning manager.

Typically, connections are fixed or are generated according to a predetermined map with a fixed set of rules. Unfortunately, a fixed set of rules may not provide flexibility for future network device changes or the different needs of different users/customers. Instead, within network device 540, each time a user wishes to enable/configure a path on a port on a universal port card, a Policy Provisioning Manager (PPM) 599 (FIG. 37) executing on central processor 542 selects the forwarding card port to which the port card port will be connected based on a configurable provisioning policy (PP) 603 in configuration database 42. The configurable provisioning policy may take into consideration many factors such as available system resources, balancing those resources and quality of service. Similar to other programs and files stored within the configuration database of computer system 10 described above, the provisioning policy may be modified while network device 540 is running to allow to policy to be changed according to a user's changing needs or changing network device system requirements. When a user connects an external network connection to a particular port on a universal port card, the user notifies the NMS as to which port on which universal port card should be enabled, which path or paths should be enabled, and the number of time slots in each path. The user may also notify the NMS as to a new path and its number of time slots on an already enabled port that was not fully utilized or the user may notify the NMS of a modification to one or more paths on already enabled ports and the number of time slots required for that path or paths. With this information, the NMS fills in a Path table 600 (FIGS. 37 and 38) and partially fills in a Service Endpoint Table (SET) 76' (FIGS. 37 and 39).

When a record in the path table is filled in, the configuration database sends an active query notification to a path manager (e.g., path manager 597) executing on a universal port card (e.g., port card 554a) corresponding to the universal port card port LID (e.g., port 1231, FIG. 38) in the path table record (e.g., record 602).

Leaving some fields in the SET blank or assigning a particular value (e.g., zero), causes the configuration database to send an active query notification to Policy Provisioning Manager (PPM) 599. The PPM then determines—using provisioning policy 603—which forwarding card (FC) port or ports to assign to the new path or paths. For example, the PPM may first compare the new path's requirements, including its protocol (e.g., ATM over SONET), the number of time slots, the number of virtual circuits and virtual circuit scheduling restrictions, to the available forwarding card resources in the quadrant containing the universal port card port and path. The PPM also takes other factors into consideration including quality of service, for example, redundancy requirements or dedicated resource requirements, and balancing resource usage (i.e., load balancing) evenly within a quadrant.

As an example, a user connects SONET optical fiber 576a (FIG. 36) to port 571a on universal port card 554a and wants to enable a path with three time slots (i.e., STS-3c). The NMS assigns a path LID number (e.g., path LID 1666) and fills in a record (e.g., row 602) in Path Table 600 to include path LID 1666, a universal port card port LID (e.g., UP port LID 1231) previously assigned by the NMS and retrieved from the Logical to Physical Port Table, the first time slot (e.g., time slot 4) in the SONET stream corresponding with the path and the total number of time slots—in this example, 3—in the path. Other information may also be filled into Path Table 600.

The NMS also partially fills in a record (e.g., row 604) in SET 76' by filling in the quadrant number—in this example, 1—and the assigned path LID 1666 and by assigning a service endpoint number 878. The SET table also includes other fields, for example, a forwarding card LID field 606, a forwarding card slice 608 (i.e., port) and a forwarding card serial line 610. In one embodiment, the NMS fills in these fields with a particular value (e.g., zero), and in another embodiment, the NMS leaves these fields blank.

In either case, the particular value or a blank field causes the configuration database to send an active query notice to the PPM indicating a new path LID, quadrant number and service endpoint number. It is up to the PPM to decide which forwarding card, slice (i.e., payload extractor chip) and time slot (i.e., port) to assign to the new universal port card path. Once decided, the PPM fills in the SET Table fields. Since the user and NMS do not completely fill in the SET record, this may be referred to as a "self-completing configuration record." Self-completing configuration records reduce the administrative workload of provisioning a network.

The SET and path table records may be automatically copied to persistent storage 21 to insure that if network device 540 is re-booted these configuration records are maintained. If the network device shuts down prior to the PPM filling in the SET record fields and having those fields saved in persistent storage, when the network device is rebooted, the SET will still include blank fields or fields with particular values which will cause the configuration database to again send an active query to the PPM.

When the forwarding card LID (e.g., 1667) corresponding, for example, to forwarding card 546*c*, is filled into the SET table, the configuration database sends an active query notification to an SEM (e.g., SEM 96*i*) executing on that forwarding card and corresponding to the assigned slice and/or time slots. The active query notifies the SEM of the newly assigned service endpoint number (e.g., SE 878) and the forwarding card slice (e.g., payload extractor 582*a*) and time slots (i.e., 3 time slots from one of the serial line inputs to payload extractor 582*a*) dedicated to the new path. Path manager 597 and SEM 96*i* both send connection information to a cross-connection manager 605 executing on cross-connection card 562*a*—the cross-connection card within their quadrant. The CCM uses the connection information to generate a connection program table 601 and uses this table to program internal connections through one or more components (e.g., a TSE chip 563) on the cross-connection card. Once programmed, cross-connection card 562*a* transmits data between new path LID 1666 on SONET fiber 576*a* connected to port 571*a* on universal port card 554*a* and the serial line input to payload extractor 582*a* on forwarding card 546*c*.

An active query notification is also sent to NMS database 61, and the NMS then displays the new system configuration to the user.

Alternatively, the user may choose which forwarding card to assign to the new path and notify the NMS. The NMS would then fill in the forwarding card LID in the SET, and the PPM would only determine which time slots and slice within the forwarding card to assign.

In the description above, when the PPM is notified of a new path, it compares the requirements of the new path to the available/unused forwarding card resources. If the necessary resources are not available, the PPM may signal an error. Alternatively, the PPM could move existing forwarding card resources to make the necessary forwarding card resources available for the new path. For example, if no payload extractor chip is completely available in the entire quadrant, one path requiring only one time slot is assigned to payload extractor chip 582*a* and a new path requires forty-eight time slots, the one path assigned to payload extractor chip 582*a* may be moved to another payload extractor chip, for example, payload extractor chip 582*b* that has at least one time slot available and the new path may be assigned all of the time slots on payload extractor chip 582*a*. Moving the existing path is accomplished by having the PPM modify an existing SET record. The new path is configured as described above.

Moving existing paths may result in some service disruption. To avoid this, the provisioning policy may include certain guidelines to hypothesize about future growth. For example, the policy may require small paths—for example, three or less time slots—to be assigned to payload extractor chips that already have some paths assigned instead of to completely unassigned payload extractor chips to provide a higher likelihood that forwarding card resources will be available for large paths—for example, sixteen or more time slots—added in the future.

Multi-Layer Network Device in One Telco Rack:

Referring again to FIG. 35, in one embodiment, each universal port card includes four ports, each of which is capable of being connected to an OC-48 SONET fiber. Since an OC-48 SONET fiber is capable of transferring data at 2.5 Giga bits per second (Gbps), each universal port card is capable of transferring data at 10 Gbps (4×2.5=10). With eight port cards per quadrant, the cross-connection card must be capable of transferring data at 80 Gbps. Typically, however, the eight port cards will be 1:1 redundant and only transfer 40 Gbps. In one embodiment, each forwarding card is capable of transferring 10 Gbps, and with five forwarding cards per quadrant, the switch fabric cards must be capable of transferring data at 200 Gbps. Typically, however, the five forwarding cards will be 1:N redundant and only transfer data at 40 Gbps. With four quadrants and full redundancy (1:1 for port cards and 1:N for forwarding cards), network device 540 is capable of transferring data at 160 Gbps.

In other embodiments, each port card includes one port capable of being connected to an OC-192 SONET fiber. Since OC-192 SONET fibers are capable of transferring data at 10 Gbps, a fully redundant network device 540 is again capable of transferring 160 Gbps. In the embodiment employing one OC-192 connection per port card, each port card may include one hundred and ninety-two logical DS3 connections using sub-rate data multiplexing (SDRM). In addition, each port card may differ in its number and type of ports to provide more or less data through put. As previously mentioned, ports other than SONET ports may be provided, for example, Ethernet ports, Plesiochronous Digital Hierarchy ports (i.e., DS0, DS1, DS3, E0, E1, E3, J0, J1, J3) and Synchronous Digital Hierarchy (SDH) ports (i.e., STM1, STM4, STM16, STM64).

The universal port cards and cross-connect cards in each quadrant are in effect a physical layer switch, and the forwarding cards and switch fabric cards are effectively an upper layer switch. Prior systems have packaged these two switches into separate network devices. One reason for this is the large number of signals that need to be routed. Taken separately, each cross-connect card 562*a*–562*b*, 564*a*–564*b*, 566*a*–566*b* and 568*a*–568*b* is essentially a switch fabric or mesh allowing switching between any path on any universal port card to any serial input line on any forwarding card in its quadrant and each switch fabric card 570*a*–570*b* allows switching between any paths on any forwarding cards. Approximately six thousand, seven hundred and twenty etches are required to support a 200 Gbps switch fabric, and about eight hundred and thirty-two etches are required to support an 80 Gbps cross-connect. Combining such high capacity multi-layer switches into one network device in a single telco rack (seven feet by nineteen inches by 24 inches) has not been thought possible by those skilled in the art of telecommunications network devices.

To fit network device 540 into a single telco rack, dual mid-planes are used. All of the functional printed circuit boards connect to at least one of the mid-planes, and the switch fabric cards and certain control cards connect to both mid-planes thereby providing connections between the two mid-planes. In addition, to efficiently utilize routing resources, instead of providing a single cross-connection card, the cross-connection functionality is separated into four cross-connection cards—one for each quadrant—(as shown in FIG. 35). Further, routing through the lower mid-plane is improved by flipping the forwarding cards and cross-connection cards in the bottom half of the front of the chassis upside down to be the mirror image of the forwarding cards and cross-connection cards in the top of the front half of the chassis.

Figure 40:
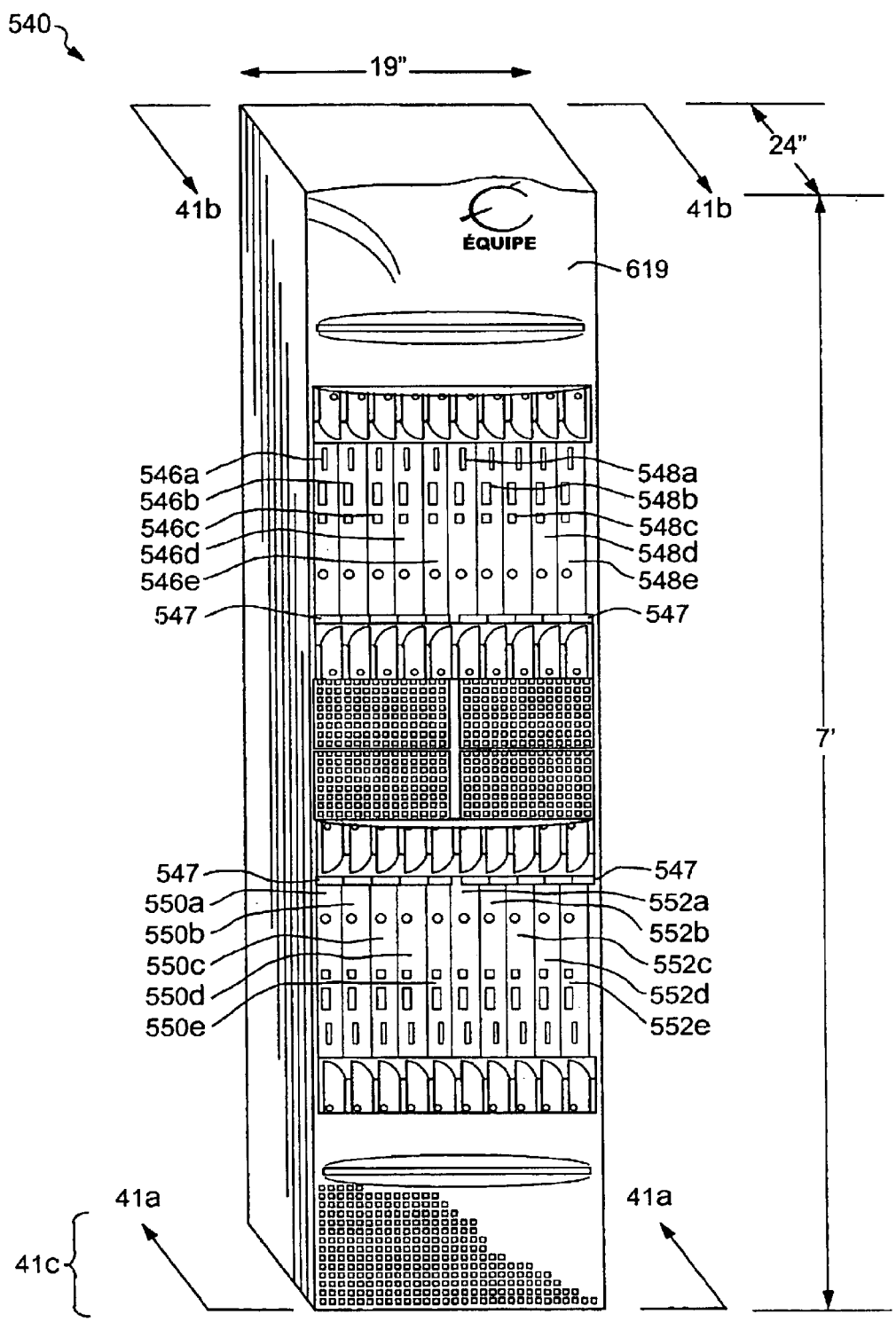
FIG. 40 is an isometric view of a network device.
Figure 41A:
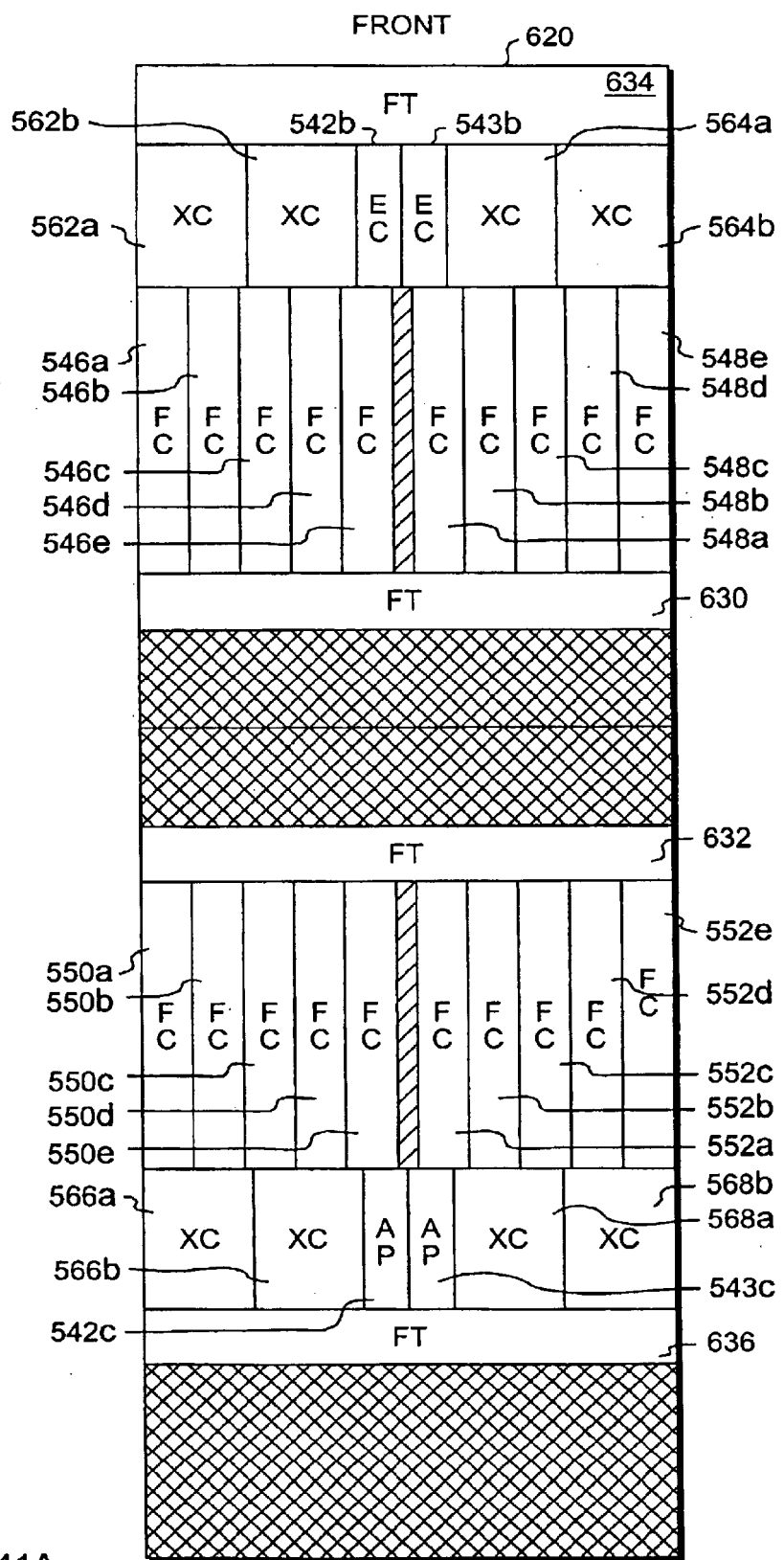
FIGS. 41a–41c are front, back and side block diagrams, respectively, of components and modules within the network device of FIG. 40.
Figure 41B:
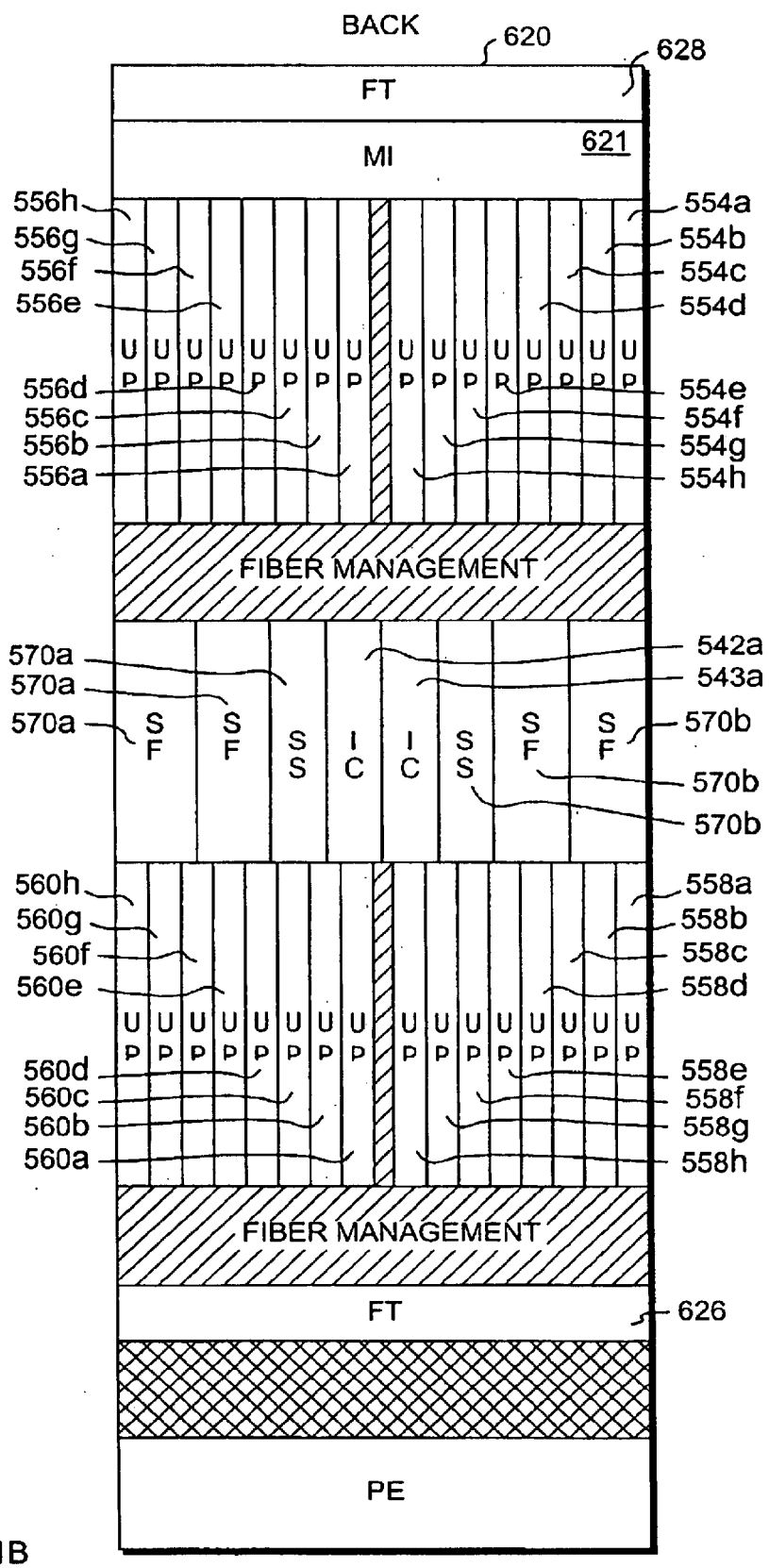
Figure 41C:
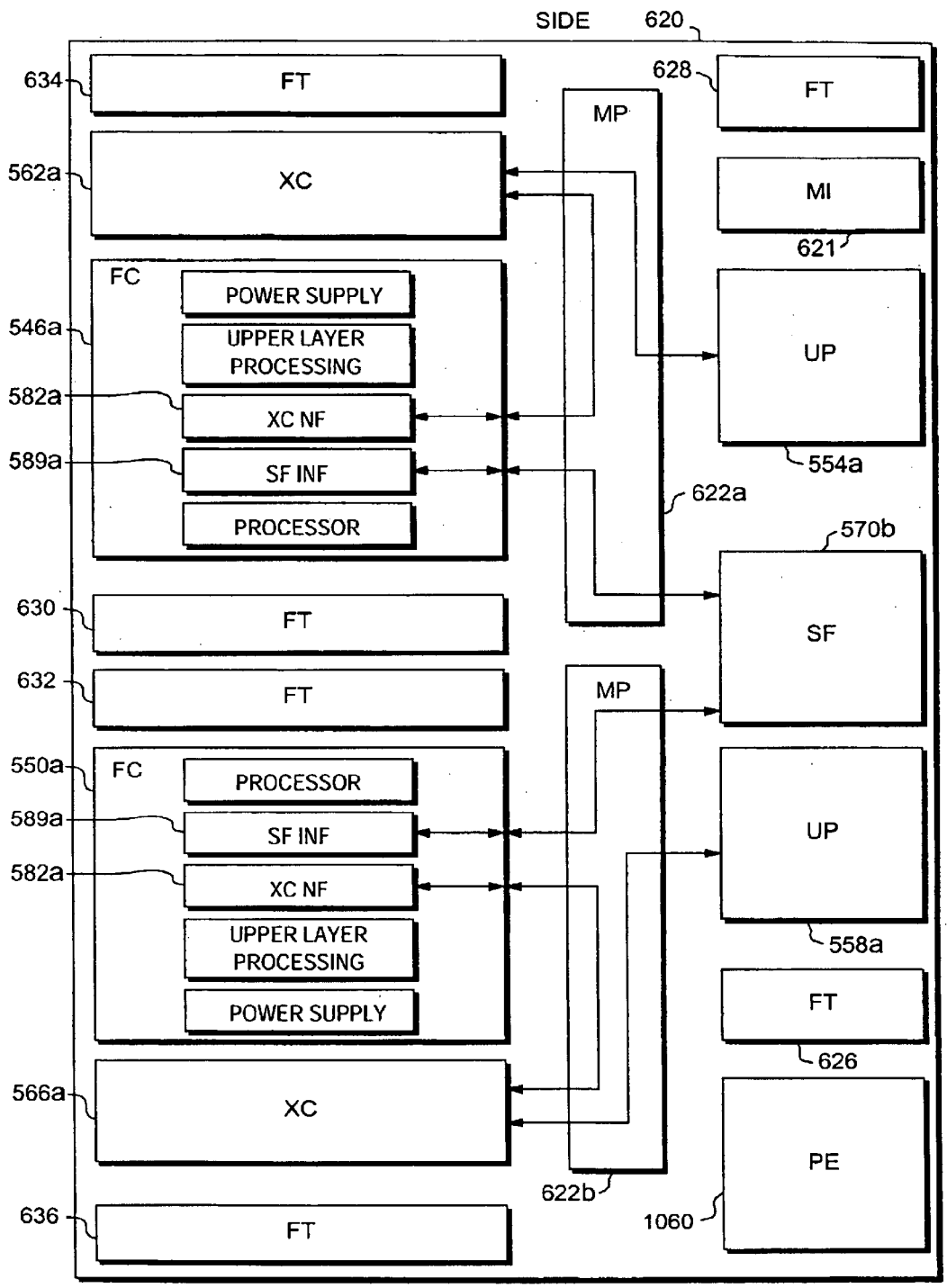

Referring to FIG. 40, a network device 540 is packaged in a box 619 conforming to the telco standard rack of seven feet in height, nineteen inches in width and 24 inches in depth. Referring also to FIGS. 41*a*–41*c*, a chassis 620 within box 619 provides support for forwarding cards 546*a*–546*e*, 548*a*–548*e*, 550*a*–550*e* and 552*a*–552*e*, universal port cards 554*a*–554*h*, 556*a*–556*h*, 558*a*–558*h* and 560*a*–560*h*, and cross-connection cards 562*a*–562*b*, 564*a*–564*b*, 566*a*–566*b* and 568a–568b. As is typical of telco network devices, the forwarding cards (FC) are located in the front portion of the chassis where network administrators may easily add and remove these cards from the box, and the universal port cards (UP) are located in the back portion of the chassis where external network attachments/cables may be easily connected.

The chassis also supports switch fabric cards 570a and 570b. As shown, each switch fabric card may include multiple switch fabric (SF) cards and a switch scheduler (SS) card. In addition, the chassis supports multiple central processor cards (542 and 543, FIG. 35). Instead of having a single central processor card, the external control functions and the internal control functions may be separated onto different cards as described in U.S. patent application Ser. No. 09/574,343, filed May 20, 2000 and entitled "Functional Separation of Internal and External Controls in Network Devices", which is hereby incorporated herein by reference. As shown, the chassis may support internal control (IC) processor cards 542a and 543a and external control (EC) processor cards 542b and 543b. Auxiliary processor (AP) cards 542c and 543c are provided for future expansion to allow more external control cards to be added, for example, to handle new upper layer protocols. In addition, a management interface (MI) card 621 for connecting to an external network management system (62, FIG. 35) is also provided.

The chassis also support two mid-plane printed circuit boards 622a and 622b (FIG. 41c) located toward the middle of chassis 620. Mid-plane 622a is located in the top portion of chassis 620 and is connected to quadrant I and 2 forwarding cards 546a–546e and 548a–548e, universal port cards 554a–554h and 556a–556h, and cross-connection cards 562a–562b and 564a–564b. Similarly, mid-plane 622b is located in the bottom portion of chassis 620 and is connected to quadrant 3 and 4 forwarding cards 550a–550e and 552a–552e, universal port cards 558a–558h and 560a–560h, and cross-connection cards 566a–566b and 568a–568b. Through each mid-plane, the cross-connection card in each quadrant may transfer network packets between any of the universal port cards in its quadrant and any of the forwarding cards in its quadrant. In addition, through mid-plane 622a the cross-connection cards in quadrants 1 and 2 may be connected to allow for transfer of network packets between any forwarding cards and port cards in quadrants 1 and 2, and through mid-plane 622b the cross-connection cards in quadrants 3 and 4 may be connected to allow for transfer of network packets between any forwarding cards and port cards in quadrants 3 and 4.

Mid-plane 622a is also connected to external control processor cards 542b and 543b and management interface card 621. Mid-plane 622b is also connected to auxiliary processor cards 542c and 543c.

Switch fabric cards 570a and 570b are located in the back portion of chassis 620, approximately mid-way between the top and bottom of the chassis. The switch fabric cards are connected to both mid-planes 622a and 622b to allow the switch fabric cards to transfer signals between any of the forwarding cards in any quadrant. In addition, the cross-connection cards in quadrants 1 and 2 may be connected through the mid-planes and switch fabric cards to the cross-connection cards in quadrants 3 and 4 to enable network packets to be transferred between any universal port card and any forwarding card.

To provide for better routing efficiency through mid-plane 622b, forwarding cards 550a–550e and 552a–552e and cross-connection cards 566a–566b and 568a–568b in quadrants 3 and 4, located in the bottom portion of the chassis, are flipped over when plugged into mid-plane 622b. This permits the switch fabric interface 589a–589n on each of the lower forwarding cards to be oriented nearest the switch fabric cards and the cross-connection interface 582a–582n on each of the lower forwarding cards to be oriented nearest the cross-connection cards in quadrants 3 and 4. This orientation avoids having to cross switch fabric and cross-connection etches in mid-plane 622b.

Typically, airflow for cooling a network device is brought in at the bottom of the device and released at the top of the device. For example, in the back portion of chassis 620, a fan tray (FT) 626 pulls air into the device from the bottom portion of the device and a fan tray 628 blows air out of the top portion of the device. When the lower forwarding cards are flipped over, the airflow/cooling pattern is reversed. To accommodate this reversal, fan trays 630 and 632 pull air into the middle portion of the device and then fan trays 634 and 636 pull the air upwards and downwards, respectively, and blow the heated air out the top and bottom of the device, respectively.

The quadrant 3 and 4 universal port cards 558a–558h and 560a–560h may also be flipped over to orient the port card's cross-connection interface nearest the cross-connection cards and more efficiently use the routing resources. It is preferred, however, not to flip the universal port cards for serviceability reasons and airflow issues. The network managers at the telco site expect network attachments/cables to be in a certain pattern. Reversing this pattern could cause confusion in a large telco site with many different types of network devices. Also, flipping the port cards will change the airflow and cooling pattern and require a similar airflow pattern and fan tray configuration as implemented in the front of the chassis. However, with the switch fabric and internal control processor cards in the middle of the back portion of the chassis, it may be impossible to implement this fan tray configuration.

Figure 42A:
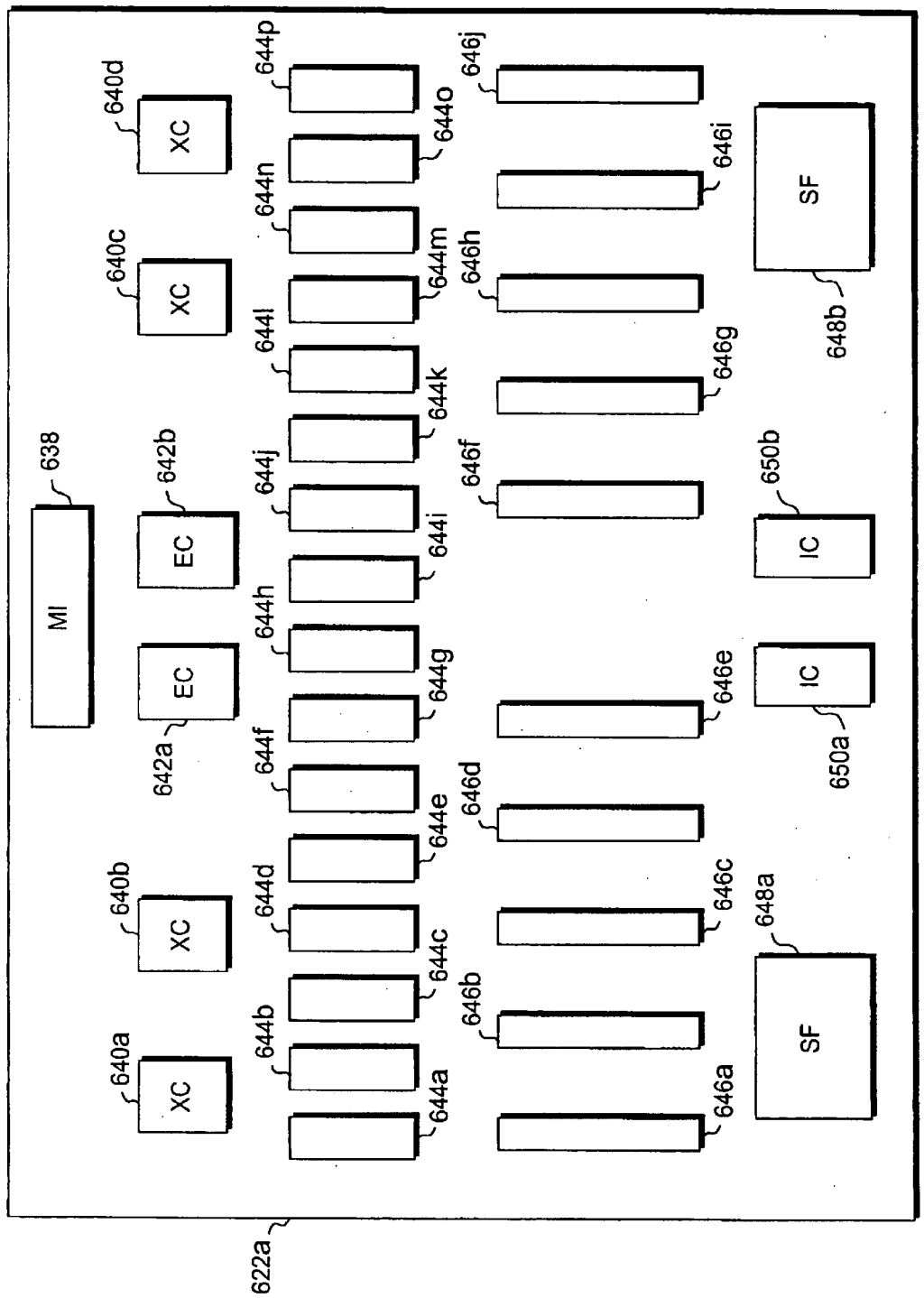
FIG. 42 is a block diagram of dual mid-planes.
Figure 42B:
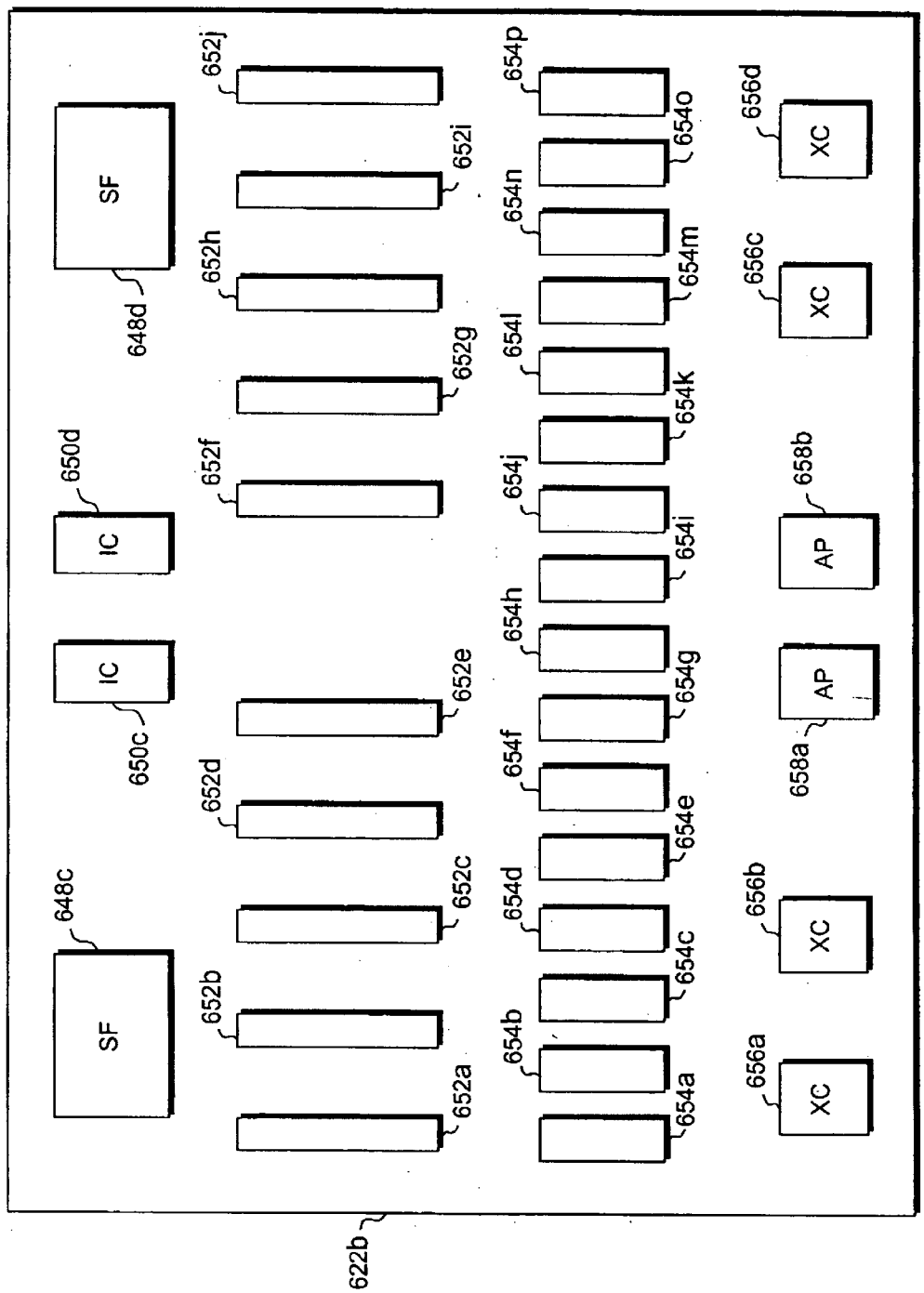

Referring to FIG. 42, mid-plane 622a includes connectors 638 mounted on the back side of the mid-plane ("back mounted") for the management interface card, connectors 640a–640d mounted on the front side of the mid-plane ("front mounted") for the quadrant 1 and 2 cross-connection cards, and front mounted connectors 642a–642b for the external control processor cards. Multiple connectors may be used for each card. Mid-plane 622a also includes back mounted connectors 644a–644p for the quadrant 1 and 2 universal port cards and front mounted connectors 646a–646j for the quadrant 1 and 2 forwarding cards.

Both mid-planes 622a and 622b include back mounted connectors 648a–648d for the switch fabric cards and back mounted connectors 650a–650d for the internal control cards. Mid-plane 622b further includes front, reverse mounted connectors 652a–652j for the quadrant 3 and 4 forwarding cards and back mounted connectors 654a–654p for the quadrant 3 and 4 universal port cards. In addition, mid-plane 622b also includes front, reverse mounted connectors 656a–656d for the quadrant 3 and 4 cross-connection cards and front mounted connectors 658a–658b for the auxiliary processor cards.

Combining both physical layer switch/router subsystems and upper layer switch/router subsystems in one network device allows for intelligent layer 1 switching. For example, the network device may be used to establish dynamic network connections on the layer 1 network to better utilize resources as service subscriptions change. In addition, network management is greatly simplified since the layer 1 and multiple upper layer networks may be managed by the same network management system and grooming fees are eliminated. Combining the physical layer switch/router and upper layer switch/routers into a network device that fits into one telco rack provides a less expensive network device and saves valuable telco site space.

Splitting the cross-connection function into four separate cards/quadrants enables the cross-connection routing requirements to be spread between the two mid-planes and alleviates the need to route cross-connection signals through the center of the device where the switch fabric is routed. In addition, segmenting the cross-connection function into multiple, independent subsystems allows customers/ network managers to add functionality to network device 540 in pieces and in accordance with network service subscriptions. When a network device is first installed, a network manager may need only a few port cards and forwarding cards to service network customers. The modularity of network device 540 allows the network manager to purchase and install only one cross-connection card and the required number of port and forwarding cards. As the network becomes more subscribed, the network manager may add forwarding cards and port cards and eventually additional cross-connection cards. Since network devices are often very expensive, this modularity allows network managers to spread the cost of the system out in accordance with new service requests. The fees paid by customers to the network manager for the new services can then be applied to the cost of the new cards.

Although the embodiment describes the use of two mid-planes, it should be understood that more than two mid-planes may be used. Similarly, although the embodiment described flipped/reversed the forwarding cards and cross-connection cards in the lower half of the chassis, alternatively, the forwarding cards and cross-connection cards in the upper half of the chassis could be flipped.

It will be understood that variations and modifications of the above described methods and apparatuses will be apparent to those of ordinary skill in the art and may be made without departing from the inventive concepts described herein. Accordingly, the embodiments described herein are to be viewed merely as illustrative, and not limiting, and the inventions are to be limited solely by the scope and spirit of the appended claims.

What is claimed is:

1. A network device, comprising:
    at least one physical layer cross-connection subsystem;
    a port subsystem connected to the physical layer cross-connection subsystem and capable of being connected to an external network attachment and capable of transferring network packets, including data and control information, with other network devices over the external network attachment in accordance with a physical layer network protocol, and wherein data in the network packets is organized in accordance with one or more upper level network protocols;
    an upper layer switch fabric subsystem coupled with the cross-connection subsystem; and
    a forwarding subsystem connected to the physical layer cross-connection subsystem and the upper layer switch fabric subsystem and capable of operating on network packet data in accordance with one of the upper level network protocols;
    wherein the physical layer cross-connection subsystem is capable of transferring network packets between the port subsystem and the forwarding subsystem and wherein the network device is capable of fitting within one telecommunication rack.

2. The network device of claim 1, wherein the forwarding subsystem is a first forwarding subsystem and further comprising:
    a second forwarding subsystem connected to the physical layer cross-connection subsystem and the upper layer switch fabric subsystem and capable of operating on network packet data in accordance with the one of the upper level network protocols; and
    wherein the upper layer switch fabric subsystem is capable of transferring network packet data between the first and second forwarding subsystems.

3. The network device of claim 1, wherein the physical layer cross-connection subsystem is a first physical layer cross-connection subsystem and further comprising:
    a second physical layer cross-connection subsystem coupled with the upper layer switch fabric subsystem.

4. The network device of claim 3, further comprising:
    a third physical layer cross-connection subsystem coupled with the upper layer switch fabric subsystem; and
    a fourth physical layer cross-connection subsystem coupled with the upper layer switch fabric subsystem.

5. The network device of claim 4, wherein the third and fourth physical layer cross-connection subsystems are connected together and capable of transferring data.

6. The network device of claim 4, wherein the first, second, third and fourth physical layer cross-connection subsystem are connected together and capable of transferring data.

7. The network device of claim 3, wherein the first and second physical layer cross-connection subsystems are connected together and capable of transferring data.

8. The network device of claim 1, wherein the device comprises a plurality of mid-planes including a plurality of back-planes.

9. A network device, comprising:
    a plurality of port subsystems, wherein each port subsystem is capable of being connected to an external network attachment and capable of transferring network packets, including data and control information, with other network devices over the external network attachment in accordance with a physical layer network protocol, and wherein data in the network packets is organized in accordance with one or more upper level network protocols;
    a plurality of forwarding subsystems, wherein each forwarding subsystem is capable of operating on network packet data in accordance with one of the upper level network protocols;
    a cross-connection subsystem coupled with the plurality of port subsystems and the plurality of forward subsystems and capable of transferring network packets between the plurality of port subsystems and the plurality of forwarding subsystems;
    a switch fabric subsystem coupled to the plurality of forwarding subsystems and capable of transferring network packet data between the plurality of forwarding subsystems; and
    wherein the network device is capable of fitting within one telecommunications rack.

10. The network device of claim 9, wherein the plurality of port subsystems is a first plurality of port subsystems, the physical layer network protocol is a first physical layer network protocol, the plurality of forwarding subsystem is a first plurality of forwarding subsystems and the physical layer cross-connection subsystem is a first physical layer cross-connection subsystem and further comprising:
    a second plurality of port subsystems, wherein each port subsystem is capable of being connected to an external network attachment and capable of transferring network packets, including data and control information, with other network devices over the external network attachment in accordance with a second physical layer network protocol, and wherein data in the network packets is organized in accordance with one or more upper level network protocols;

a second plurality of forwarding subsystems, wherein each forwarding subsystem is capable of operating on network packet data in accordance with one of the upper level network protocols;

a second cross-connection subsystem coupled with the second plurality of port subsystems and the second plurality of forwarding subsystems and capable of transferring network packets between the second plurality of port subsystems and the second plurality of forwarding subsystems; and wherein the switch fabric subsystem is coupled to the second plurality of forwarding subsystems and capable of transferring network packet data between the first and second plurality of forwarding subsystems.

11. The network device of claim 10, further comprising:

a third plurality of port subsystems, wherein each port subsystem is capable of being connected to an external network attachment and capable of transferring network packets, including data and control information, with other network devices over the external network attachment in accordance with a third physical layer network protocol, and wherein data in the network packets is organized in accordance with one or more upper level network protocols;

a third plurality of forwarding subsystems, wherein each forwarding subsystem is capable of operating on network packet data in accordance with one of the upper level network protocols;

a third cross-connection subsystem coupled with the third plurality of port subsystems and the third plurality of forwarding subsystems and capable of transferring network packets between the third plurality of port subsystems and the third plurality of forwarding subsystems; and wherein the switch fabric subsystem is coupled to the third plurality of forwarding subsystems and capable of transferring network packet data between the first, second and third plurality of forwarding subsystems.

12. The network device of claim 11, further comprising:

a fourth plurality of port subsystems, wherein each port subsystem is capable of being connected to an external network attachment and capable of transferring network packets, including data and control information, with other network devices over the external network attachment in accordance with a fourth physical layer network protocol, and wherein data in the network packets is organized in accordance with one or more upper level network protocols;

a fourth plurality of forwarding subsystems, wherein each forwarding subsystem is capable of operating on network packet data in accordance with one of the upper level network protocols;

a fourth cross-connection subsystem coupled with the fourth plurality of port subsystems and the fourth plurality of forwarding subsystems and capable of transferring network packets between the fourth plurality of port subsystems and the fourth plurality of forwarding subsystems; and wherein the switch fabric subsystem is coupled to the fourth plurality of forwarding subsystems and capable of transferring network packet data between the first, second, third and fourth plurality of forwarding subsystems.

13. The network device of claim 12, wherein the third and fourth cross-connection subsystems are connected together and capable of transferring data.

14. The network device of claim 12, wherein the first, second, third and fourth cross-connection subsystems are connected together and capable of transferring data.

15. The network device of claim 12, wherein the first, second, third and fourth physical layer network protocols comprises the same protocol.

16. The network device of claim 12, wherein the first, second, third and fourth physical layer network protocols comprise different protocols.

17. The network device of claim 10, wherein the first and second cross-connection subsystems are connected together and capable of transferring data.

18. The network device of claim 9, wherein each of the plurality of port subsystems transfer network packets in accordance with the same physical layer network protocol.

19. The network device of claim 9, wherein each of the plurality of port subsystems transfers network packets in accordance with different physical layer network protocols.

* * * * *